US012701812B2

(12) United States Patent
Shirakata et al.

(10) Patent No.: US 12,701,812 B2
(45) Date of Patent: Aug. 4, 2026

(54) LIGHT-RECEIVING DEVICE, X-RAY IMAGING DEVICE, AND ELECTRONIC APPARATUS

(71) Applicant: SONY SEMICONDUCTOR SOLUTIONS CORPORATION, Kanagawa (JP)

(72) Inventors: Toru Shirakata, Kanagawa (JP); Hikaru Iwata, Kanagawa (JP); Masanari Yamaguchi, Kanagawa (JP); Kazunobu Ota, Kanagawa (JP); Atsuhiro Ando, Kanagawa (JP); Daiki Sakai, Kanagawa (JP); Akira Maehara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 305 days.

(21) Appl. No.: 18/574,524

(22) PCT Filed: Mar. 16, 2022

(86) PCT No.: PCT/JP2022/011758
§ 371 (c)(1),
(2) Date: Dec. 27, 2023

(87) PCT Pub. No.: WO2023/281834
PCT Pub. Date: Jan. 12, 2023

(65) Prior Publication Data
US 2024/0290814 A1      Aug. 29, 2024

(30) Foreign Application Priority Data
Jul. 6, 2021     (JP) ................................. 2021-112166

(51) Int. Cl.
H10F 39/00     (2025.01)
H10F 39/18     (2025.01)

(52) U.S. Cl.
CPC ......... *H10F 39/811* (2025.01); *H10F 39/189* (2025.01)

(58) Field of Classification Search
None
See application file for complete search history.

(56) References Cited

U.S. PATENT DOCUMENTS

| | | | | | |
|---|---|---|---|---|---|
| 2012/0249829 | A1* | 10/2012 | Izuha | .................. | H10F 39/8053 |
| | | | | | 348/E5.037 |
| 2015/0340400 | A1* | 11/2015 | Takemoto | ............. | H10F 39/809 |
| | | | | | 257/448 |
| 2018/0146145 | A1* | 5/2018 | Arishima | ............... | H04N 25/79 |

FOREIGN PATENT DOCUMENTS

| | | | |
|---|---|---|---|
| JP | 2002-009268 | A | 1/2002 |
| JP | 2008-277511 | A | 11/2008 |

(Continued)

OTHER PUBLICATIONS

International Search Report and Written Opinion of PCT Application No. PCT/JP2022/011758, issued on Jun. 21, 2022, 09 pages of ISRWO.

*Primary Examiner* — Bo B Jang
(74) *Attorney, Agent, or Firm* — CHIP LAW GROUP

(57)     ABSTRACT

A first light-receiving device of an embodiment of the disclosure includes: a first semiconductor substrate having first and second surfaces opposed to each other, receiving application of a first potential, and including light-receiving elements arranged two-dimensionally in matrix; a second semiconductor substrate having third and fourth surfaces opposed to each other, with the first surface and the third surface being disposed to be opposed to each other, receiving application of a second potential lower than the first (Continued)

potential, and including a logic circuit that processes a light-receiving signal based on electric charge outputted from the plurality of light-receiving elements; and an inter-layer insulating layer provided between the first and second semiconductor substrates, in which the second semiconductor substrate has a side surface recessed more inward than a side surface of the first semiconductor substrate, and the side surface of the second semiconductor substrate is coated with a protective film.

36 Claims, 44 Drawing Sheets

(56) References Cited

FOREIGN PATENT DOCUMENTS

| | | |
|---|---|---|
| JP | 2012-054450 A | 3/2012 |
| JP | 2014-045142 A | 3/2014 |
| JP | 2020-065016 A | 4/2020 |
| WO | 2009/125476 A1 | 10/2009 |

* cited by examiner

[ FIG. 1]
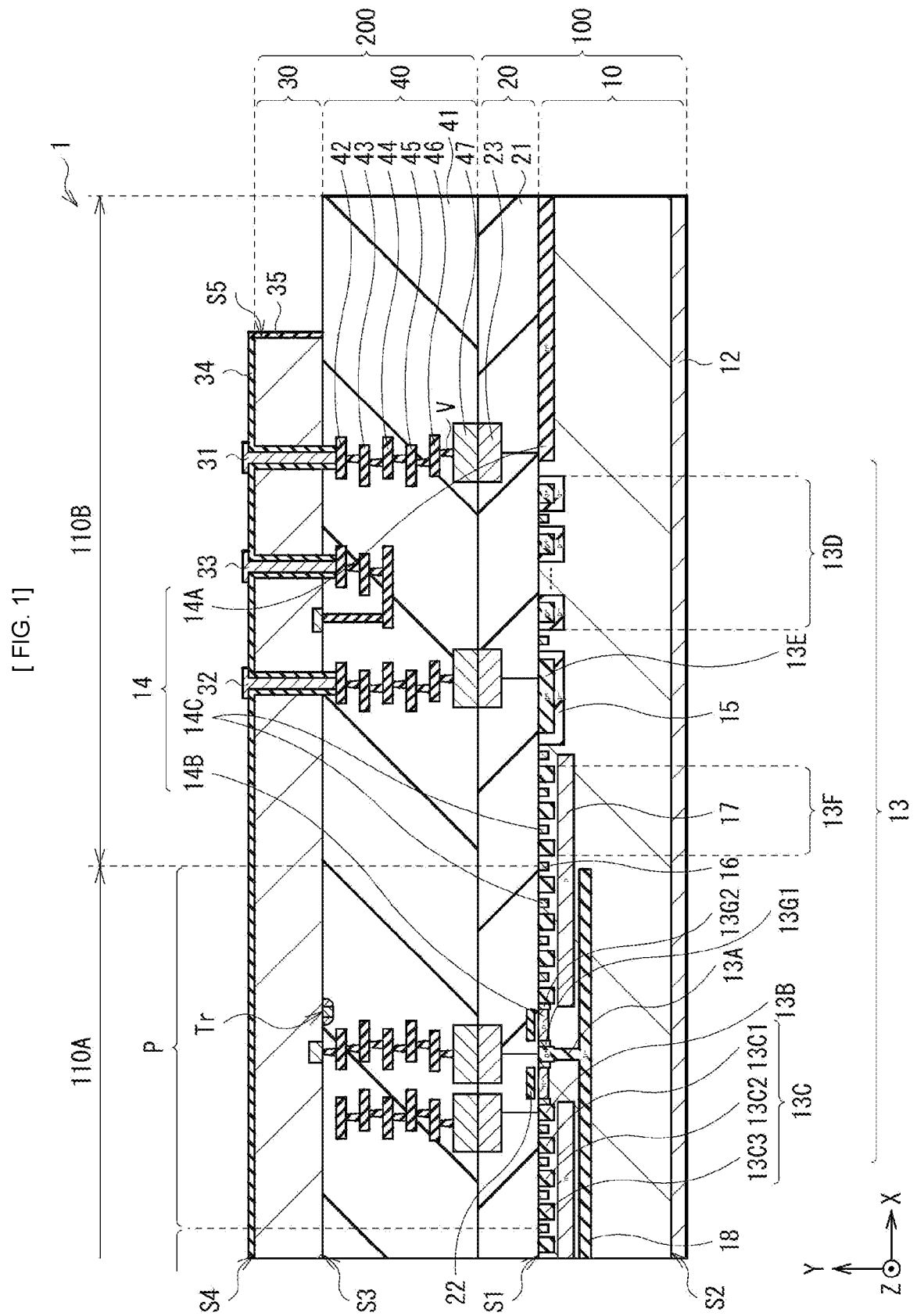

[ FIG. 2 ]
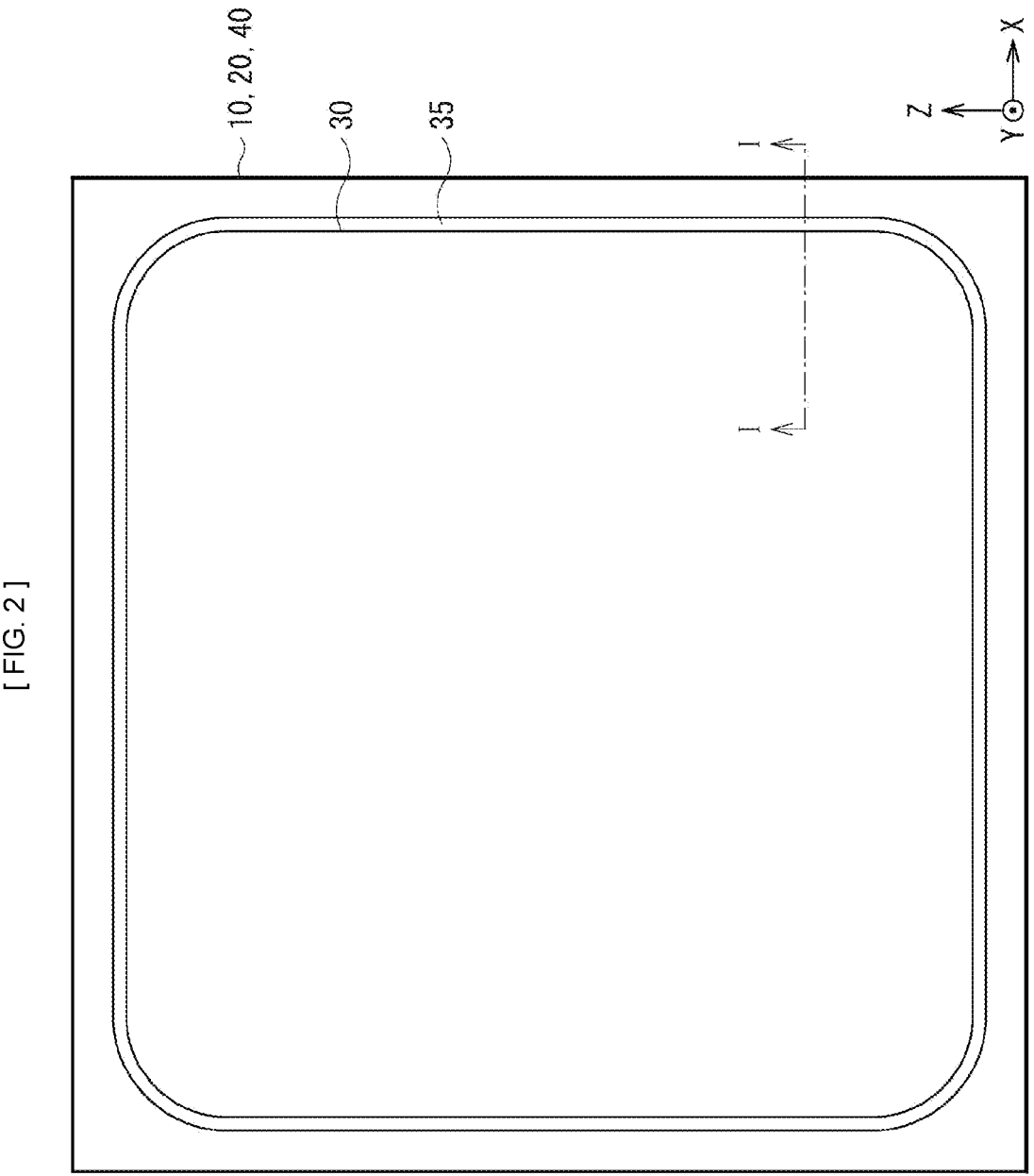

[FIG. 3]
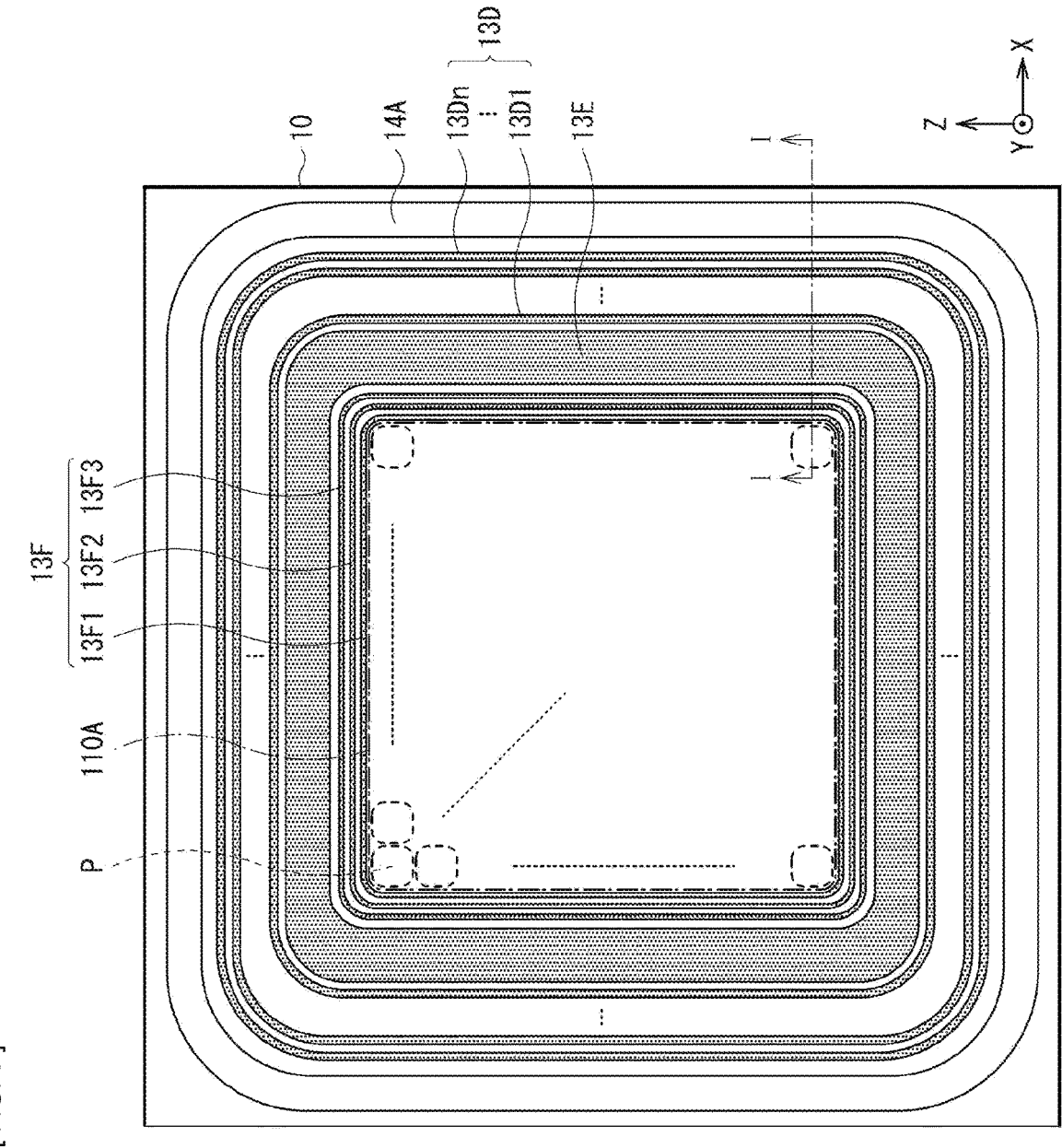

[ FIG. 4 ]
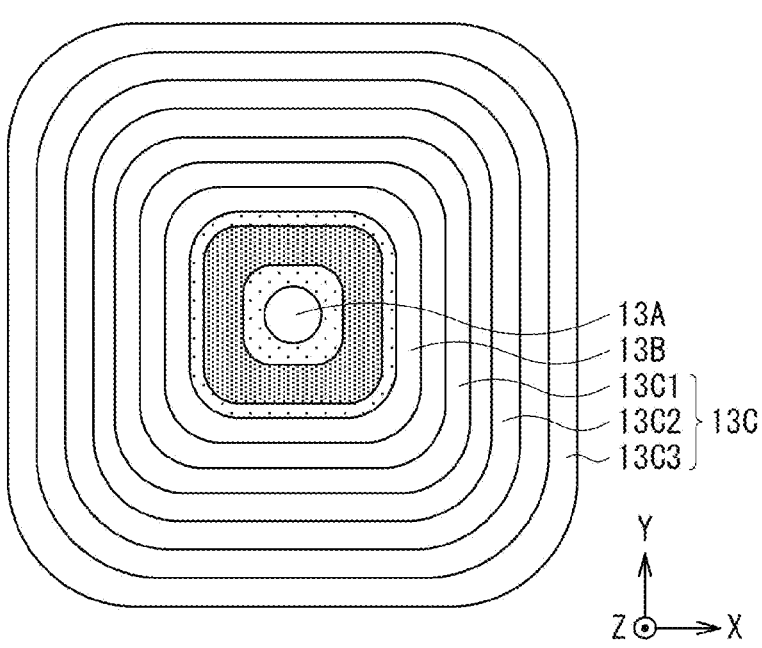

[ FIG. 5A ]
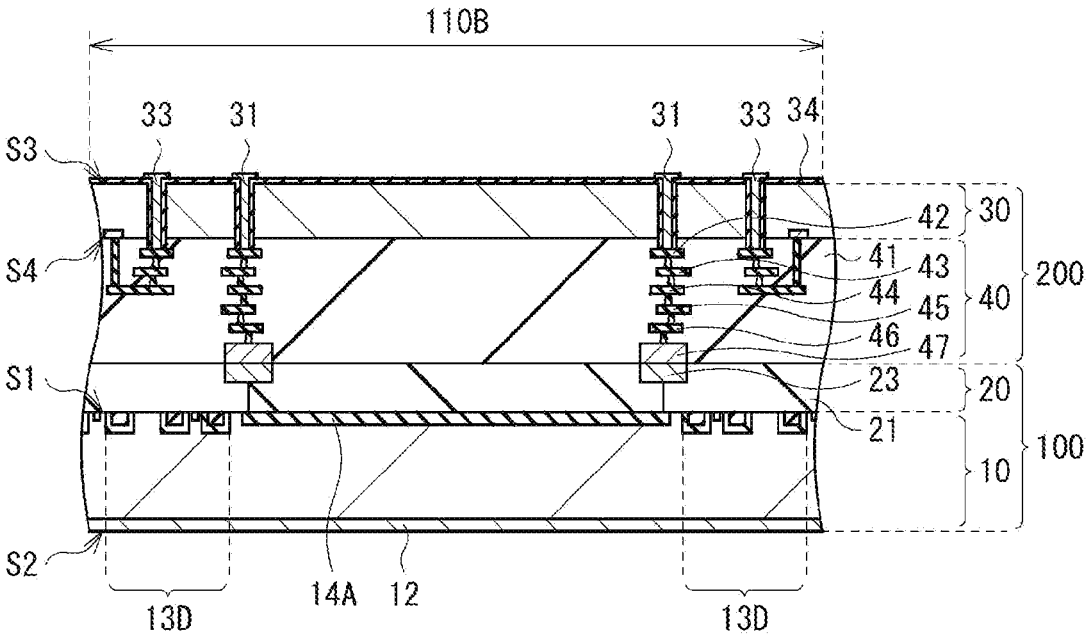
[ FIG. 5B ]
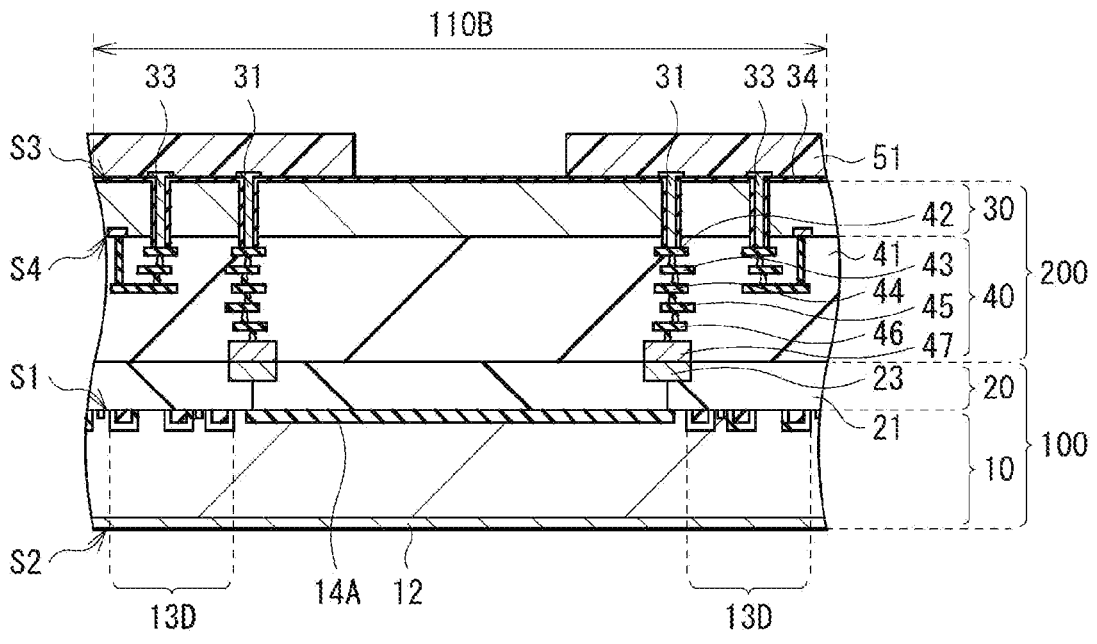

[ FIG. 5C ]
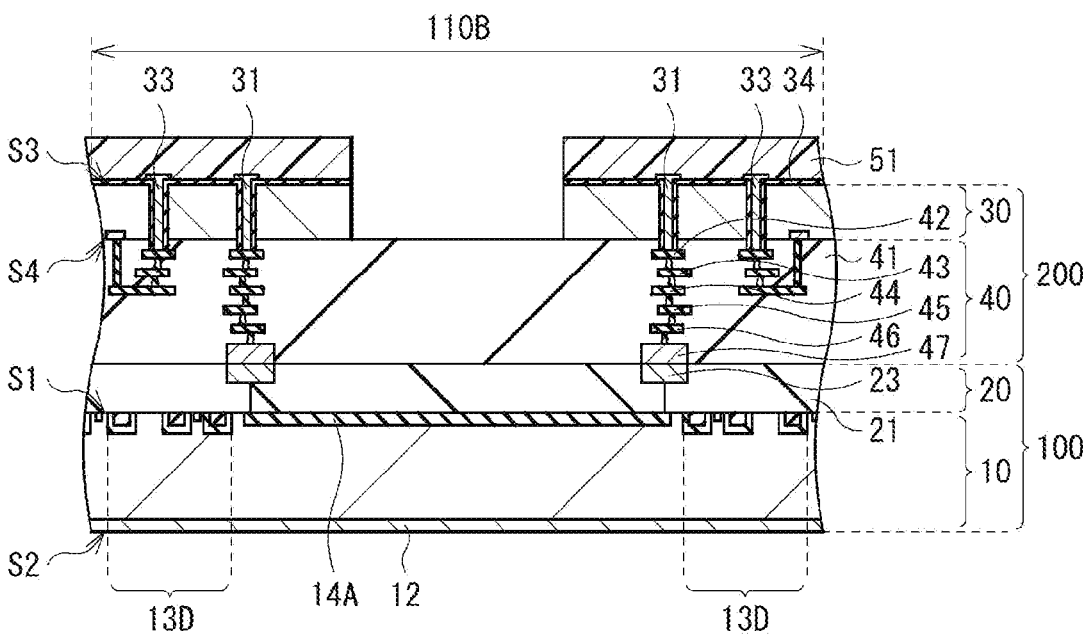
[ FIG. 5D ]
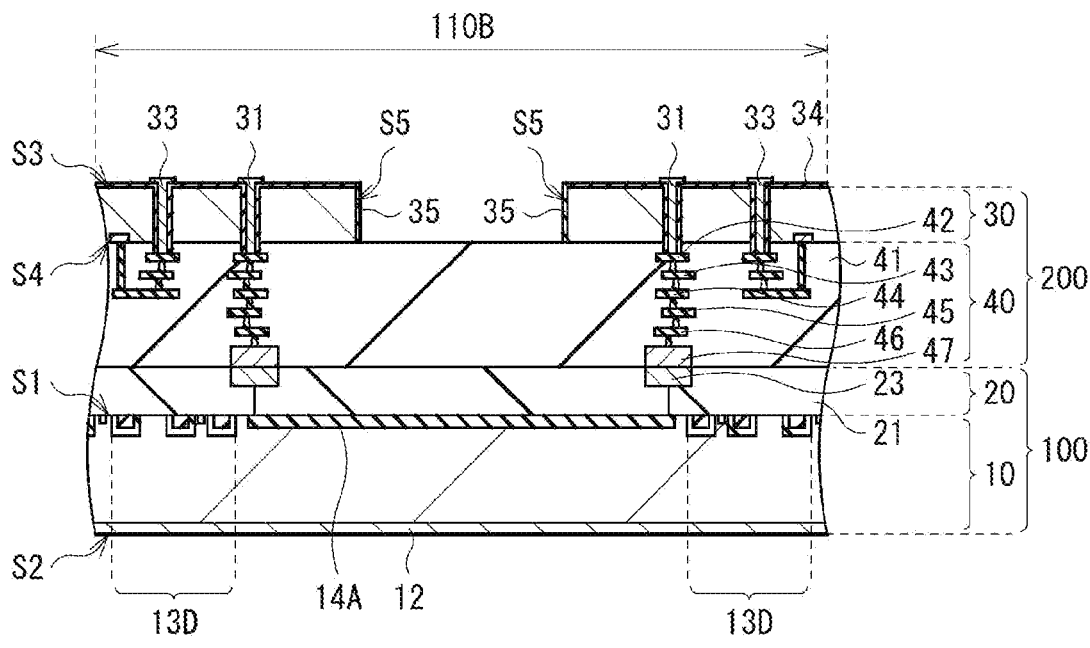

[ FIG. 5E ]
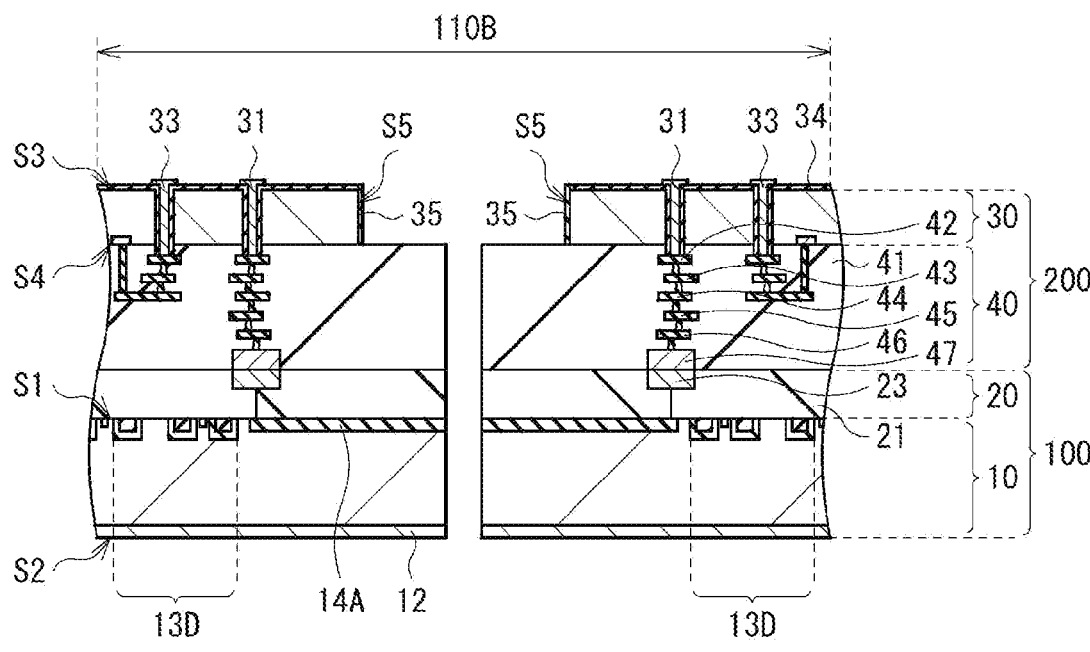

[FIG. 6]
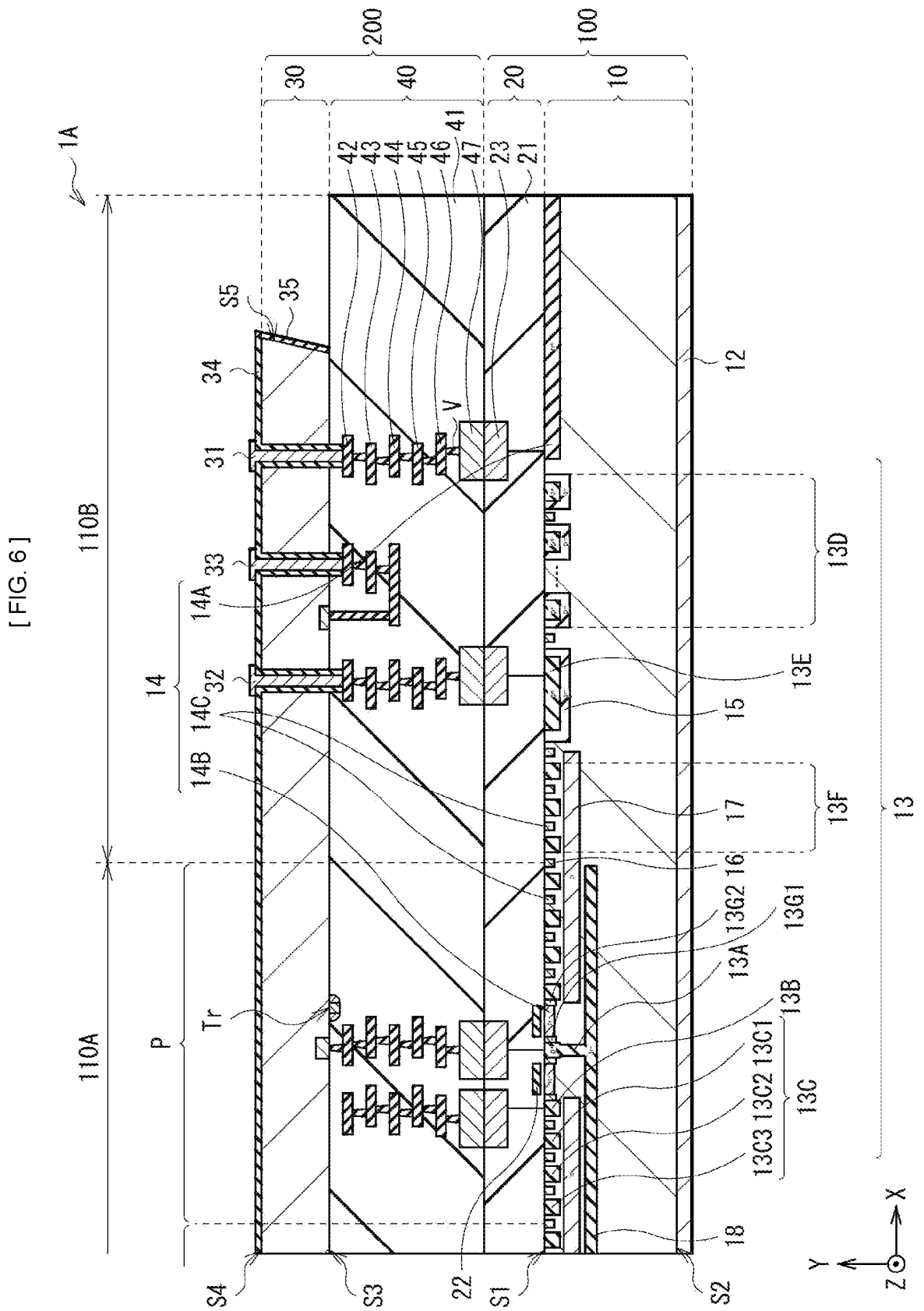

[FIG. 7]
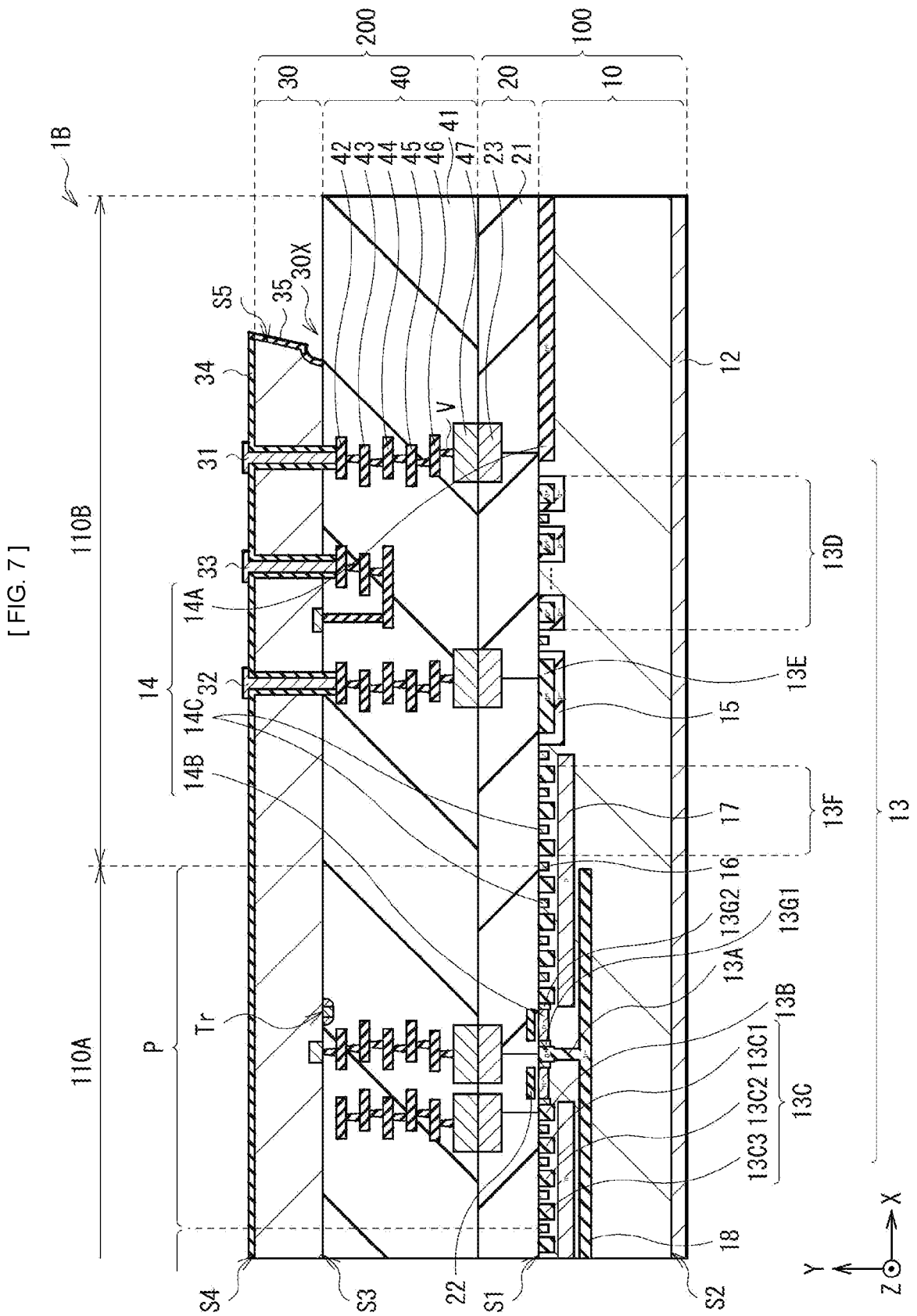

[FIG. 8]
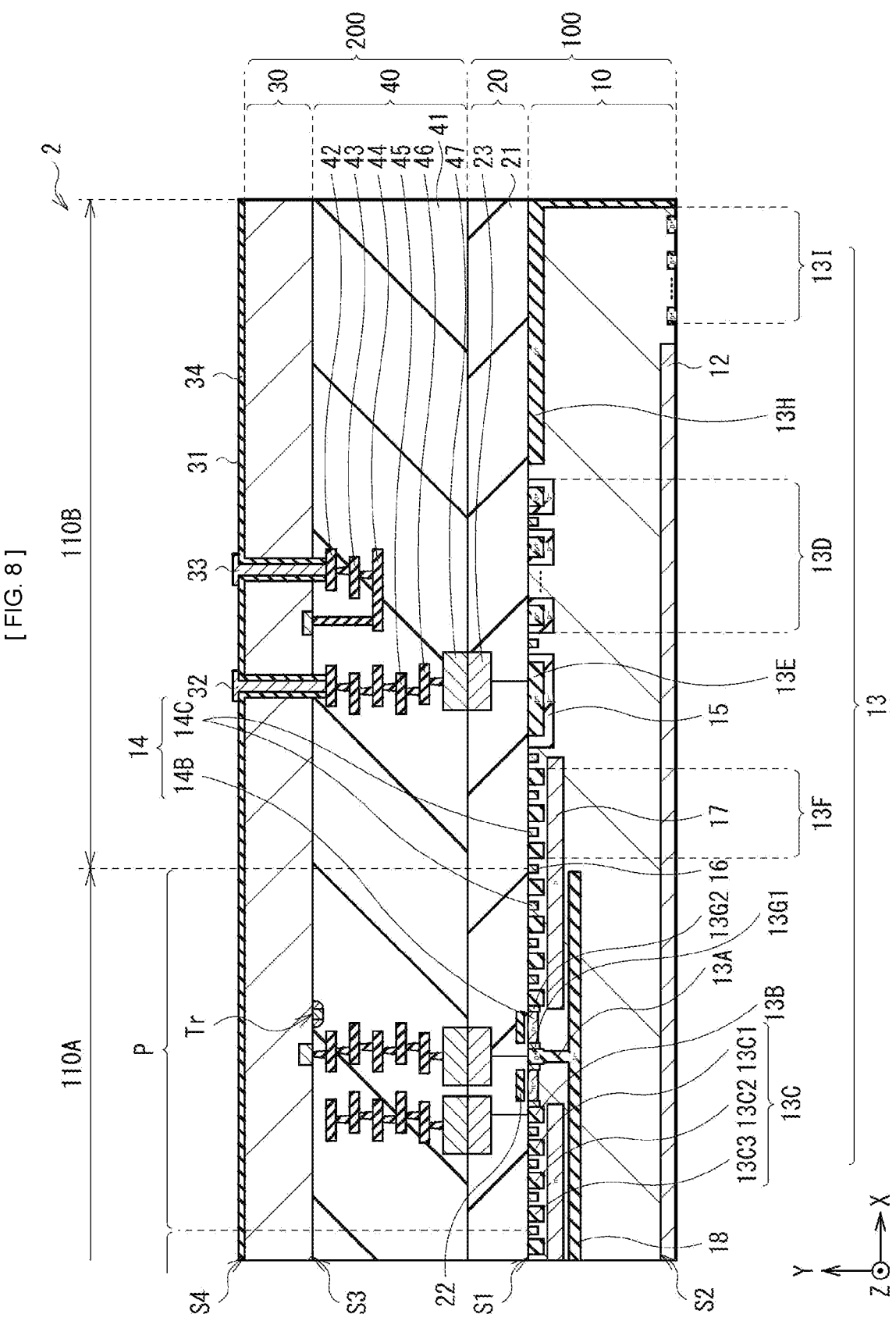

[FIG. 9]
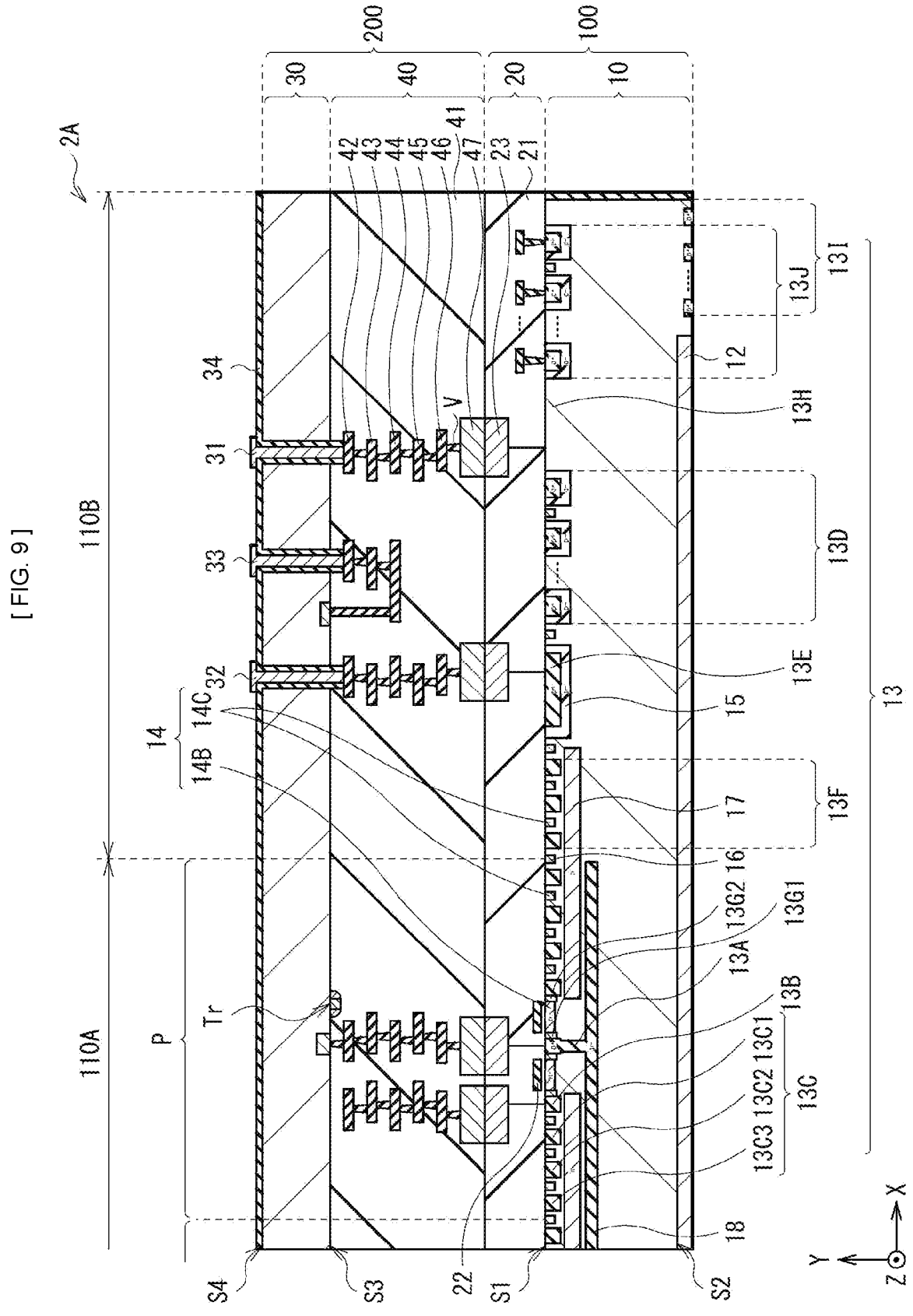

[FIG. 10]
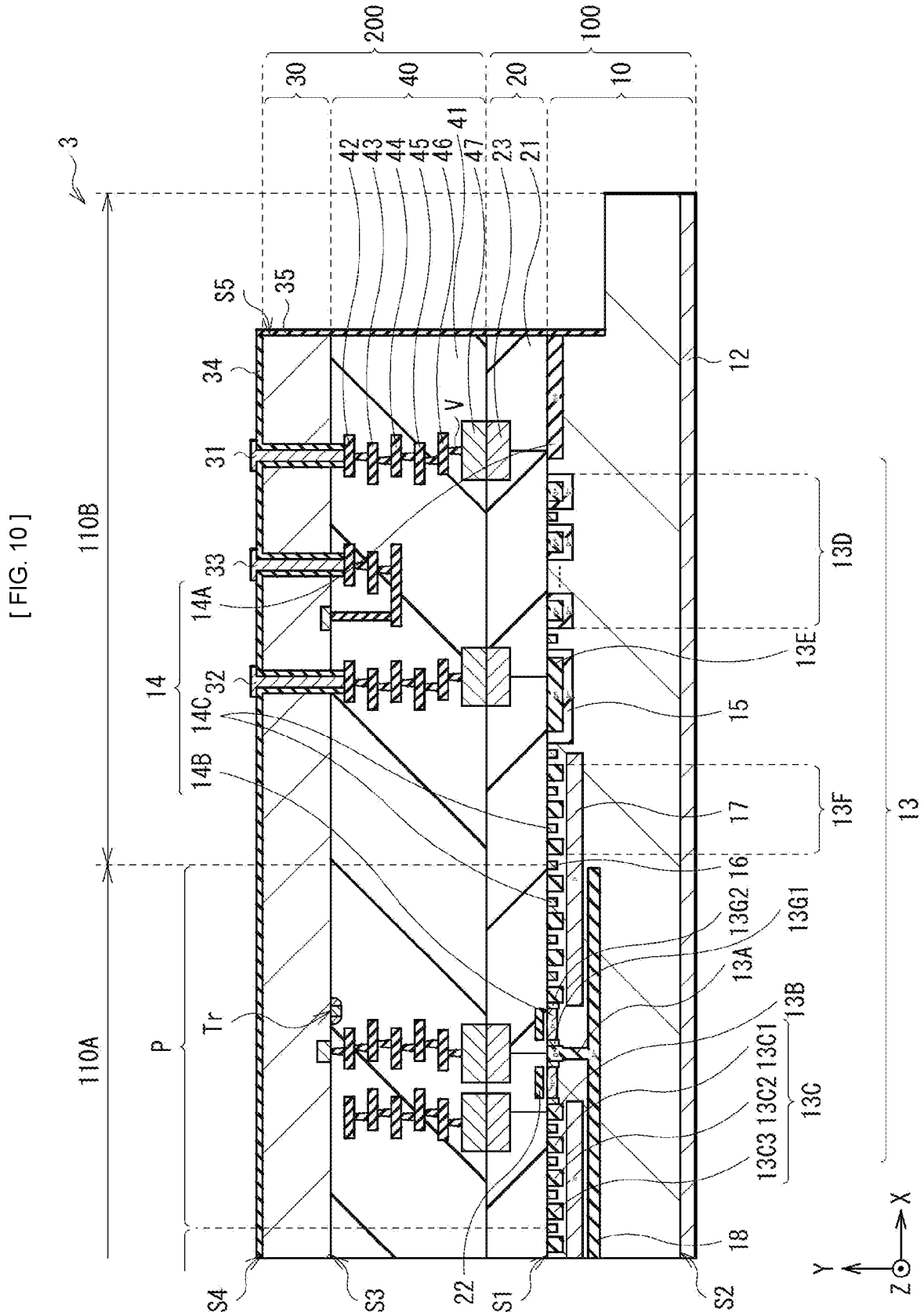

[FIG. 11A]
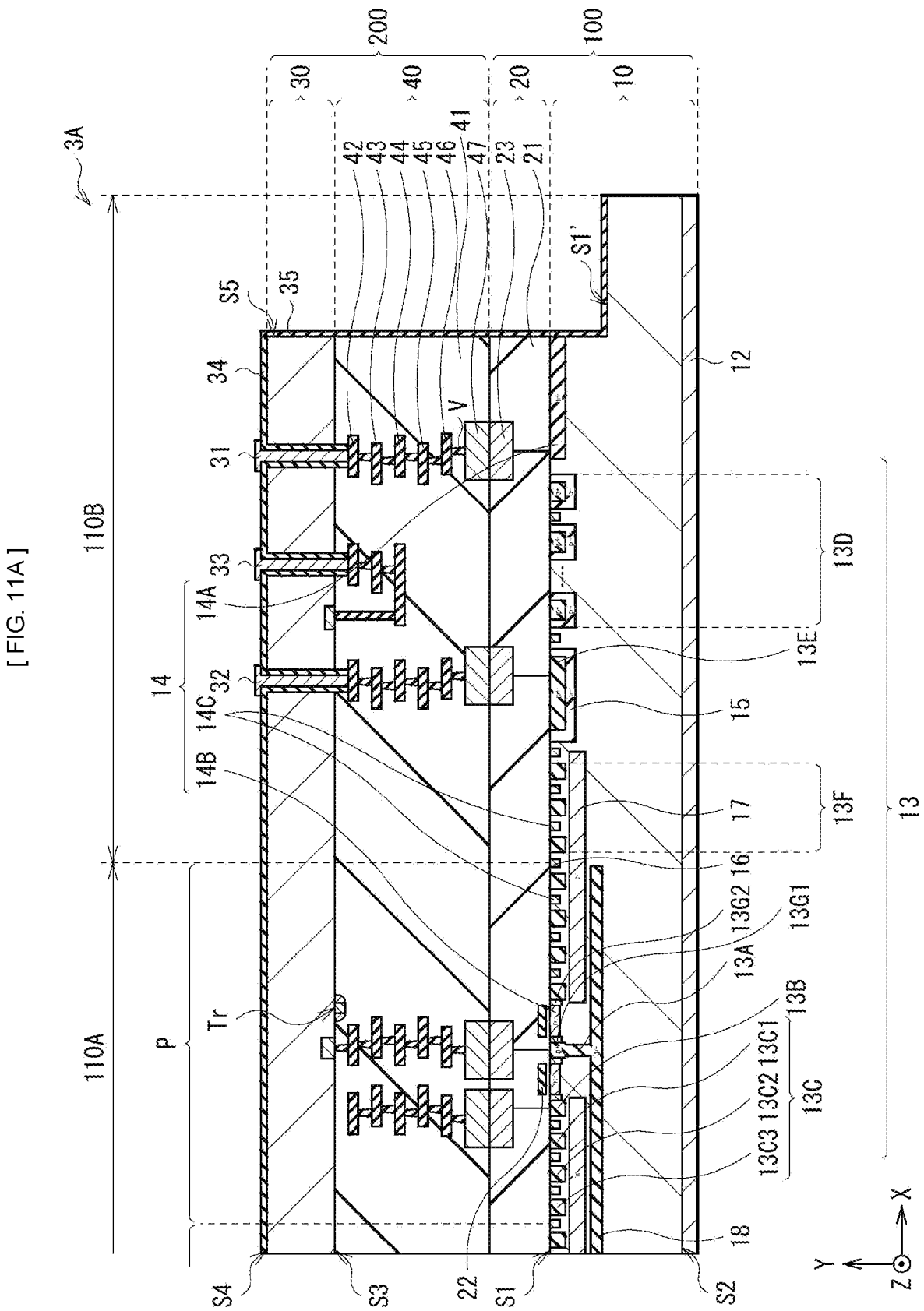

[FIG. 11B]
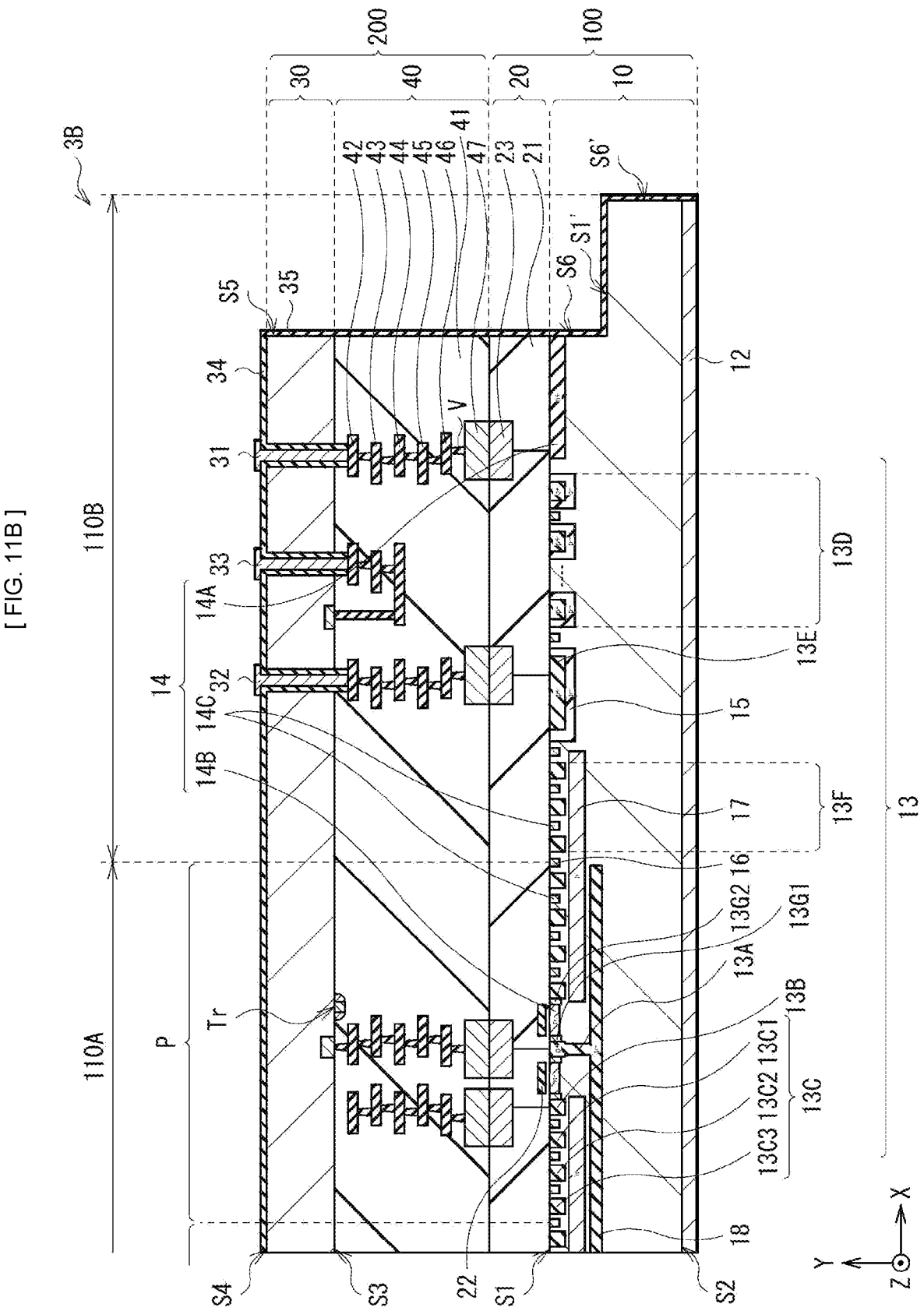

[FIG. 12]
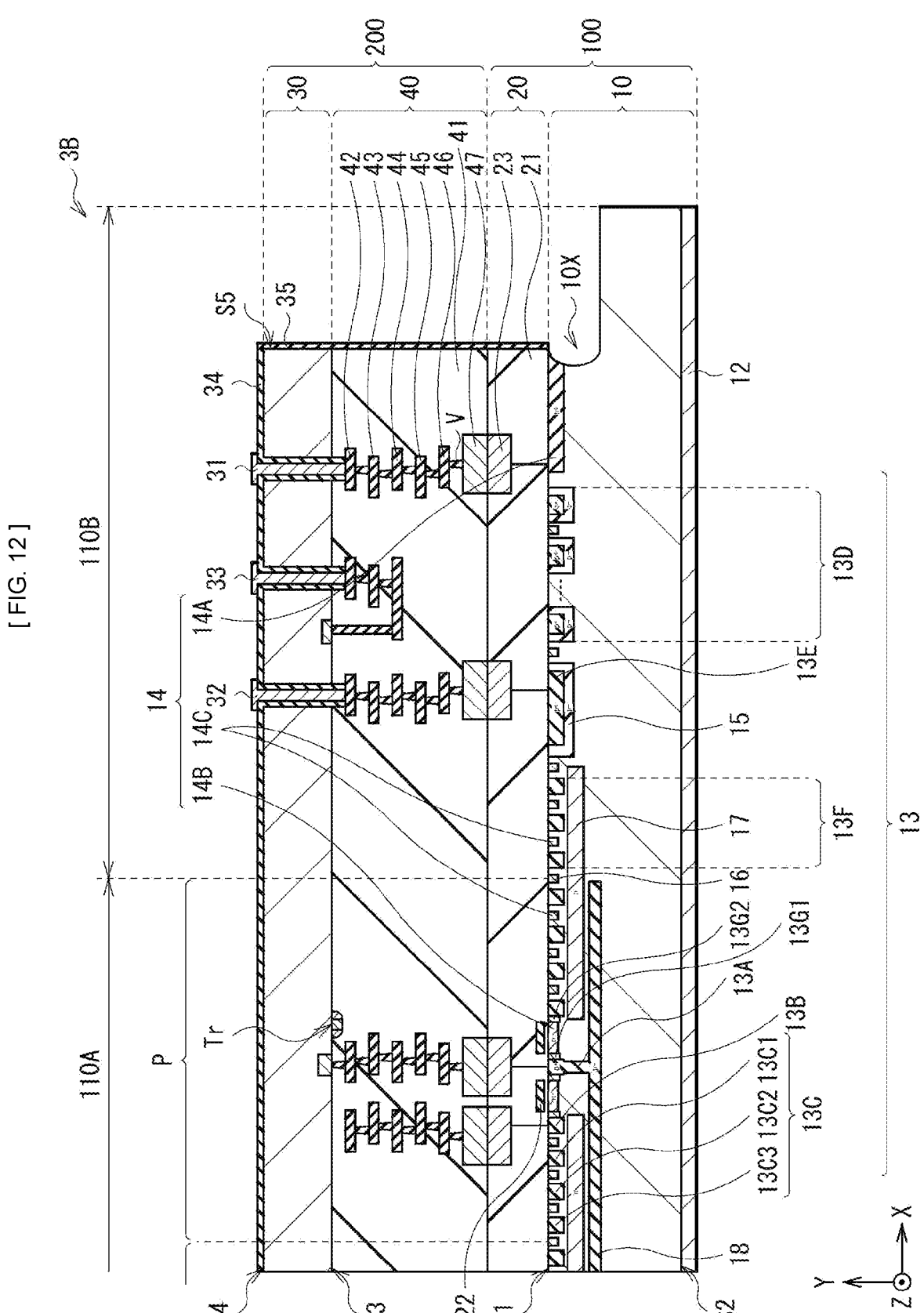

[ FIG. 13 ]
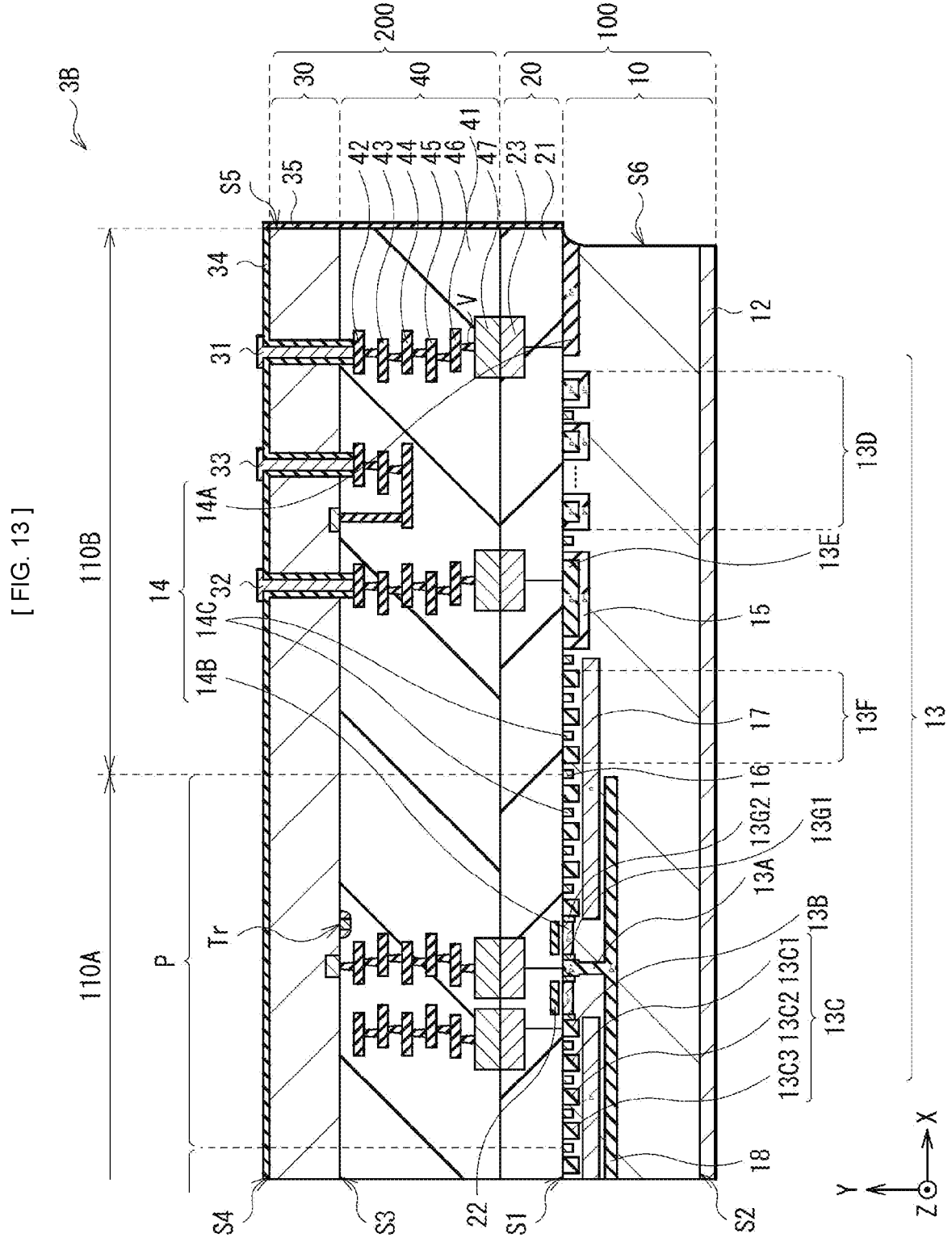

[ FIG. 14 ]
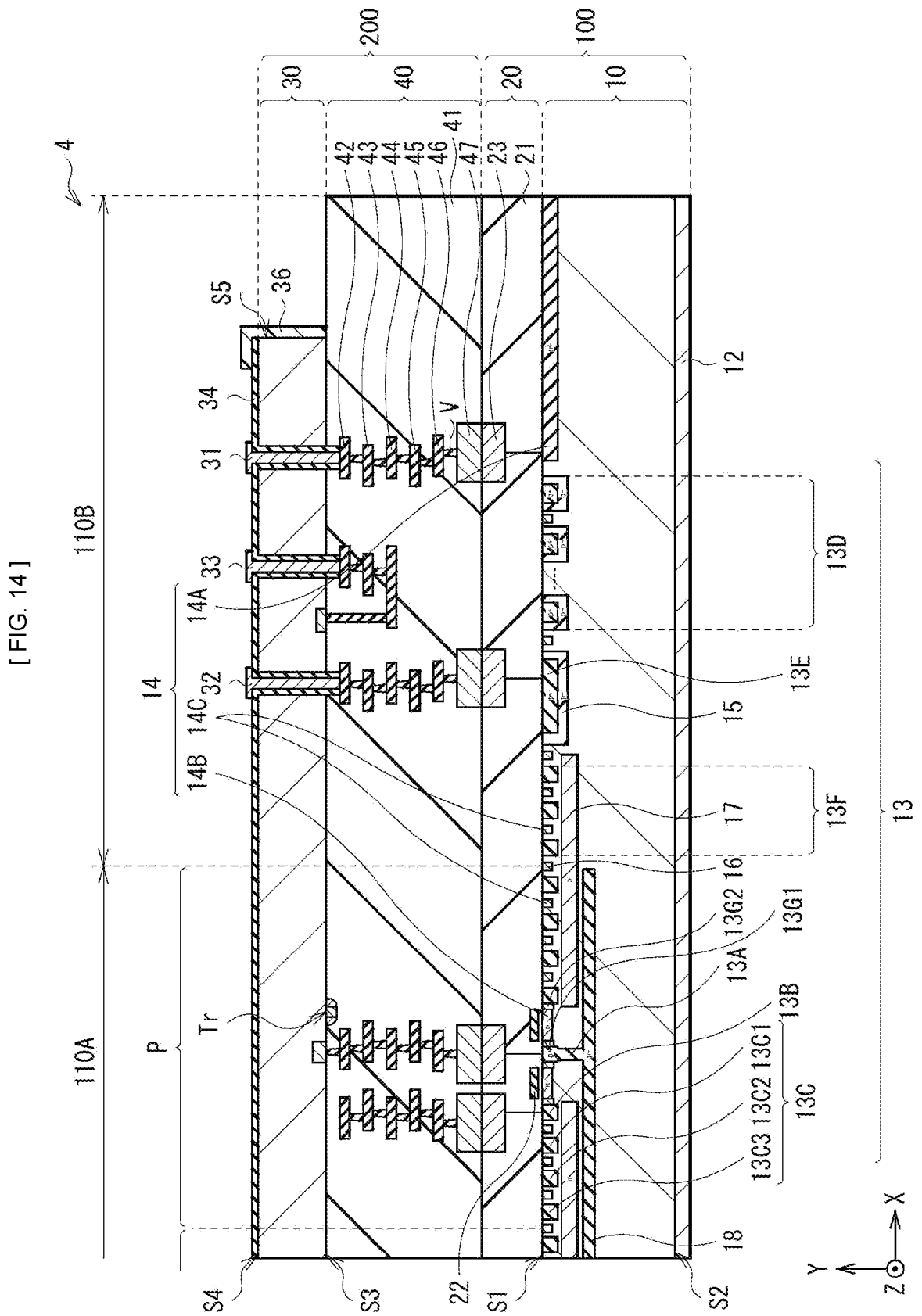

[FIG. 15]
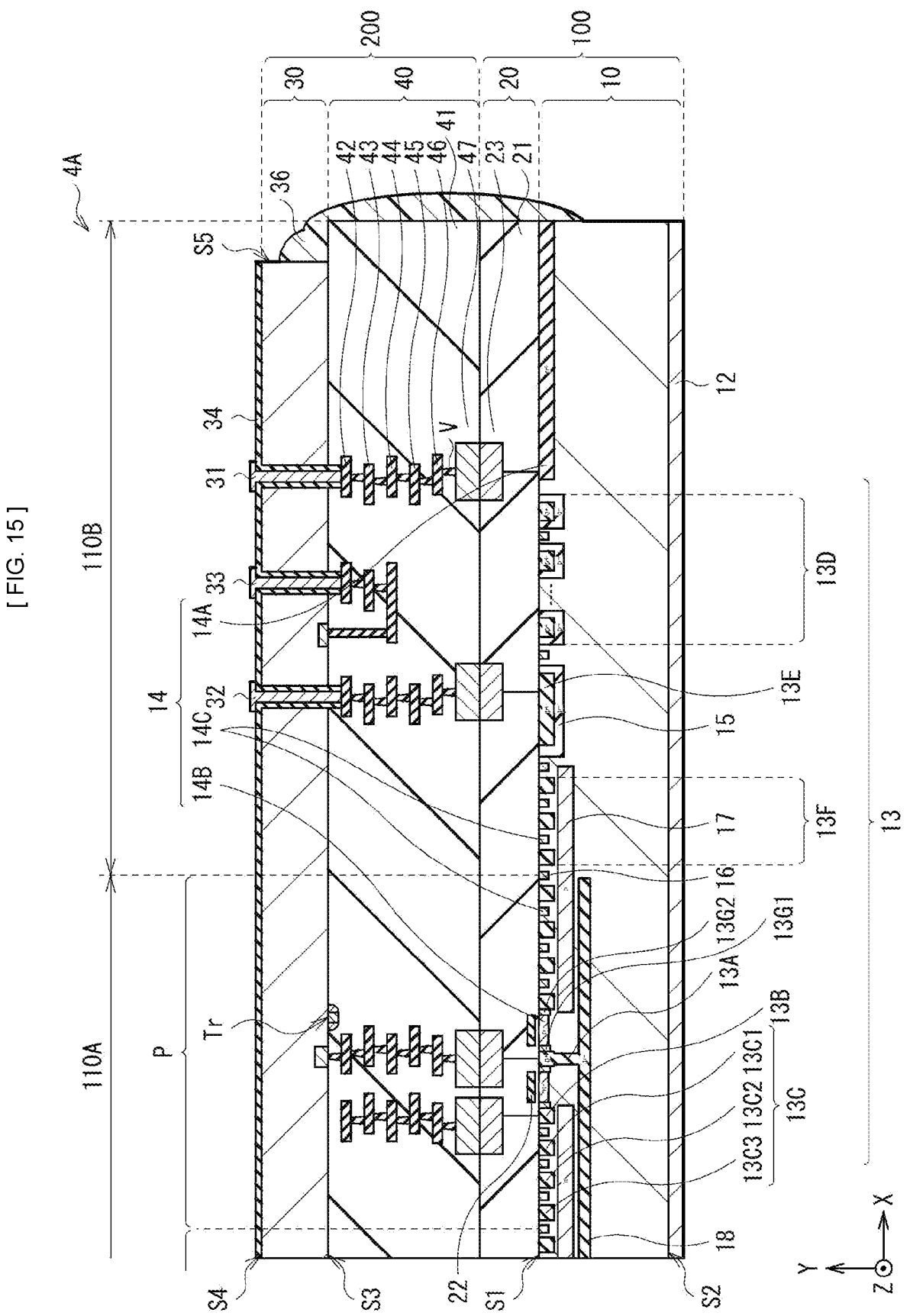

[FIG. 16]
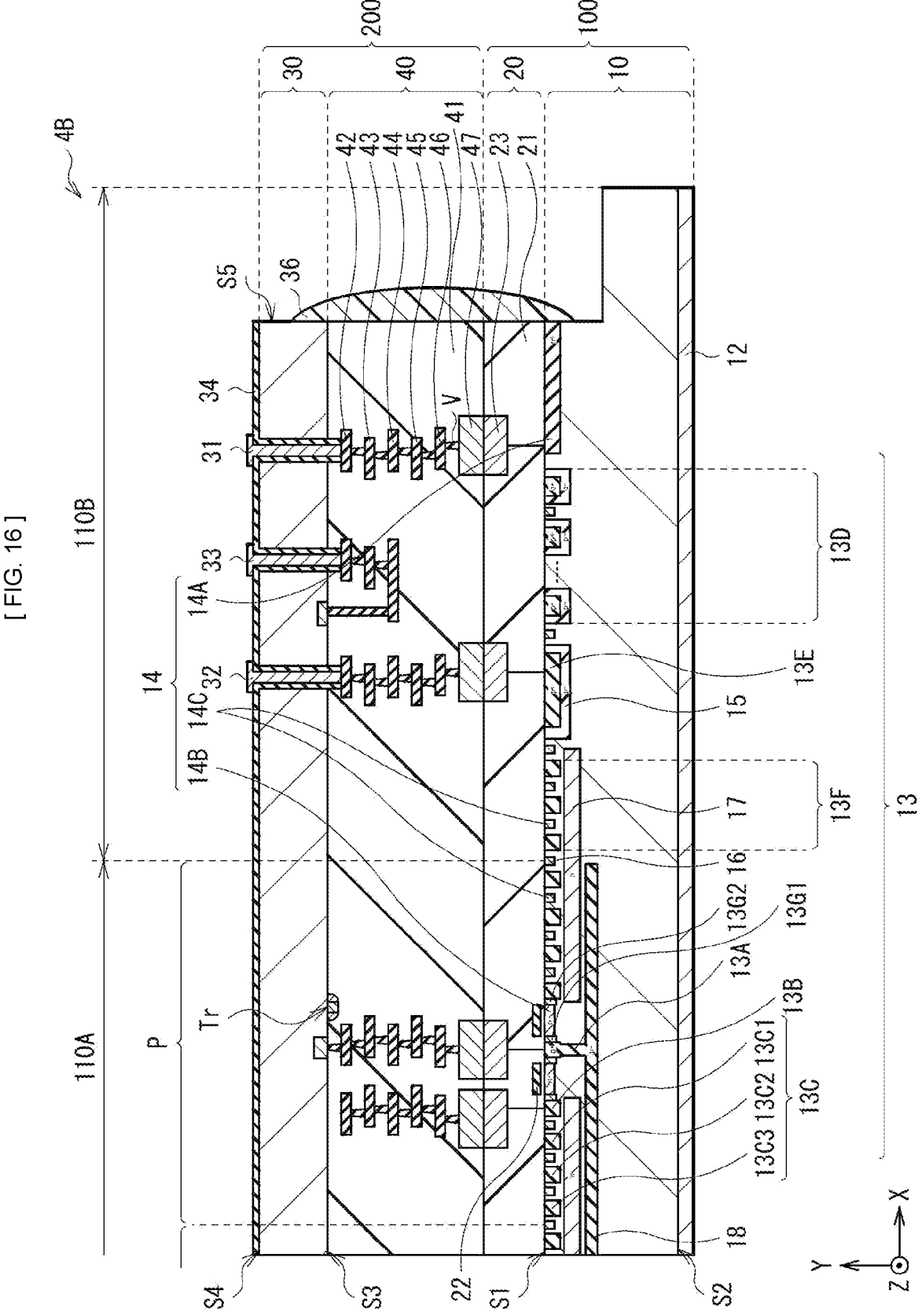

[ FIG. 17 ]
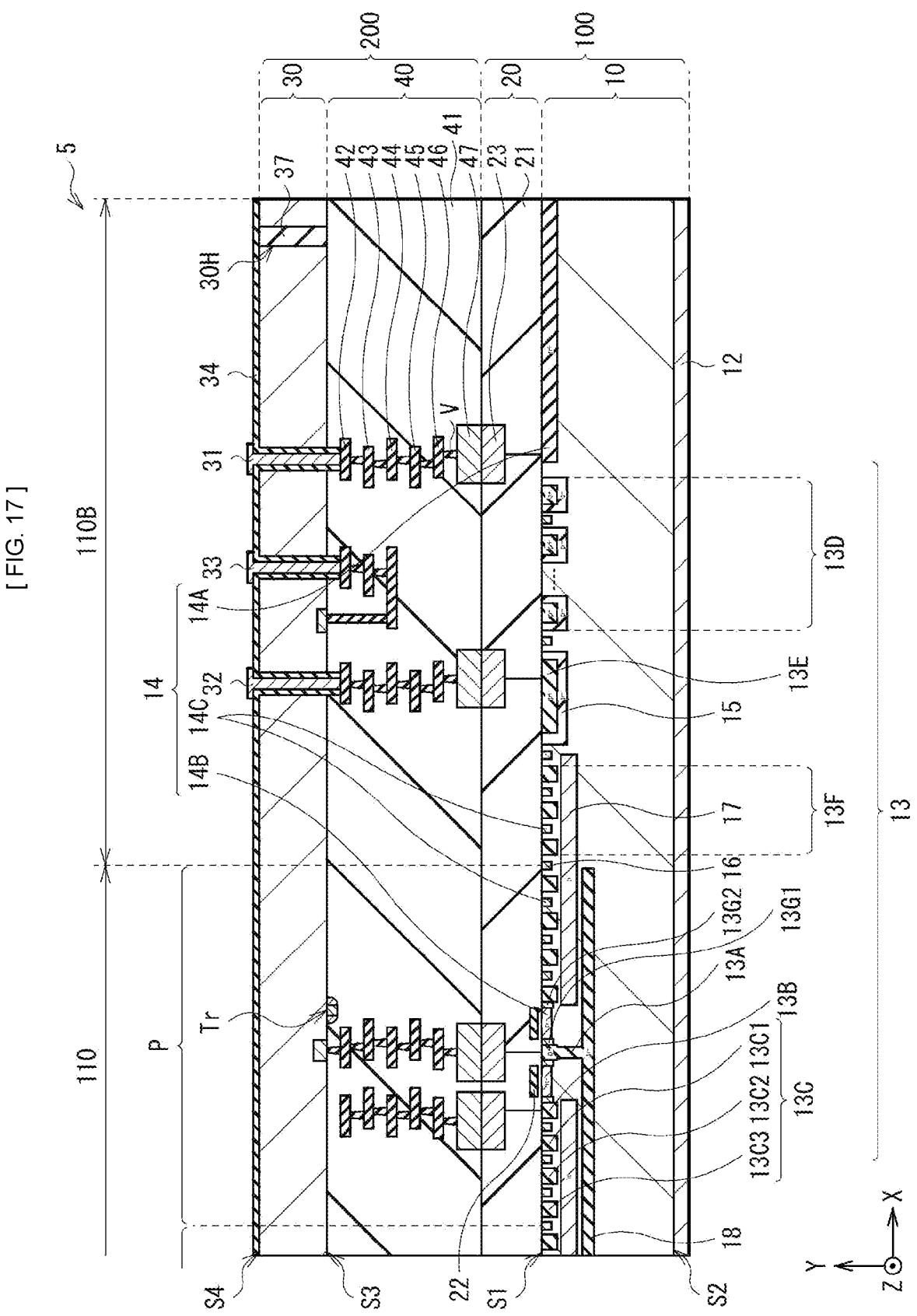

[ FIG. 18 ]
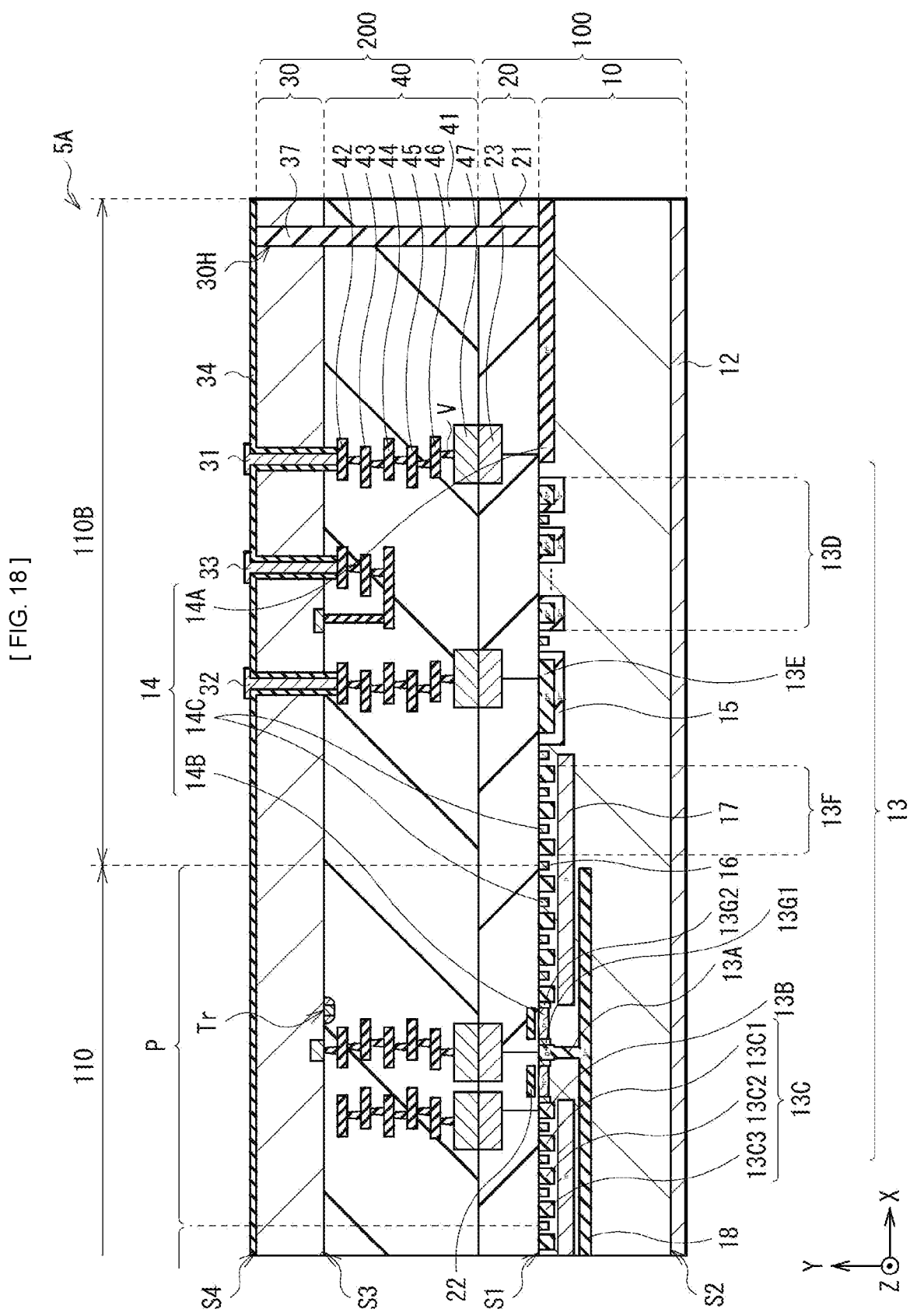

[FIG. 19]
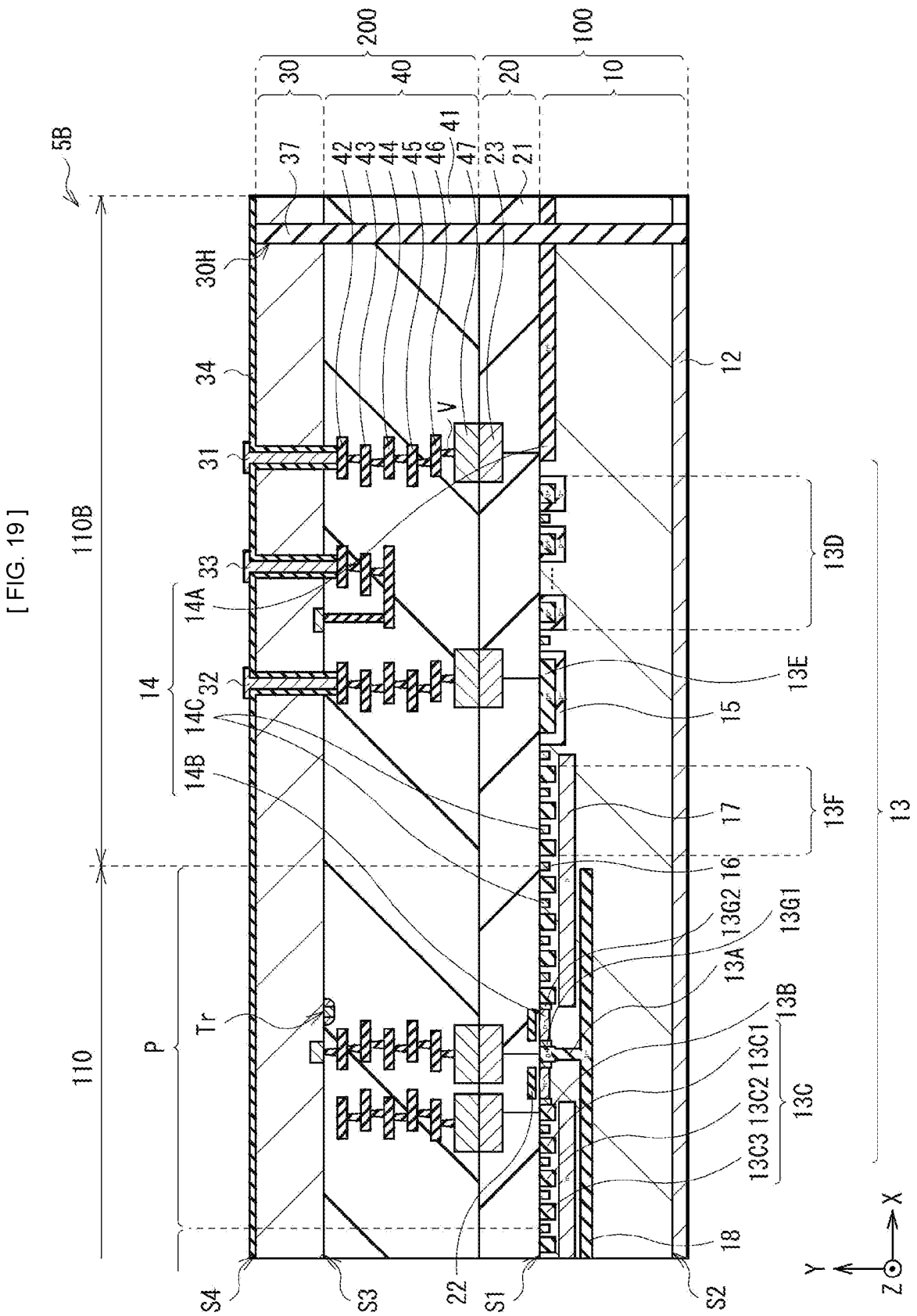

[FIG. 20]
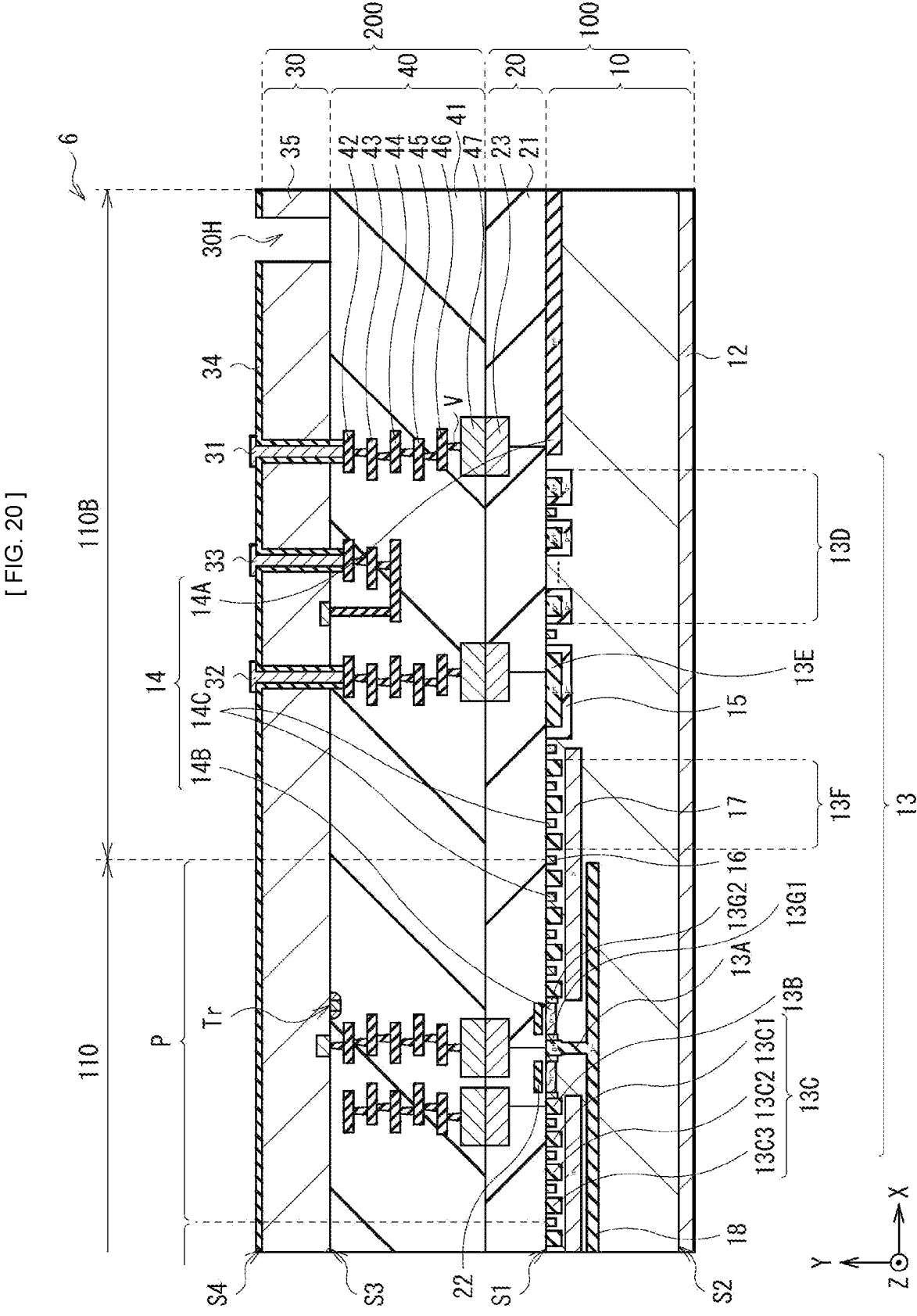

[ FIG. 21 ]
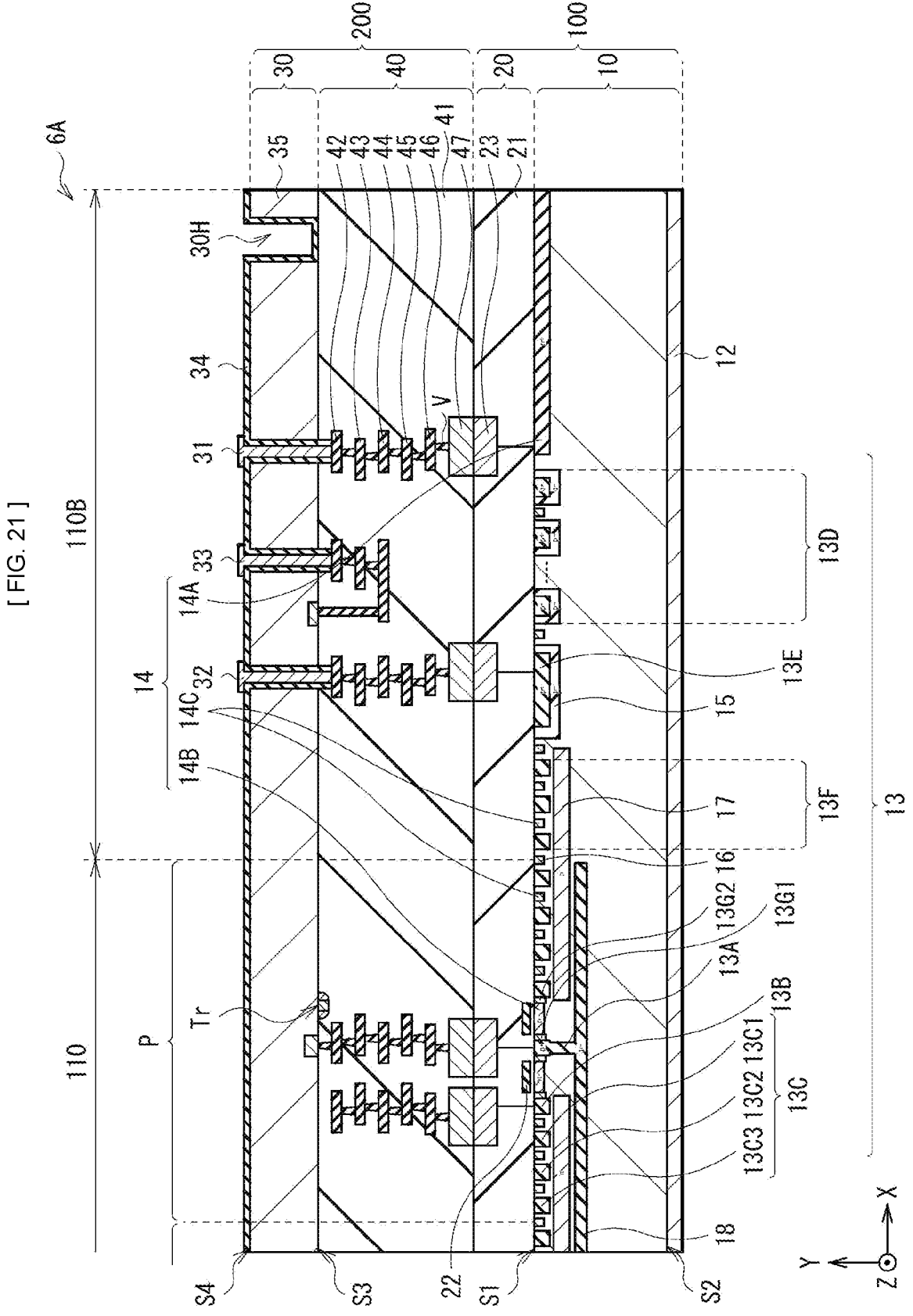

[ FIG. 22 ]
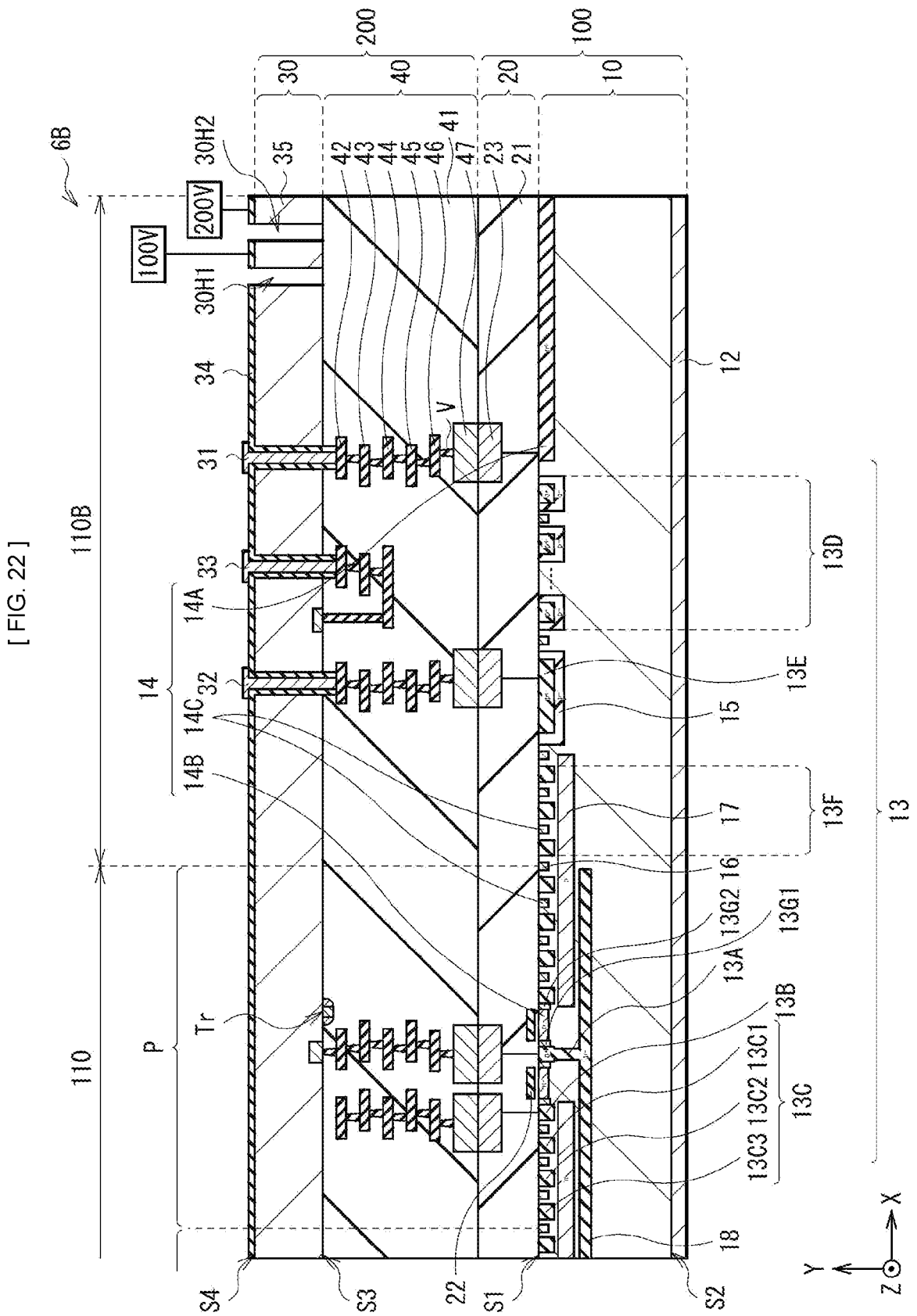

[ FIG. 23 ]
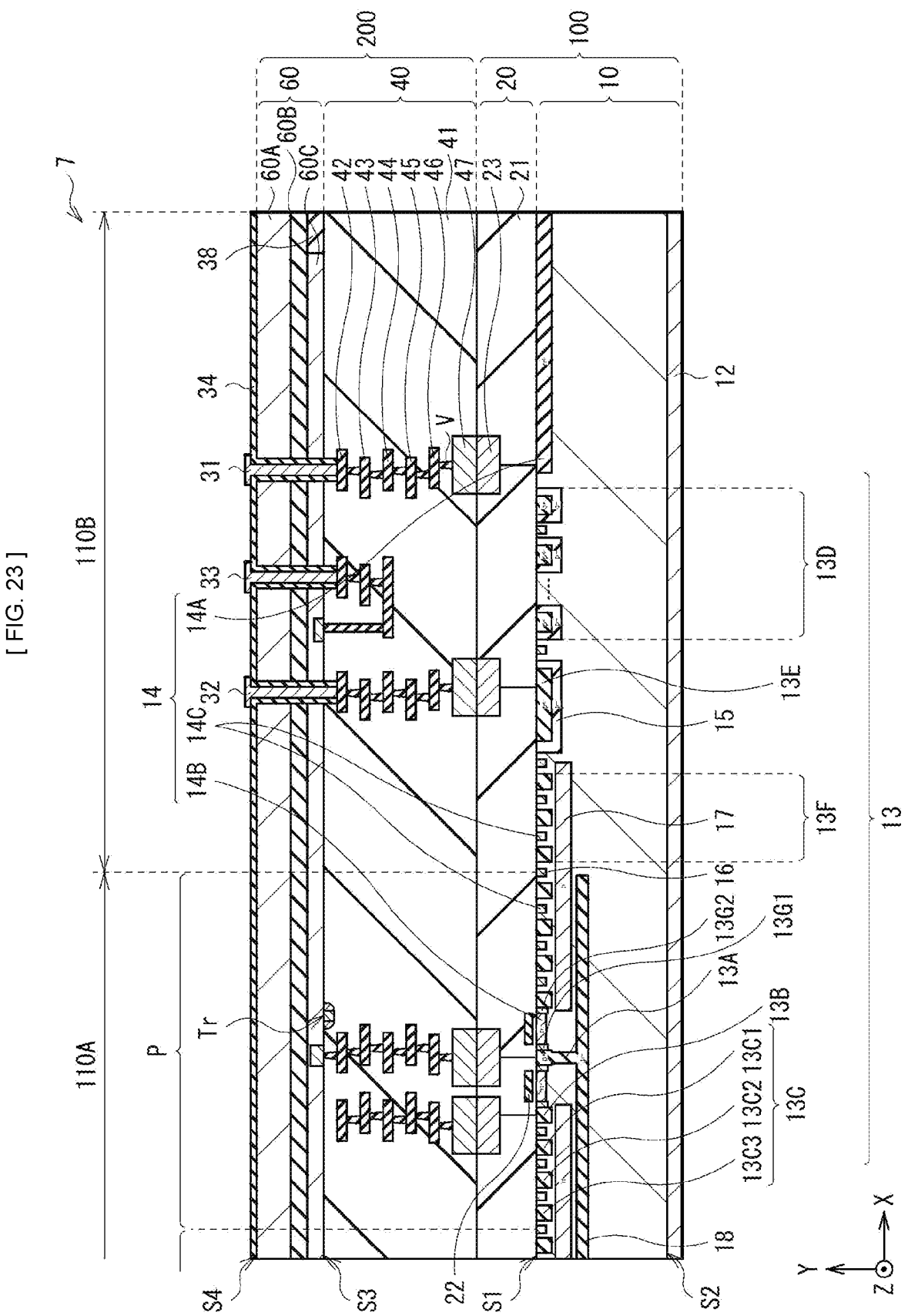

[FIG. 24A]
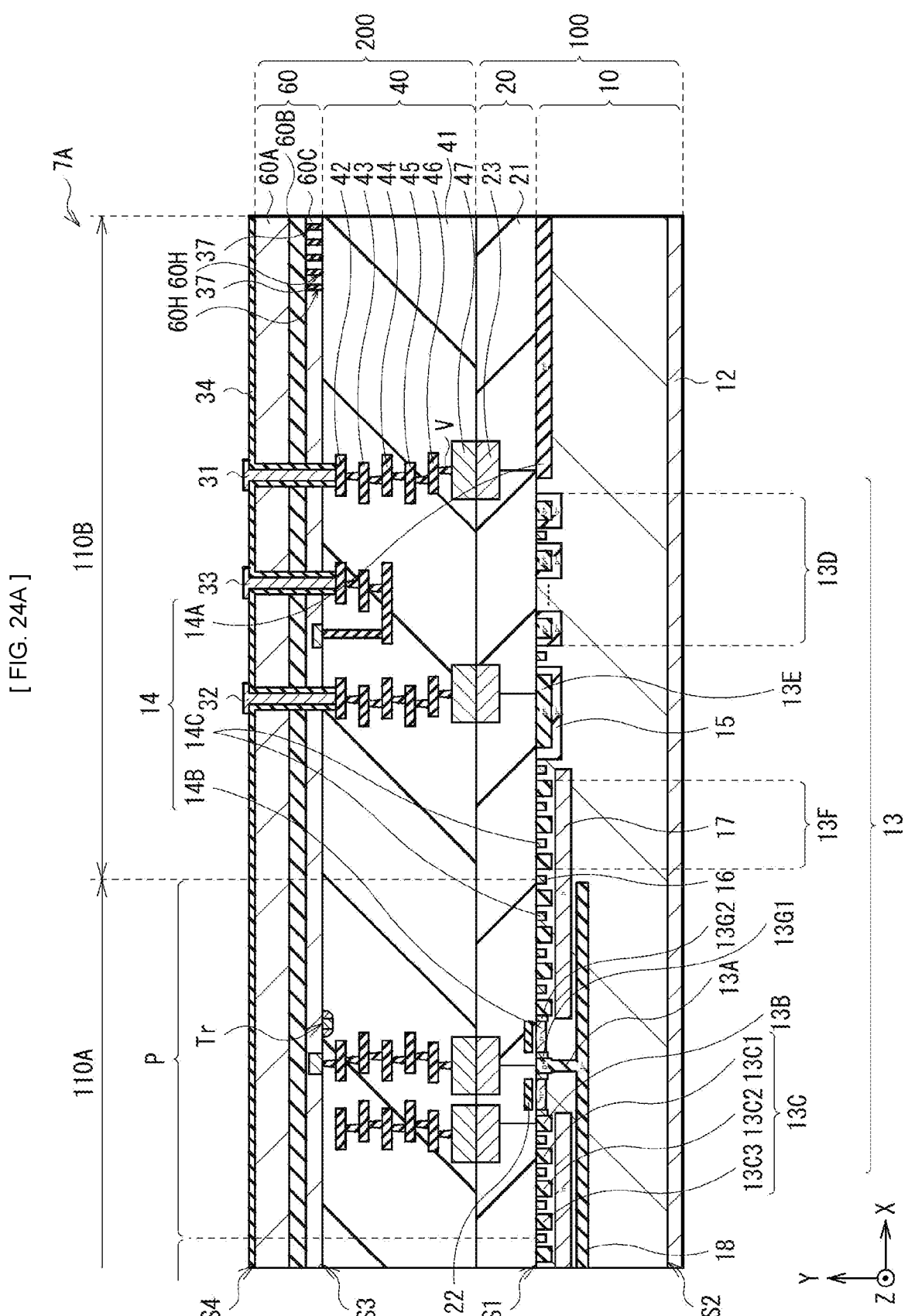

[ FIG. 24B ]
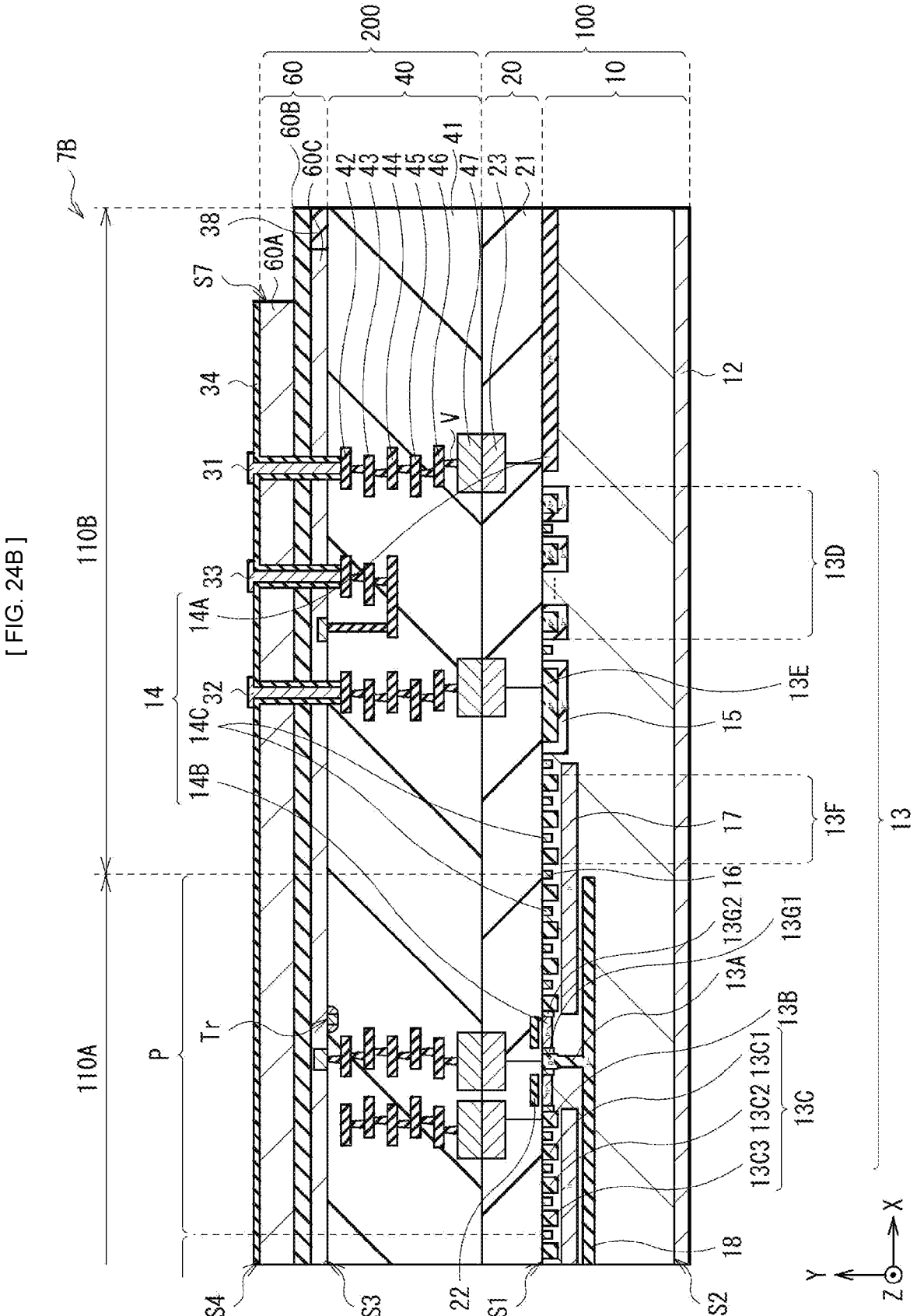

[ FIG. 25A ]
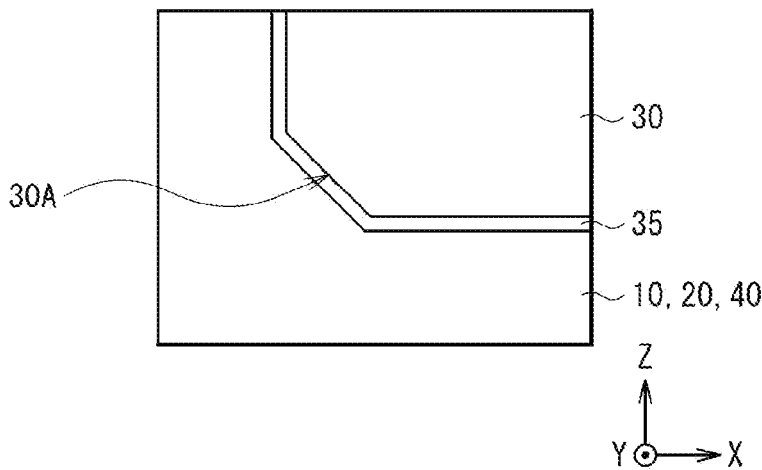
[ FIG. 25B ]
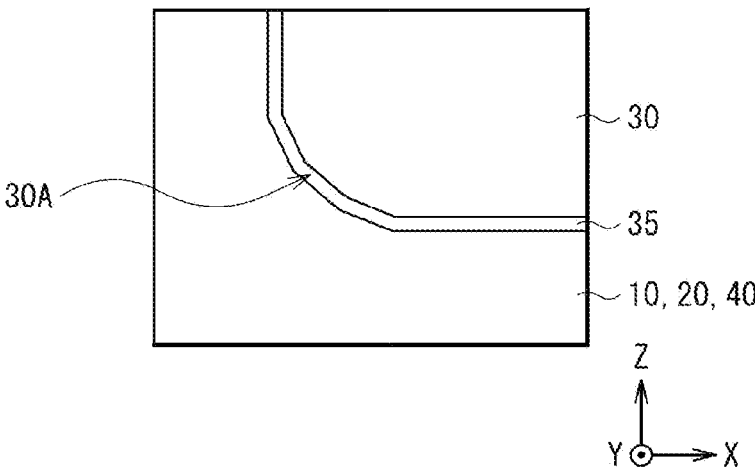

[ FIG. 26A ]
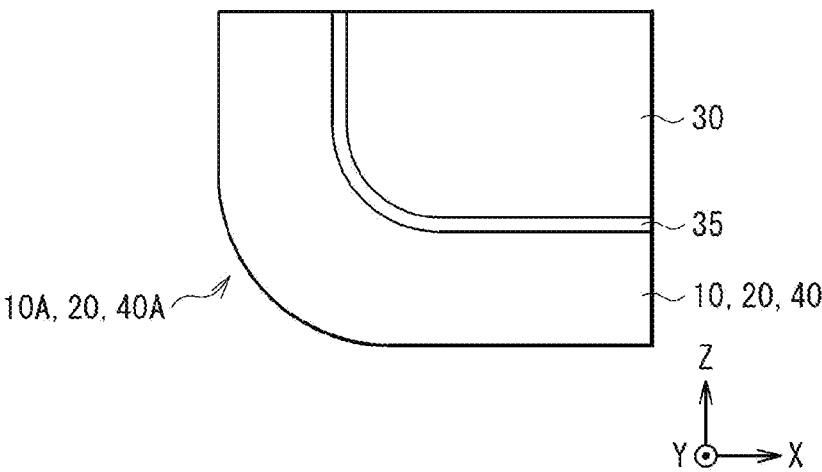
[ FIG. 26B ]
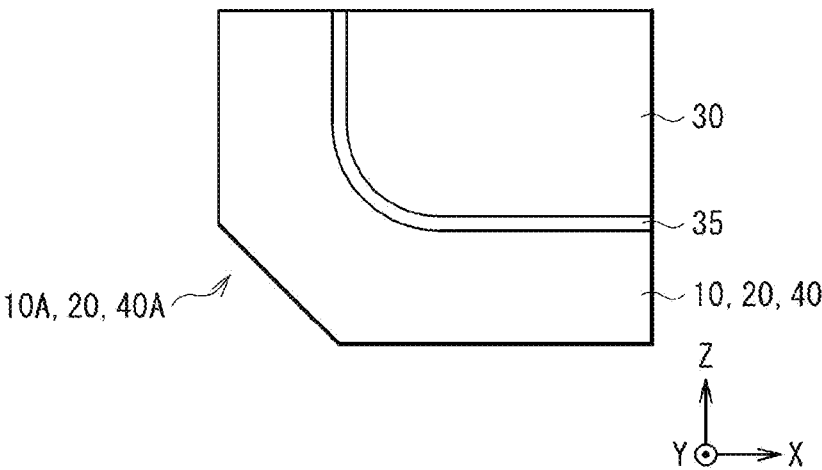
[ FIG. 26C ]
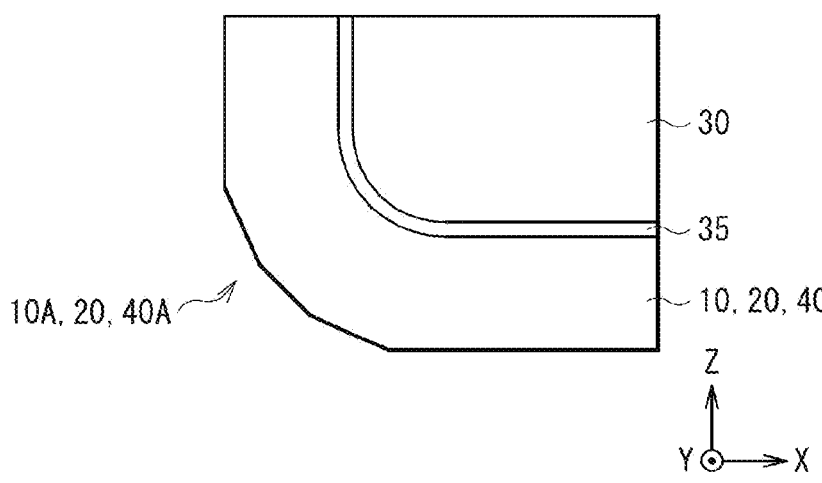

[ FIG. 27 ]
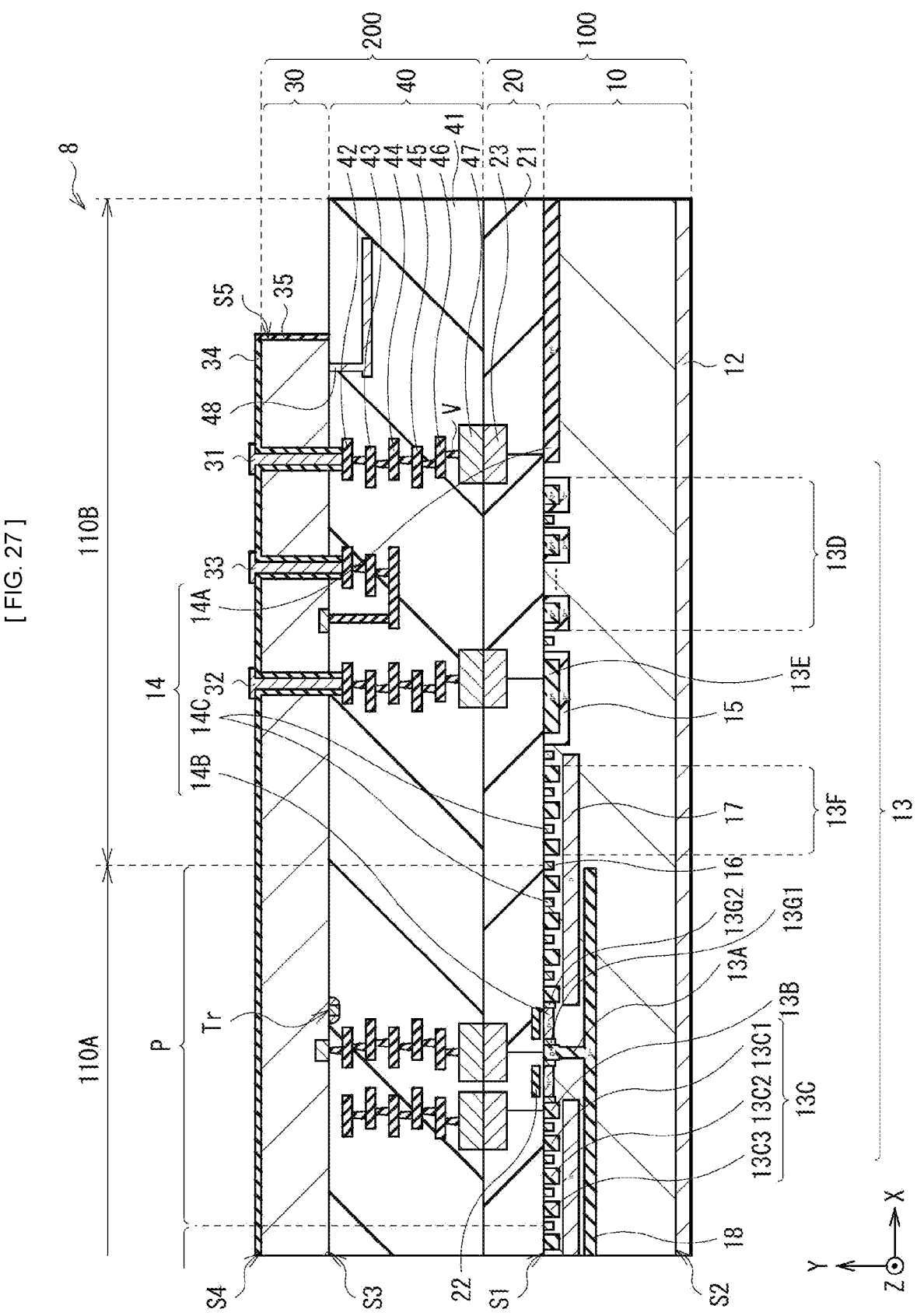

[FIG. 28]
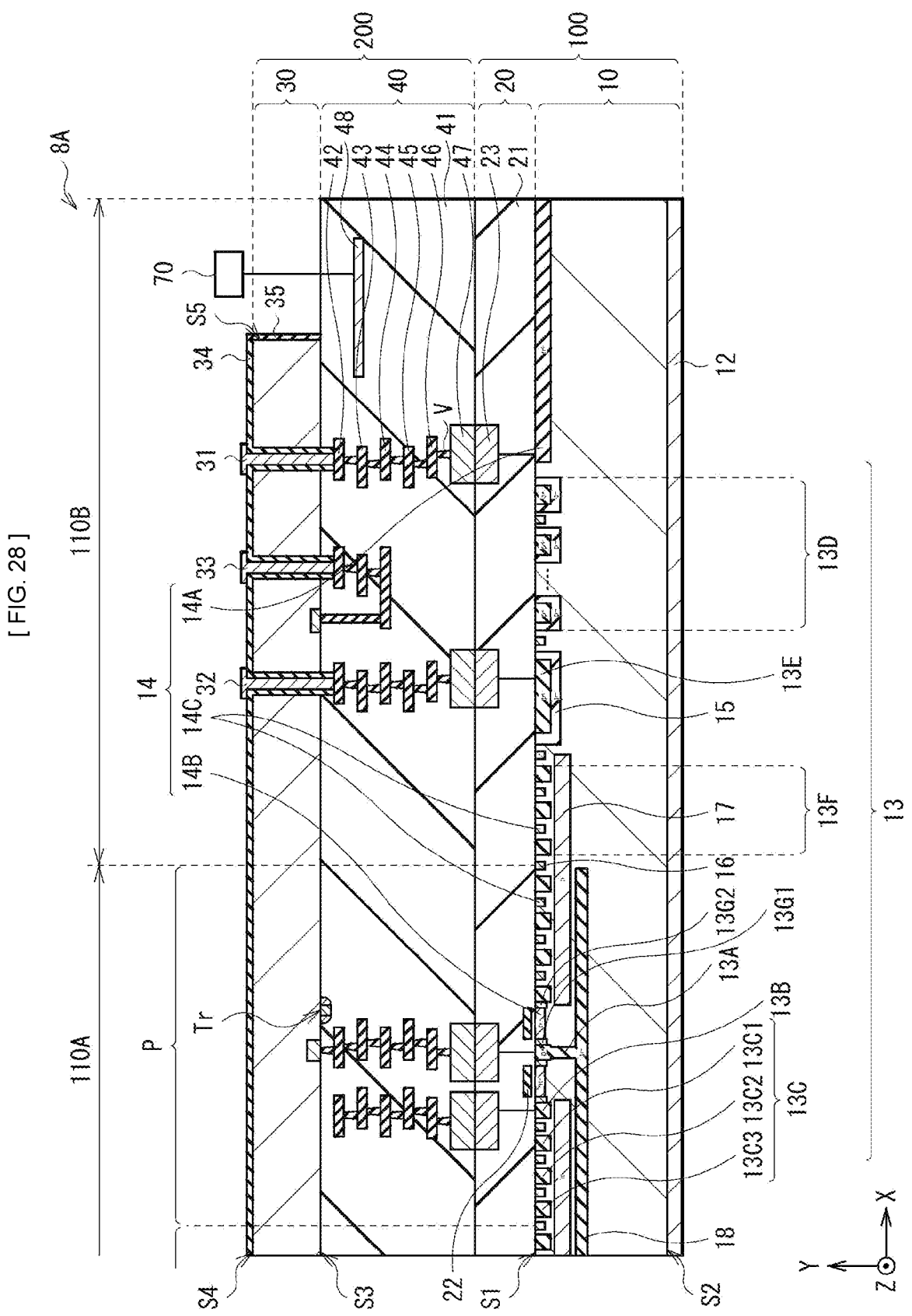

[FIG. 29]
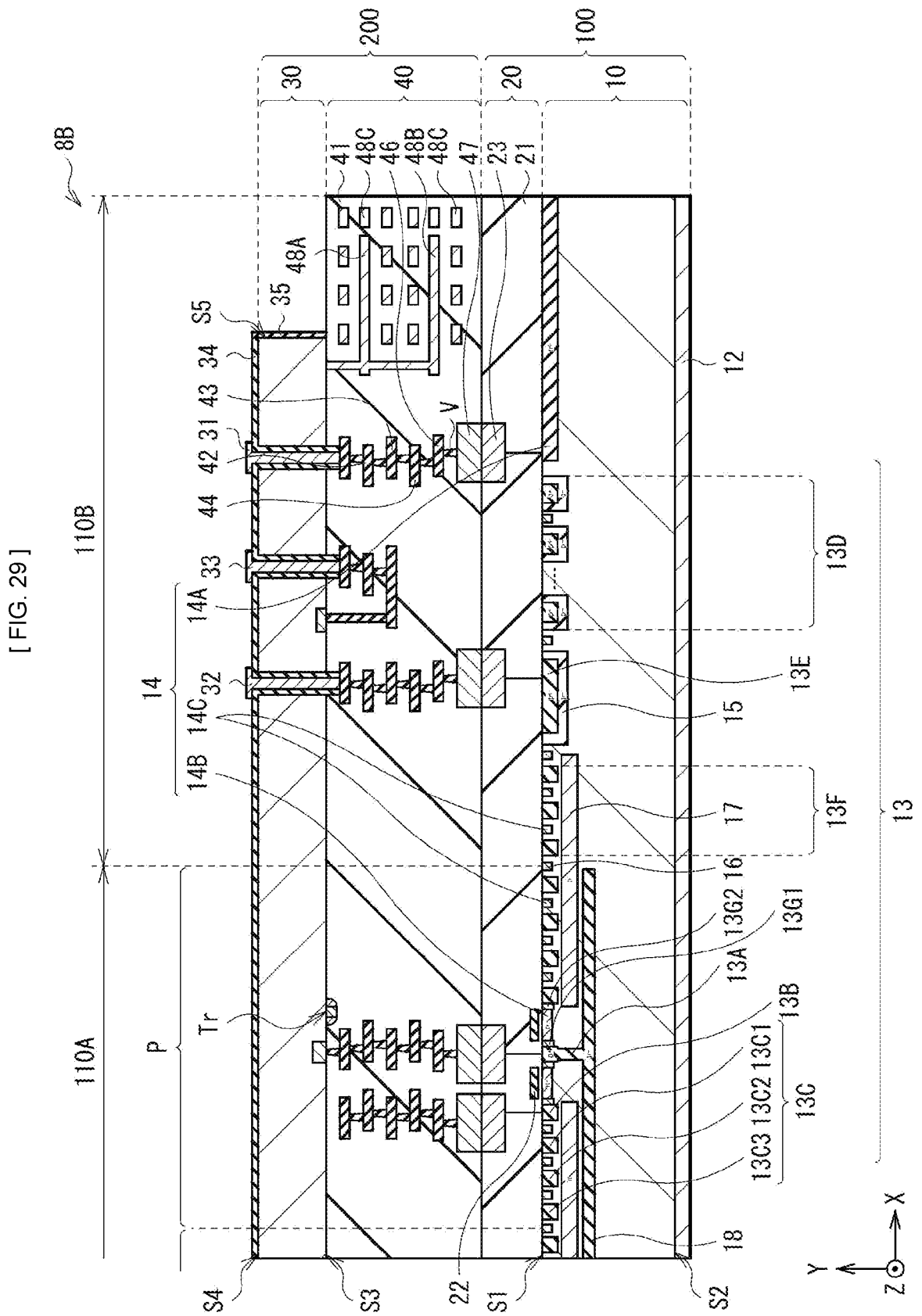

[ FIG. 30A ]
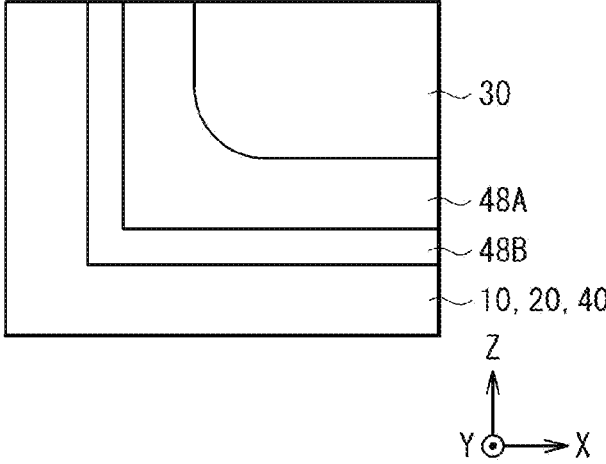
[ FIG. 30B ]
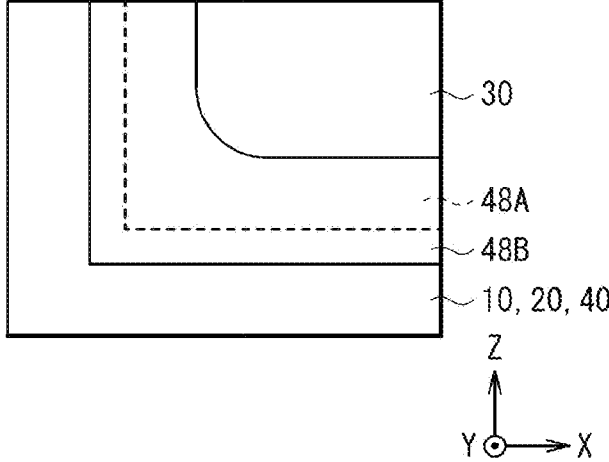

[ FIG. 30C ]
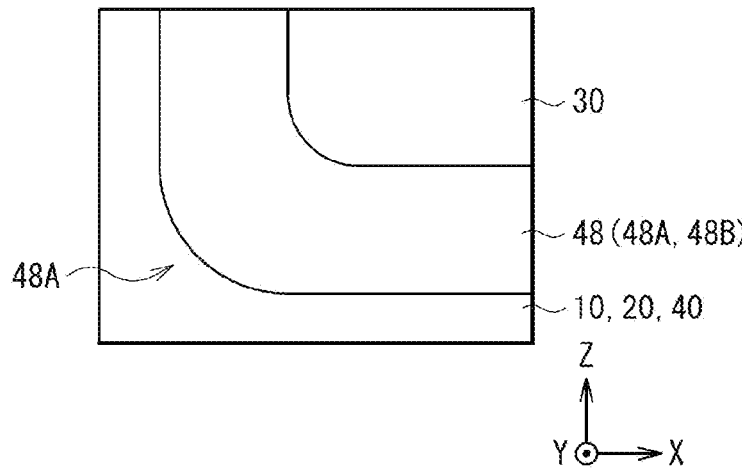
[ FIG. 30D ]
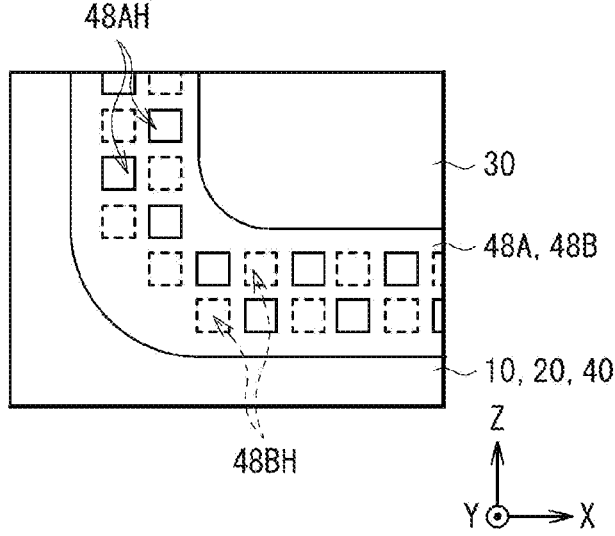

[FIG. 31]
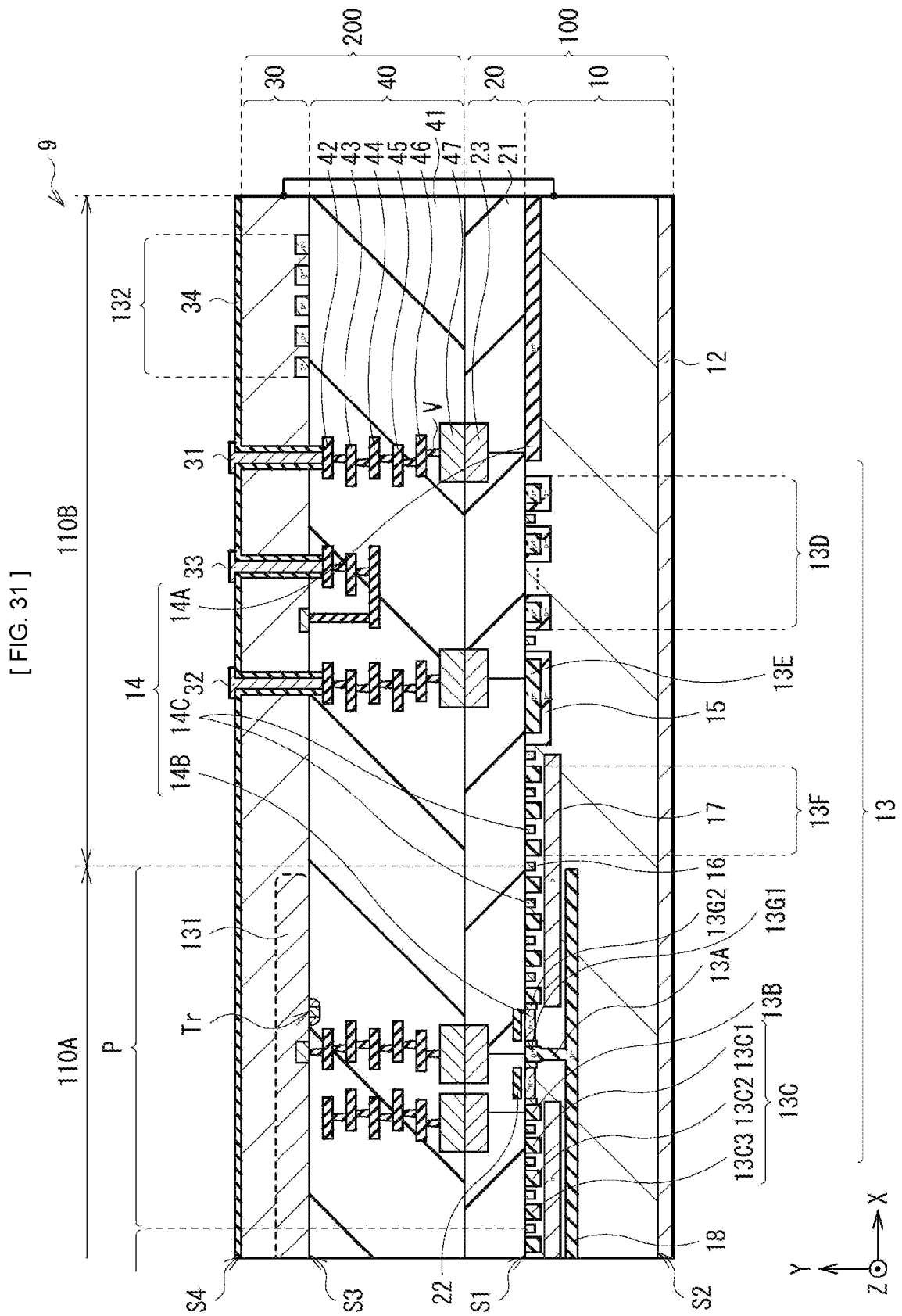

[FIG. 32]
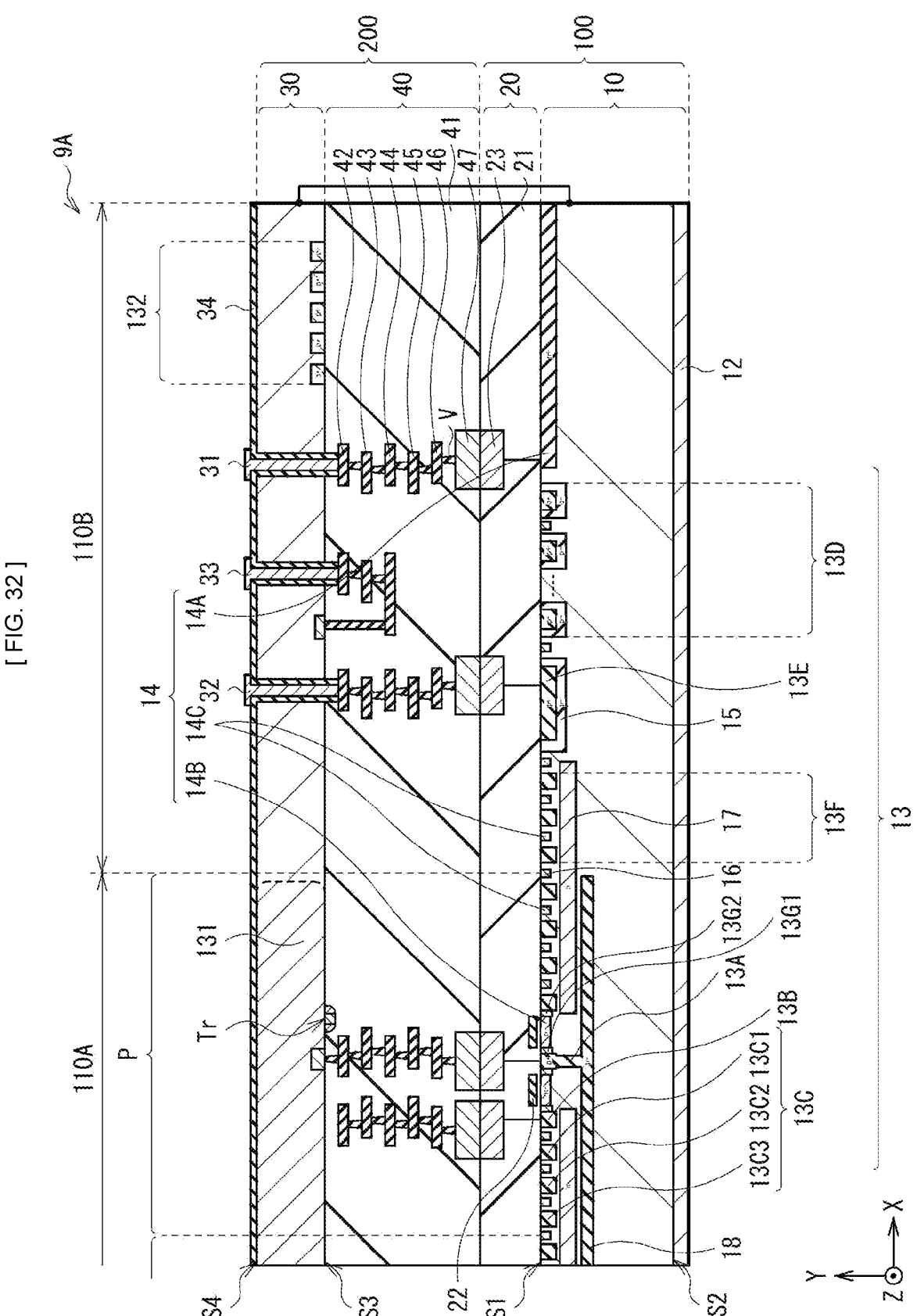

[ FIG. 33 ]
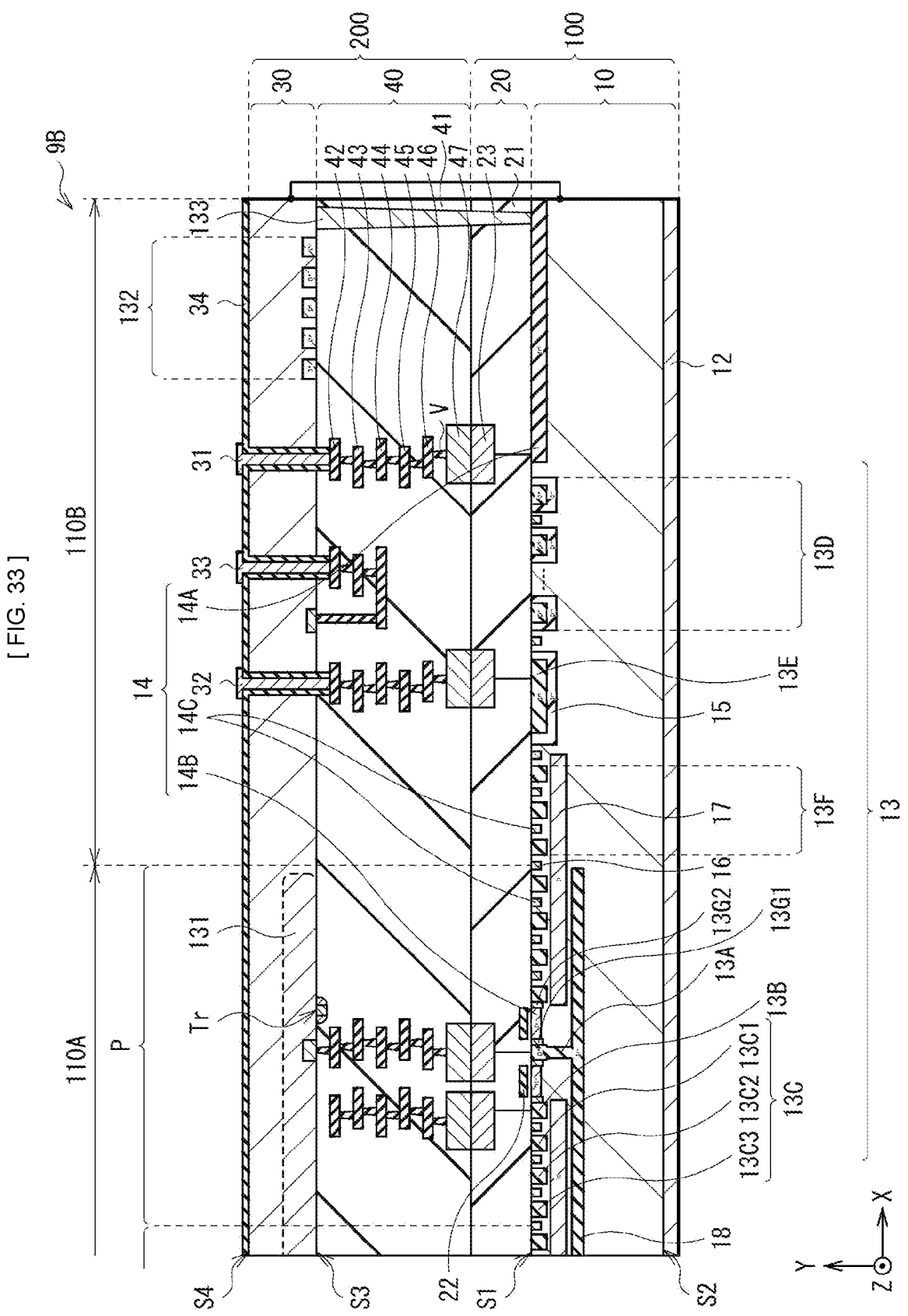

[FIG. 34]
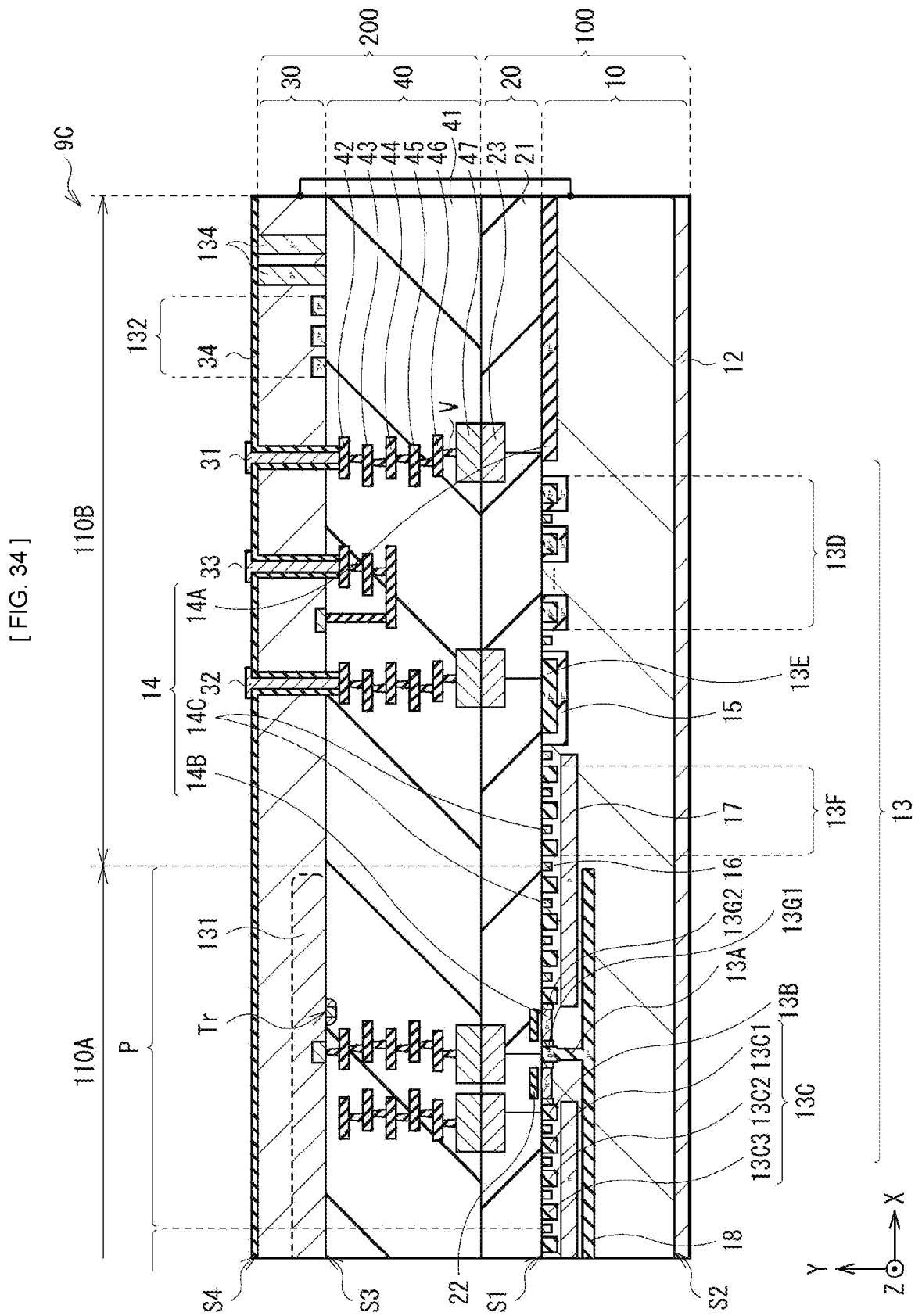

[FIG. 35]
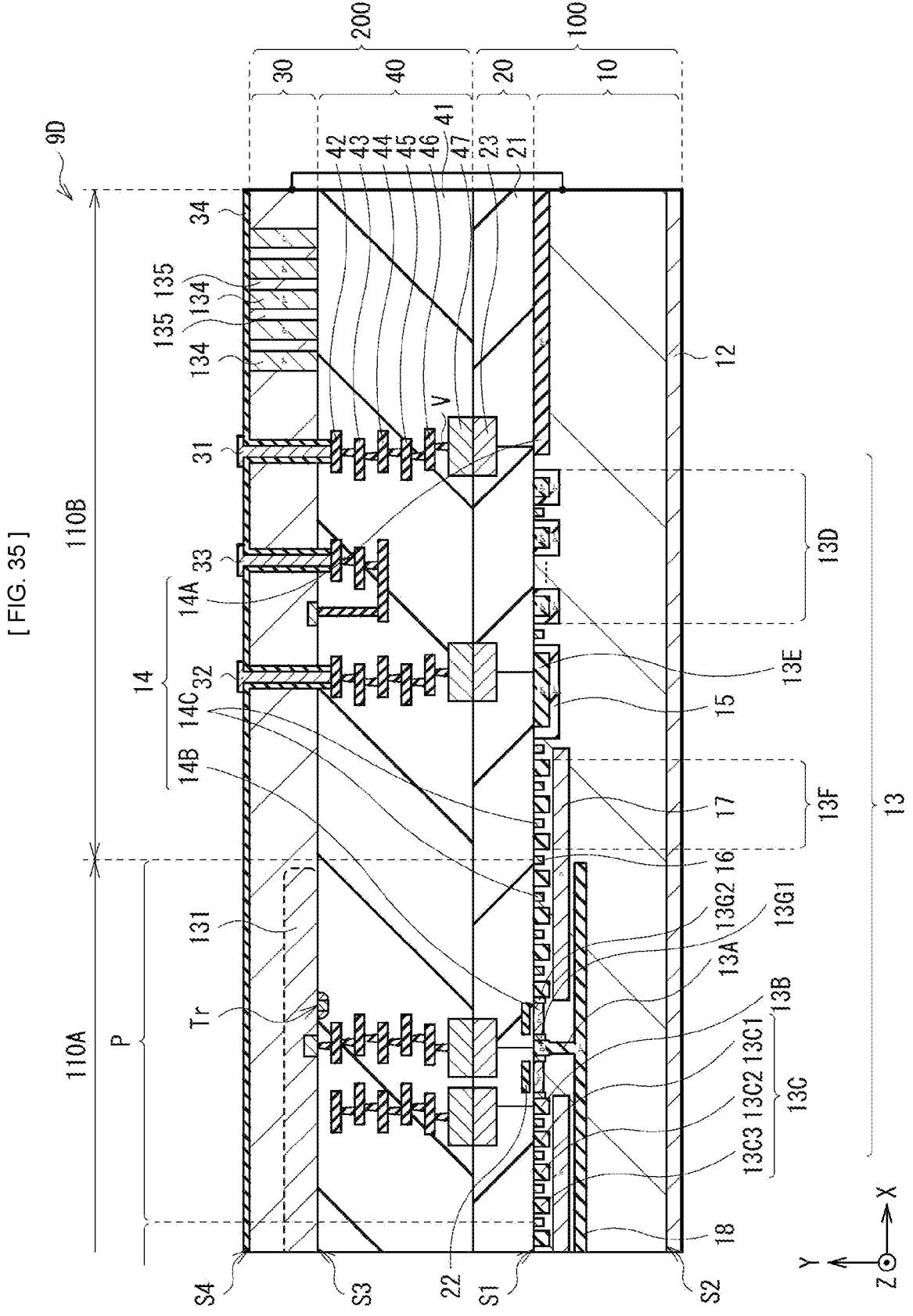

[ FIG. 36 ]
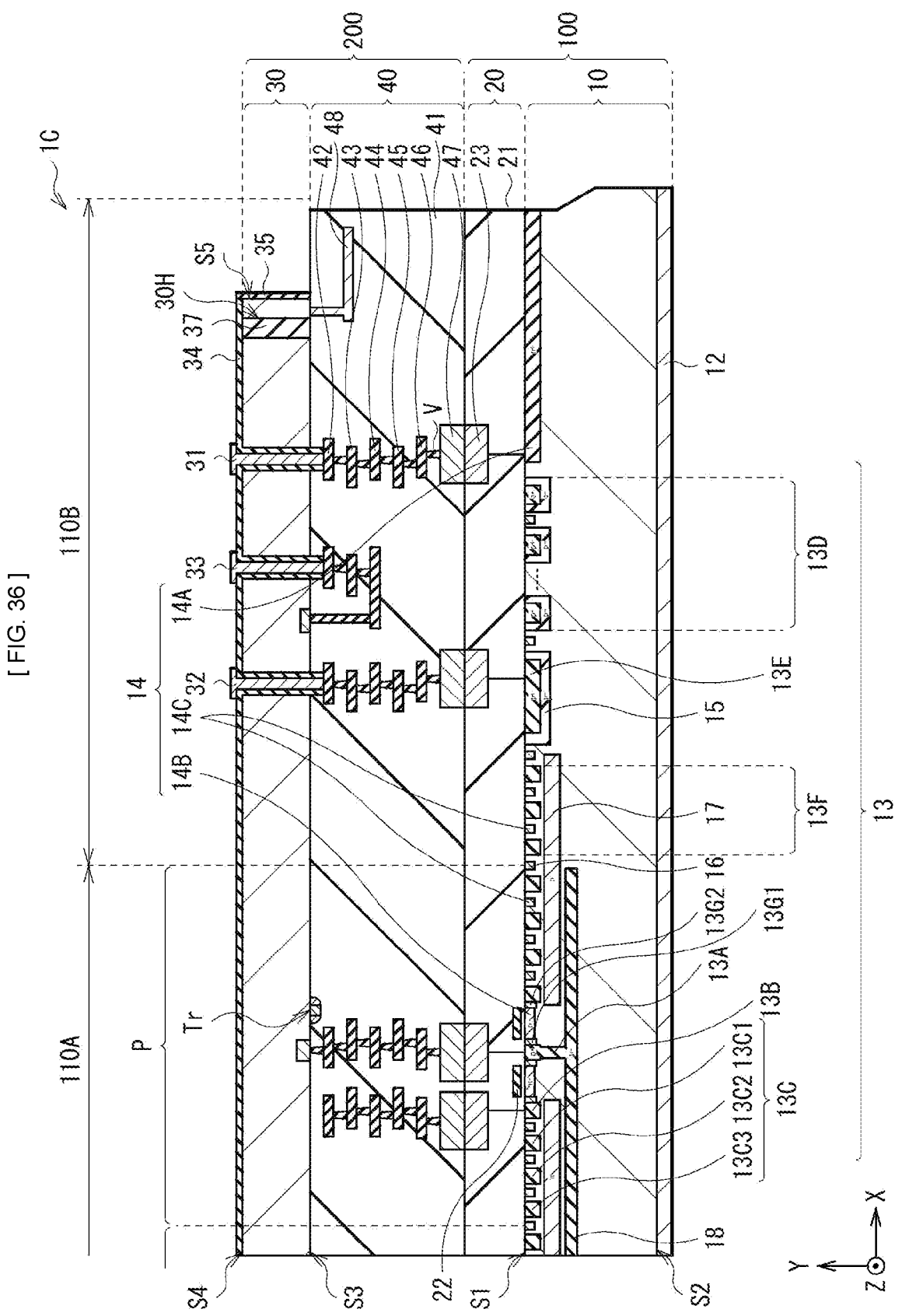

[FIG. 37]
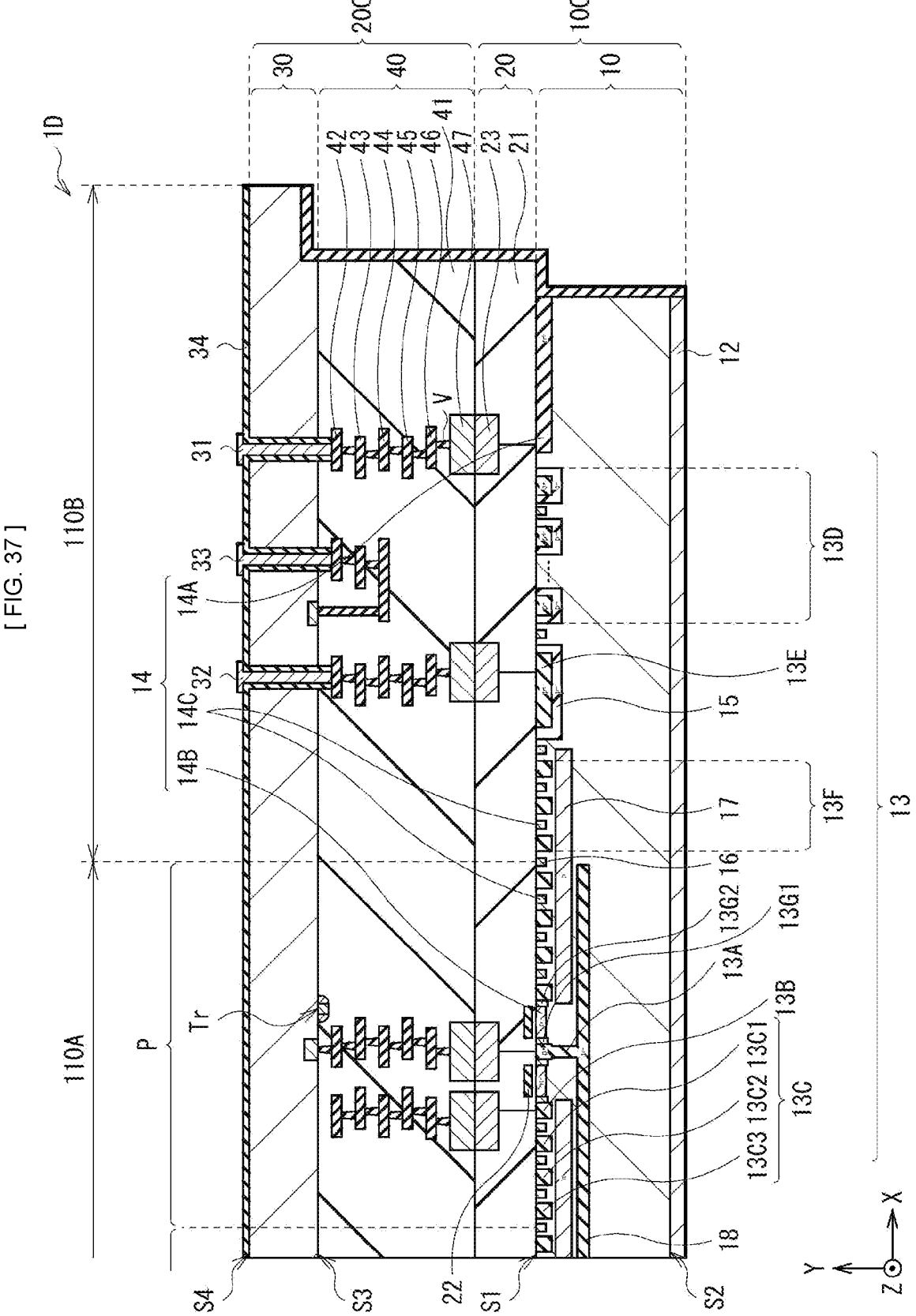

[ FIG. 38 ]
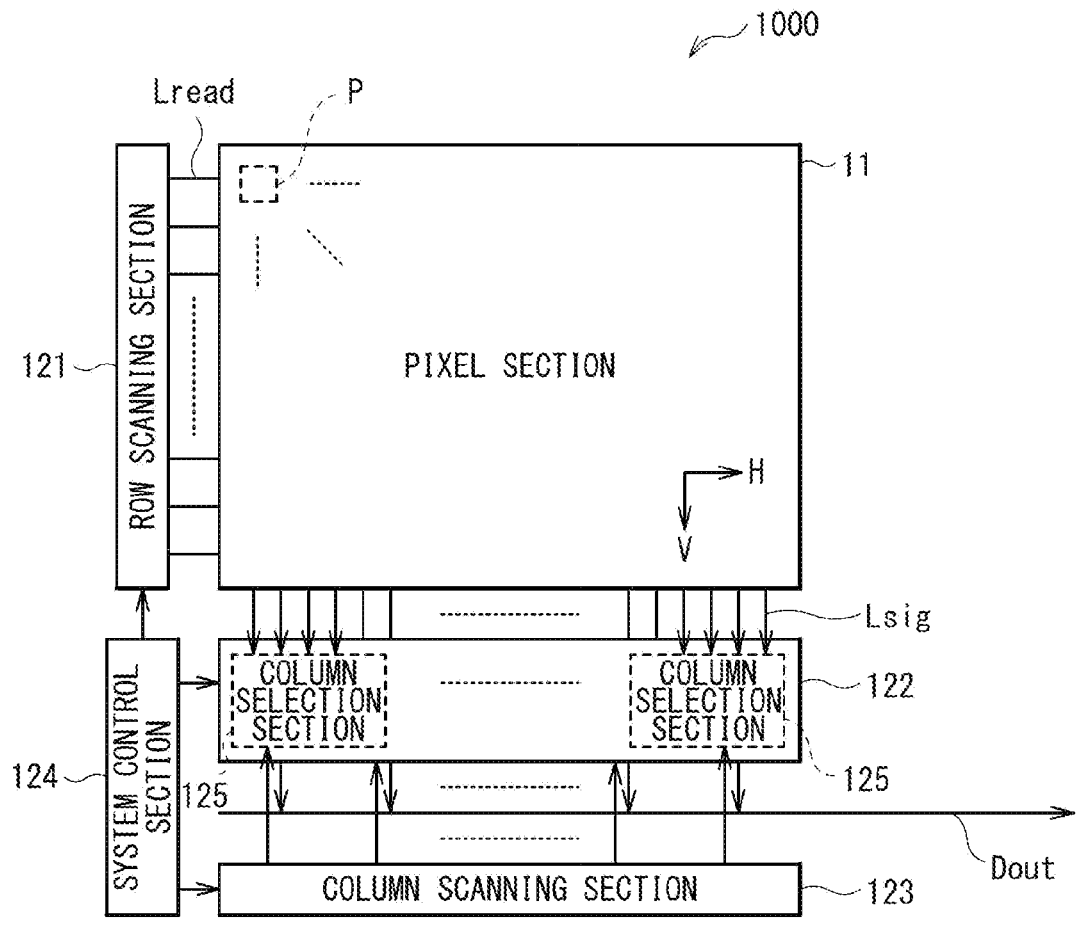

[FIG. 39]
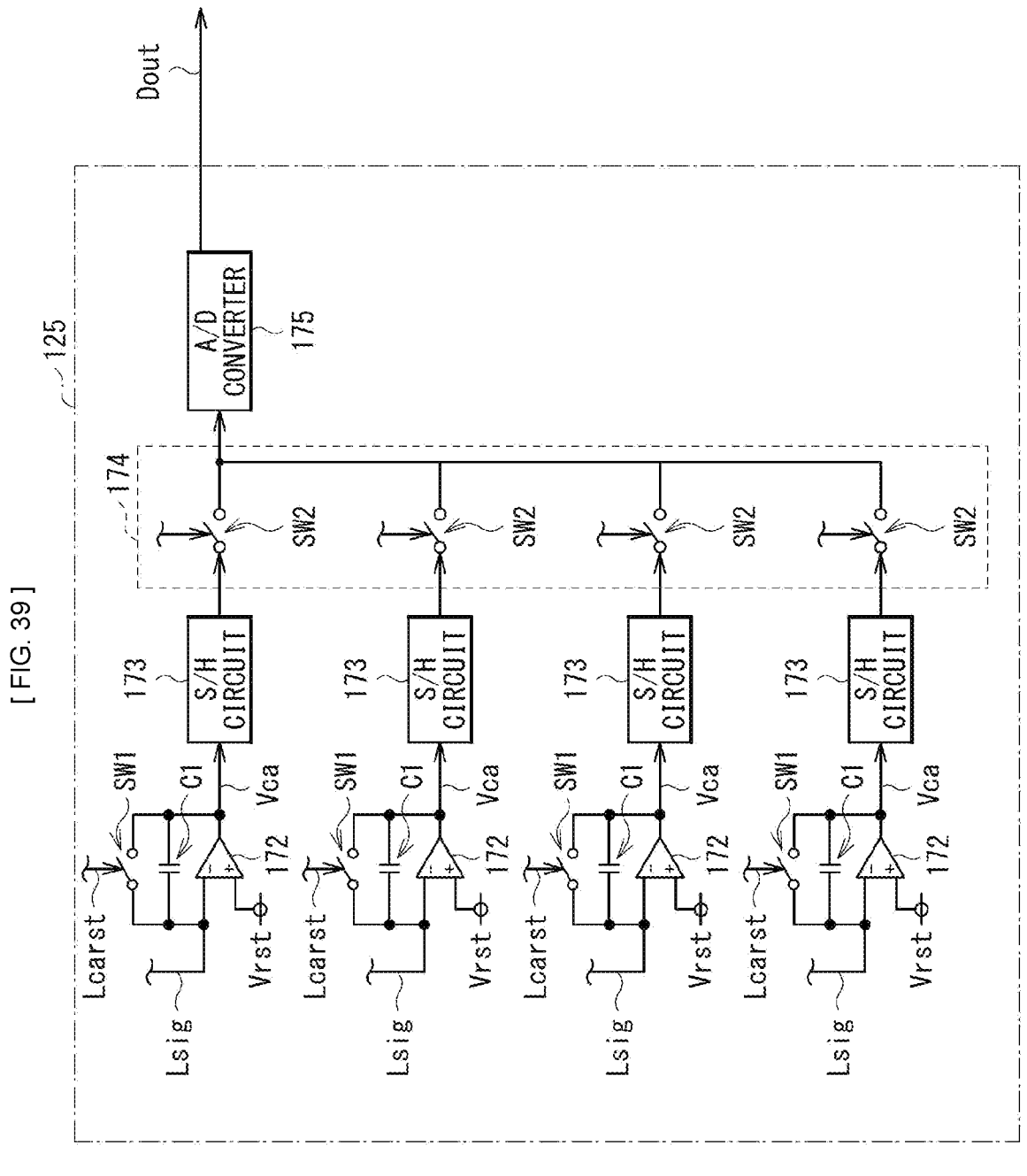

LIGHT-RECEIVING DEVICE, X-RAY IMAGING DEVICE, AND ELECTRONIC APPARATUS

CROSS REFERENCE TO RELATED APPLICATIONS

This application is a U.S. National Phase of International Patent Application No. PCT/JP2022/011758 filed on Mar. 16, 2022, which claims priority benefit of Japanese Patent Application No. JP 2021-112166 filed in the Japan Patent Office on Jul. 6, 2021. Each of the above-referenced applications is hereby incorporated herein by reference in its entirety.

TECHNICAL FIELD

The present disclosure relates to a light-receiving device, an X-ray imaging device, and an electronic apparatus that are suitable for X-ray photography for medical application or non-destructive examination, for example.

BACKGROUND ART

For the purpose of suppressing chattering of a semiconductor layer at the time of dicing and suppressing chipping of the semiconductor layer caused by the dicing, for example, PTL 1 discloses a semiconductor device in which a chip prevention member with a higher Young's modulus than a transparent resin layer is formed to be in contact with a semiconductor layer in a dicing portion in a layer structure before fragmentation.

CITATION LIST

Patent Literature

PTL 1: Japanese Unexamined Patent Application Publication No. 2014-045142

SUMMARY OF THE INVENTION

Incidentally, it is required, for a semiconductor device (light-receiving device) to be used, for example, as an X-ray imaging device in which a substrate for low-voltage driving and a substrate for high-voltage driving are attached together, to have improved discharge withstand voltage.

It is desirable to provide a light-receiving device, an X-ray imaging device, and an electronic apparatus that make it possible to improve discharge withstand voltage.

A first light-receiving device according to an embodiment of the present disclosure includes: a first semiconductor substrate having a first surface and a second surface opposed to each other and receiving application of a first potential, the first semiconductor substrate including a plurality of light-receiving elements arranged two-dimensionally in matrix; a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, and the side surface of the second semiconductor substrate is coated with a protective film.

A second light-receiving device according to an embodiment of the present disclosure includes: a first semiconductor substrate having a first surface and a second surface opposed to each other and receiving application of a first potential, the first semiconductor substrate including a plurality of light-receiving elements arranged two-dimensionally in matrix; a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, the side surface of the second semiconductor substrate is coated with a protective film, and the first semiconductor substrate and the second semiconductor substrate each have a substantially rectangular shape, and have a corner being worked into a curved shape.

A third light-receiving device according to an embodiment of the present disclosure includes: a first semiconductor substrate having a first surface and a second surface opposed to each other and receiving application of a first potential, the first semiconductor substrate including a plurality of light-receiving elements arranged two-dimensionally in matrix; a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, the side surface of the second semiconductor substrate is coated with a protective film, and the interlayer insulating layer includes a metal film to which a predetermined potential is applied in the layer, the metal film protruding more outward than the side surface of the second semiconductor substrate.

A fourth light-receiving device according to an embodiment of the present disclosure includes: a first semiconductor substrate having a first surface and a second surface opposed to each other and receiving application of a first potential, the first semiconductor substrate including a light-receiving region in which a plurality of light-receiving elements are arranged two-dimensionally in matrix and a peripheral region provided around the light-receiving region; a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; a first first electrically-conductive region provided at an interface of the first surface of the first semiconductor substrate for each of the light-receiving elements and coupled to a first electrode, in the light-receiving region; a second first electrically-conductive region each provided around the first first electrically-conductive region provided for each of the light-receiving elements and coupled to a second electrode, at the interface of the first surface; a third first electrically-conductive region each provided around the second first electrically-conductive region provided for each of the light-receiving elements and being in an electrically floating state, at the interface of the first surface; a fourth first electrically-conductive region provided at the interface of the first surface, the fourth first electrically-conductive region extending to a side surface of the first semiconductor substrate and being in an electrically floating state; a first second electrically-conductive region provided at an interface of the second surface and having an electrically-conductive type different from the first electrically-conductive region; and a plurality of fifth first electrically-conductive regions provided in a ring shape outside the first second electrically-conductive region at the interface of the second surface, the fifth first electrically-conductive regions being in an electrically floating state.

A fifth light-receiving device according to an embodiment of the present disclosure includes: a first semiconductor substrate having a first surface and a second surface opposed to each other and receiving application of a first potential, the first semiconductor substrate including a plurality of light-receiving elements arranged two-dimensionally in matrix; a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, the second semiconductor substrate including a logic circuit that processes a light-receiving signal based on electric charge outputted from the plurality of light-receiving elements, and a plurality of sixth first electrically-conductive regions provided in a ring shape at an interface of the third surface near a peripheral edge part and being in an electrically floating state; and an interlayer insulating layer provided between the first semiconductor substrate and the second semiconductor substrate.

An X-ray imaging device according to an embodiment of the present disclosure includes the first light-receiving device according to the embodiment of the present disclosure including the plurality of light-receiving elements generating signal charge based on an X-ray.

An electronic apparatus according to an embodiment of the present disclosure includes the X-ray imaging device according to the embodiment of the present disclosure.

In the first to third light-receiving devices according to the embodiments of the present disclosure, the X-ray imaging device according to the embodiment of the present disclosure, and the electronic apparatus according to the embodiment of the present disclosure, among the first semiconductor substrate and the second semiconductor substrate that are stacked with the interlayer insulating layer disposed therebetween and receive application of potentials different from each other, the side surface of the second semiconductor substrate including the logic circuit is recessed more inward than the side surface of the first semiconductor substrate, and the protective film is formed on the side surface of the second semiconductor substrate. In the fourth light-receiving device according to the embodiment of the present disclosure, the fourth first electrically-conductive region in an electrically floating state is provided that extends to the side surface and at the interface of the first surface of the first semiconductor substrate, and the plurality of fifth first electrically-conductive regions in an electrically floating state is further provided in a ring shape outside the first second electrically-conductive region provided at the interface of the second surface of the first semiconductor substrate. In the fifth light-receiving device of the embodiment of the present disclosure, the plurality of sixth first electrically-conductive regions in an electrically floating state is provided in a ring shape at the interface of the third surface near the peripheral edge part of the second semiconductor substrate opposed to the first surface of the first semiconductor substrate. This reduces generation of creeping discharge. This also reduces the probability of electron release from the end of the second semiconductor substrate.

BRIEF DESCRIPTION OF THE DRAWINGS

FIG. 1 is a schematic cross-sectional view of an example of a configuration of a light-receiving device according to a first embodiment of the present disclosure.

FIG. 2 is a schematic plan view of an overall configuration of the light-receiving device illustrated in FIG. 1.

FIG. 3 is a schematic plan view of an overall configuration of a sensor substrate of the light-receiving device illustrated in FIG. 1.

FIG. 4 is a schematic plan view of an example of a pattern of each electrically-conductive region on a front surface of a semiconductor substrate of a light-receiving element illustrated in FIG. 1.

FIG. 5A is an explanatory schematic cross-sectional view of a step of dicing of the light-receiving device illustrated in FIG. 1.

FIG. 5B is a schematic cross-sectional view of a step subsequent to FIG. 5A.

FIG. 5C is a schematic cross-sectional view of a step subsequent to FIG. 5B.

FIG. 5D is a schematic cross-sectional view of a step subsequent to FIG. 5C.

FIG. 5E is a schematic cross-sectional view of a step subsequent to FIG. 5D.

FIG. 6 is a schematic cross-sectional view of an example of a configuration of a light-receiving device according to Modification Example 1 of the present disclosure.

FIG. 7 is a schematic cross-sectional view of another example of the configuration of the light-receiving device according to Modification Example 1 of the present disclosure.

FIG. 8 is a schematic cross-sectional view of an example of a configuration of a light-receiving device according to a second embodiment of the present disclosure.

FIG. 9 is a schematic cross-sectional view of an example of a configuration of a light-receiving device according to Modification Example 2 of the present disclosure.

FIG. 10 is a schematic cross-sectional view of an example of a configuration of a light-receiving device according to a third embodiment of the present disclosure.

FIG. 11A is a schematic cross-sectional view of an example of a configuration of a light-receiving device according to Modification Example 3 of the present disclosure.

FIG. 11B is a schematic cross-sectional view of another example of the configuration of the light-receiving device according to Modification Example 3 of the present disclosure.

FIG. 12 is a schematic cross-sectional view of an example of a configuration of a light-receiving device according to Modification Example 4 of the present disclosure.

FIG. 13 is a schematic cross-sectional view of another example of the configuration of the light-receiving device according to Modification Example 4 of the present disclosure.

FIG. 14 is a schematic cross-sectional view of an example of a configuration of a light-receiving device according to a fourth embodiment of the present disclosure.

FIG. 15 is a schematic cross-sectional view of an example of a configuration of a light-receiving device according to Modification Example 5 of the present disclosure.

FIG. 16 is a schematic cross-sectional view of another example of a configuration of a light-receiving device according to Modification Example 6 of the present disclosure.

FIG. 17 is a schematic cross-sectional view of an example of a configuration of a light-receiving device according to a fifth embodiment of the present disclosure.

FIG. 18 is a schematic cross-sectional view of an example of a configuration of a light-receiving device according to Modification Example 7 of the present disclosure.

FIG. 19 is a schematic cross-sectional view of another example of the configuration of the light-receiving device according to Modification Example 7 of the present disclosure.

FIG. 20 is a schematic cross-sectional view of an example of a configuration of a light-receiving device according to a sixth embodiment of the present disclosure.

FIG. 21 is a schematic cross-sectional view of an example of a configuration of a light-receiving device according to Modification Example 8 of the present disclosure.

FIG. 22 is a schematic cross-sectional view of another example of the configuration of the light-receiving device according to Modification Example 8 of the present disclosure.

FIG. 23 is a schematic cross-sectional view of an example of a configuration of a light-receiving device according to a seventh embodiment of the present disclosure.

FIG. 24A is a schematic cross-sectional view of an example of a configuration of a light-receiving device according to Modification Example 9 of the present disclosure.

FIG. 24B is a schematic cross-sectional view of another example of the configuration of the light-receiving device according to Modification Example 9 of the present disclosure.

FIG. 25A is a schematic plan view of an example of a configuration of a main part of a light-receiving device according to Modification Example 10 of the present disclosure.

FIG. 25B is a schematic plan view of another example of the configuration of the main part of the light-receiving device according to Modification Example 10 of the present disclosure.

FIG. 26A is a schematic plan view of another example of the configuration of the main part of the light-receiving device according to Modification Example 10 of the present disclosure.

FIG. 26B is a schematic plan view of another example of the configuration of the main part of the light-receiving device according to Modification Example 10 of the present disclosure.

FIG. 26C is a schematic plan view of another example of the configuration of the main part of the light-receiving device according to Modification Example 10 of the present disclosure.

FIG. 27 is a schematic cross-sectional view of an example of a configuration of a light-receiving device according to an eighth embodiment of the present disclosure.

FIG. 28 is a schematic cross-sectional view of an example of a configuration of a light-receiving device according to Modification Example 11 of the present disclosure.

FIG. 29 is a schematic cross-sectional view of an example of a configuration of a light-receiving device according to Modification Example 12 of the present disclosure.

FIG. 30A is a schematic plan view of an example of a configuration of a shield electrode of the light-receiving device according to Modification Example 12 of the present disclosure.

FIG. 30B is a schematic plan view of another example of the configuration of the shield electrode of the light-receiving device according to Modification Example 12 of the present disclosure.

FIG. 30C is a schematic plan view of another example of the configuration of the shield electrode of the light-receiving device according to Modification Example 12 of the present disclosure.

FIG. 30D is a schematic plan view of another example of the configuration of the shield electrode of the light-receiving device according to Modification Example 12 of the present disclosure.

FIG. 31 is a schematic cross-sectional view of an example of a configuration of a light-receiving device according to a ninth embodiment of the present disclosure.

FIG. 32 is a schematic cross-sectional view of an example of a configuration of a light-receiving device according to Modification Example 13 of the present disclosure.

FIG. 33 is a schematic cross-sectional view of another example of the configuration of the light-receiving device according to Modification Example 13 of the present disclosure.

FIG. 34 is a schematic cross-sectional view of another example of the configuration of the light-receiving device according to Modification Example 13 of the present disclosure.

FIG. 35 is a schematic cross-sectional view of another example of the configuration of the light-receiving device according to Modification Example 13 of the present disclosure.

FIG. 36 is a schematic cross-sectional view of an example of a configuration of a light-receiving device according to another modification example of the present disclosure.

FIG. 37 is a schematic cross-sectional view of an example of a configuration of a light-receiving device according to another modification example of the present disclosure.

FIG. 38 is a block diagram illustrating a configuration of an X-ray imaging device.

FIG. 39 is a block diagram illustrating a detailed configuration example of a column selection section illustrated in FIG. 38.

MODES FOR CARRYING OUT THE INVENTION

In the following, a description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. First Embodiment (An example of a light-receiving device in which a side surface of a logic substrate is more recessed than a side surface of a sensor substrate, and a protective film is provided on the side surface of the logic substrate)

2. Modification Example 1 (An example of a side surface being reversely tapered)

3. Second Embodiment (An example of providing a p-type electrically-conductive region on a side surface and a back surface of the sensor substrate)

4. Modification Example 2 (Another example of providing the p-type electrically-conductive region on the side surface and the back surface of the sensor substrate)

5. Third Embodiment (An example in which a side surface of an area from a logic substrate to a portion of the sensor substrate is recessed to coat the side surface with a protective film)

6. Modification Example 3 (Another example in which a side surface of an area from the logic substrate to a portion of the sensor substrate is recessed to coat the side surface with a protective film)

7. Modification Example 4 (An example in which a side surface of the sensor substrate is further recessed)

8. Fourth Embodiment (An example in which a side surface of a recessed logic substrate is coated with an organic film)

9. Modification Example 5 (An example in which a side surface of an interlayer insulating layer and the sensor substrate are coated with an organic film)

10. Modification Example 6 (An example in which a side surface of an area from the logic substrate to a portion of the sensor substrate is recessed to coat the side surface with an organic film)

11. Fifth Embodiment (An example of providing a groove in which an insulating film is embedded at a peripheral edge of the logic substrate)

12. Modification Example 7 (Another example of providing the groove in which the insulating film is embedded at the peripheral edge of the logic substrate)

13. Sixth Embodiment (An example of providing a groove at the peripheral edge of the logic substrate)

14. Modification Example 8 (An example of providing a groove at the peripheral edge of the logic substrate)

15. Seventh Embodiment (An example in which an SOI substrate is used for the logic substrate to provide an insulating film at an outer edge of the substrate on a side of the sensor substrate)

16. Modification Example 9 (An example in which an SOI substrate is used for the logic substrate to provide a plurality of grooves continuous at the peripheral edge of the substrate on the side of the sensor substrate, with an insulating film embedded in the grooves)

17. Modification Example 10 (An example of providing a cutout at a corner of the sensor substrate having a substantially rectangular shape)

18. Eighth Embodiment (An example of providing a shield electrode at a peripheral edge part of the interlayer insulating layer)

19. Modification Example 11 (Another example of providing the shield electrode at the peripheral edge part of the interlayer insulating layer)

20. Modification Example 12 (Another example of providing the shield electrode at the peripheral edge part of the interlayer insulating layer)

21. Ninth Embodiment (An example of providing a guard ring at an interface of a front surface of the logic substrate)

22. Modification Example 13 (Another example of providing the guard ring at the interface of the front surface of the logic substrate)

23. Another Modification Example

24. Application Example

1. First Embodiment

FIG. 1 schematically illustrates an example of a cross-sectional configuration of a light-receiving device (a light-receiving device 1) according to a first embodiment of the present disclosure. FIG. 2 schematically illustrates a planar configuration of the entirety of the light-receiving device 1 illustrated in FIG. 1, and FIG. 3 schematically illustrates a planar configuration of the entirety of a sensor substrate 100 described later. FIG. 1 illustrates a cross-section of the light-receiving device 1 along a line I-I illustrated in FIGS. 2 and 3. The light-receiving device 1 is adaptable, for example, to an electromagnetic wave detector or a radiation imaging device (e.g., an X-ray imaging device 1000; see FIG. 38) to read information on a subject (to capture an image of a subject) on the basis of a radioactive ray (e.g., $\alpha$-ray, $\beta$-ray, $\gamma$-ray, and X-ray, etc.).

[Configuration of Light-Receiving Device]

The light-receiving device 1 is, for example, a light-receiving device having a three-dimensional structure configured by attaching two substrates (the sensor substrate 100 and a logic substrate 200) together. The sensor substrate 100 includes a semiconductor substrate 10 and a wiring layer 20. The logic substrate 200 includes a semiconductor substrate 30 and a wiring layer 40. Here, for the sake of convenience, wiring lines combined with interlayer insulating layers therearound included in respective substrates of the sensor substrate 100 and the logic substrate 200 are called the wiring layers 20 and 40 provided in the respective substrates (the sensor substrate 100 and the logic substrate 200). The semiconductor substrate 10 corresponds to a specific example of a "first semiconductor substrate" of the present disclosure, and the semiconductor substrate 30 corresponds to a specific example of a "second semiconductor substrate" of the present disclosure. The wiring layers 20 and 40 correspond to a specific example of an "interlayer insulating layer" of the present disclosure.

The semiconductor substrate 10 includes a light-receiving region 110A and a peripheral region 110B provided around the light-receiving region 110A. In the light-receiving region 110A, light-receiving elements, each of which serves as one pixel (a unit pixel P), are arranged two-dimensionally in a row direction and a column direction. The light-receiving elements each include a PIN (Positive Intrinsic Negative) type photodiode that applies a reverse bias between a front surface S1 (first surface) and a back surface S2 (second surface) which are opposed to each other. The wiring layer 20 is provided on the side of the front surface S1 of the semiconductor substrate 10. The semiconductor substrate 30 has a front surface S3 (third surface) and a back surface (fourth surface) opposed to each other, and the front surface S3 is disposed to be opposed to the front surface S1 of the semiconductor substrate 10. A logic circuit or the like to process a light-receiving signal based on electric charge outputted from the unit pixel P is provided on the front surface S3 of the semiconductor substrate 30. The wiring layer 40 is provided on a side of the front surface S3 of the semiconductor substrate 30. That is, in the light-receiving device 1 in which the sensor substrate 100 and the logic substrate 200 are stacked, the semiconductor substrate 10, the wiring layer 20, the wiring layer 40, and the semiconductor substrate 30 are arranged in this order in a stacking direction (a Y-axis direction). The sensor substrate 100 and the logic substrate 200 receive applications of potentials largely different from each other. Specifically, the sensor substrate 100 receives application of a high voltage (first potential) of, for example, 100 V to 1000 V to drive a light-receiving element, whereas the logic substrate 200 receives application of a low voltage (second potential) of, for example, 1 V to 5 V to drive a logic circuit or the like. In the light-receiving device 1 of the present embodiment, a side surface S5 of the semiconductor substrate 30 constituting the logic substrate 200 is recessed more inward than side surfaces of the semiconductor substrate 10 and the wiring layer 20 constituting the sensor substrate 100 and the wiring layer 40 constituting the logic substrate 200, and the side surface S5 is coated with a protective film 35.

It is to be noted that, in the present embodiment, a description is given of a case where holes, of excitons (electron/hole pairs) generated by photoelectric conversion, are read as signal charge. In addition, in the drawings, "–(minus)" attached to "p" and "n" indicates that a p-type or n-type impurity has a low concentration, and "+(plus)" indicates that the p-type or n-type impurity has a high concentration. The magnitude relationships among concentrations of the p-type and n-type impurities are p"<p<p+ and n⁻<n<n+, respectively.

[Configuration of Sensor Substrate]

The sensor substrate 100 includes the semiconductor substrate 10 having a pair of the front surface S1 and the back surface S2 opposed to each other, and the wiring layer 20 provided on the side of the front surface S1 of the semiconductor substrate 10. As described above, the sensor substrate 100 includes the light-receiving region 110A in which a plurality of unit pixels P are two-dimensionally arranged in matrix, and the peripheral region 110B provided there004around.

The semiconductor substrate 10 is configured by, for example, an n-type, p-type, or i-type (intrinsic semiconductor) semiconductor, and includes, therein, a p-i-n junction or a p-n junction to serve as a photoelectric conversion region. In the present embodiment, an n-type semiconductor substrate is used as the semiconductor substrate 10, and a p-type electrically-conductive region 13 (first electrically-conductive region) and an n-type electrically-conductive region 14 (second electrically-conductive region) are partially formed at an interface of the front surface S1. An n-type electrically-conductive layer (second electrically-conductive layer) 12 is formed at an interface of the back surface S2 opposed to the front surface S1. A film thickness (hereinafter, simply referred to as a "thickness") of the semiconductor substrate 10 in the stacking direction (Y-axis direction) is, for example, 10 μm or more and 700 μm or less.

As the semiconductor substrate 10, for example, a silicon substrate is used, but this is not limitative. As the semiconductor substrate 10, for example, there may be used a substrate including germanium (Ge), gallium arsenide (GaAs), indium gallium arsenide (InGaAs), zinc selenium (ZnSe), gallium nitride (GaN), indium gallium nitride (InGaN), or the like.

The p-type electrically-conductive region 13 is a region (p-type impurity region) in which p-type impurities are dispersed, and a plurality of p-type electrically-conductive regions 13 is formed at the interface of the front surface S1 of the semiconductor substrate 10. Specifically, the p-type electrically-conductive region 13 includes six regions of a region constituting an anode 13A, a region constituting a drain 13B, a region constituting a guard ring 13C, a region constituting a high-voltage guard ring 13D, a region constituting a charge collection ring (CCR) 13E, and a region constituting a pixel edge guard ring 13F; the regions are spaced apart from each other. The anode 13A, the drain 13B, and the guard ring 13C are provided in the light-receiving region 110A, for example, for each unit pixel P. The high-voltage guard ring 13D, the CCR 13E, and the pixel edge guard ring 13F are provided in a ring shape in the peripheral region 110B to surround the light-receiving region 110A, as illustrated in FIG. 3.

The n-type electrically-conductive region 14 is a region in which n-type impurities are diffused (n-type impurity region), and a plurality of n-type electrically-conductive regions 14 is formed at the interface of the front surface S1 of the semiconductor substrate 10. Specifically, the n-type electrically-conductive region 14 includes a region constituting a cathode 14A and one or a plurality of n-type electrically-conductive regions 14B and 14C, with the regions being spaced apart from each other. As illustrated in FIG. 3, the cathode 14A is provided in a ring shape on the outermost periphery of the peripheral region 110B to surround the high-voltage guard ring 13D, the CCR 13E, and the pixel edge guard ring 13F together with the light-receiving region 110A. The n-type electrically-conductive region 14B is provided around the anode 13A. The n-type electrically-conductive region 14C is provided between the plurality of p-type electrically-conductive regions provided at the interface of the front surface S1 of the semiconductor substrate 10.

The wiring layer 20 includes, for example, an insulating layer 21, a gate electrode 22 provided in the insulating layer 21, and one or a plurality of wiring lines. The wiring layer 20 further includes a plurality of pad electrodes 23. Each of the pad electrodes 23 is embedded and formed in the insulating layer 21, and a surface thereof is exposed to a surface of the insulating layer 21 facing the logic substrate 200. Each of the pad electrodes 23 is used to electrically couple the sensor substrate 100 and the logic substrate 200 to each other, and to attach the sensor substrate 100 and the logic substrate 200 to each other.

[Configuration of Unit Pixel]

Each unit pixel P is provided with a light-receiving element including a PIN type photodiode that applies a reverse bias, as described above. As illustrated in FIG. 4, for example, the unit pixel P (light-receiving element) includes the anode 13A, the drain 13B, and a plurality of guard rings 13C (13C1, 13C2, and 13C3) at the interface of the front surface S1 of the semiconductor substrate 10. The n-type electrically-conductive region 14B is provided at the interface of the front surface S1 of the semiconductor substrate 10 between the anode 13A and the drain 13B, and p-type impurity regions having concentrations lower than those of the anode 13A and the drain 13B are provided between the anode 13A and the drain 13B in a manner adjacent to the anode 13A and the drain 13B, respectively. For the sake of convenience, the p-type impurity region having a low concentration between the anode 13A and the n-type electrically-conductive region 14B is referred to as Lightly Doped Anode (LDA) 13G1, and the p-type impurity region having a low concentration between the drain 13B and the n-type electrically-conductive region 143B is referred to as Lightly Doped Drain (LDD) 13G2. The n-type electrically-conductive region 14C is provided at the interface of the front surface S1 of the semiconductor substrate 10 between the plurality of guard rings 13C1, 13C2, and 13C3. An embedded layer 17 including an n-type impurity diffusion layer and a barrier layer 18 including a p-type impurity diffusion layer are formed inside the semiconductor substrate 10. The unit pixel P is further provided with a gate electrode 22 in the insulating layer 21 between the anode 13A and the drain 13B.

The anode 13A is a p-type impurity region including p-type impurities at a concentration of $1e^{18}$ cm$^{-3}$ to $1e^{21}$ cm$^{-3}$, for example, and corresponds to a specific example of a "first first electrically-conductive region" of the present disclosure. The anode 13A receives application of a voltage to read holes (h+) as signal charge, for example, among carriers generated by photoelectric conversion. For example, the anode 13A is individually formed at substantially the middle of the unit pixel P. The planar shape of the anode 13A is not particularly limited, and may be a circular shape or a polygonal shape. For example, the anode 13A partially protrudes to a side of the back surface S2 from a bottom surface of the embedded layer 17 described later. A size of the anode 13A is, for example, 0.1 μm or more and 10 μm or less in a case where the pitch of the unit pixel P is 10 μm or more and 100 μm or less, for example, depending on a size of the unit pixel P.

The drain 13B is a p-type impurity region including p-type impurities at a concentration of $1e^{18}$ cm$^{-3}$ to $1e^{21}$ cm$^{-3}$, for example, and corresponds to a specific example of a "second first electrically-conductive region" of the present disclosure. The drain 13B receives application of a voltage to discharge a dark current generated at the interface of the front surface S1 of the semiconductor substrate 10 upon X-ray irradiation, for example. The drain 13B is formed in a ring shape around the anode 13A, and the dark current generated due to X-ray irradiation at the interface of the front surface S1 of the semiconductor substrate 10 is constantly discharged from the drain 13B. This makes it possible to prevent the dark current from flowing into the anode 13A. A planar shape of the drain 13B is not particularly limited, and may be an annular shape or a polygonal shape.

The guard ring 13C is a p-type impurity region including p-type impurities at a concentration of $1e^{18}$ cm$^{-3}$ to $1e^{21}$ cm$^{-3}$, for example, and corresponds to a specific example of a "third first electrically-conductive region" of the present disclosure. The guard ring 13C is provided to generate a horizontal electric field that alleviates the concentration of an electric field on the drain 13B and simultaneously assists transfer of signal charge (holes) in a horizontal direction (e.g., X-Z plane direction). The guard ring 13C is formed in a ring shape around the drain 13B to surround the anode 13A and the drain 13B. Unlike the anode 13A and drain 13B, the guard ring 13C is in an electrically floating state. For example, a plurality of guard rings 13C is formed at the interface of the front surface S1 of the semiconductor substrate 10 substantially concentrically or substantially concentrically and polygonally about the anode 13A, for example. Specifically, as illustrated in FIGS. 1 and 4, the guard ring 13C includes, for example, three p-type electrically-conductive regions, and is formed triply (guard rings 13C1, 13C2, and 13C3) around the drain 13B. In this manner, providing the plurality of guard rings 13C enables the concentrated electric field to be distributed to a plurality of locations and at the same time to generate the horizontal electric field in a wide region.

In a case where the drain 13B and the guard ring 13C are formed to have a polygonal shape (e.g., a rectangular shape), the corners are preferably formed to have a curved shape, as illustrated in FIG. 4. This allows the concentration of the electric field at the corners to be alleviated. In addition, although FIG. 4 exemplifies the drain 13B and the guard ring 13C being continuously provided around the anode 13A, this is not limitative. For example, a portion thereof may be cut, or, alternatively, they may be formed intermittently.

A linewidth of a ring constituting the drain 13B and the guard ring 13C is, for example, 0.100 μm or more and 10 μm or less. An interval between the drain 13B and the guard ring 13C is, for example, 0.100 μm or more and 10 μm or less. It is to be noted that the linewidths of the drain 13B and the guard ring 13C are not necessarily constant.

The n-type electrically-conductive layer 12 is a layer including n-type impurities at a concentration of $1e^{18}$ cm$^{-3}$ to $1e^{21}$ cm$^{-3}$, for example, at the interface of the back surface S2 of the semiconductor substrate 10, and corresponds to a "first second electrically-conductive region" of the present disclosure. The n-type electrically-conductive layer 12 receives application of a power supply voltage from the cathode 14A provided at the interface of the front surface S1 of the semiconductor substrate 10 via a neutral region formed outside a depletion region formed in the semiconductor substrate 10, for example. Thus, in a case where, holes, for example, among carriers generated by photoelectric conversion, are read as signal charge through the anode 13A, electrons (e-) are discharged from the cathode 14A through the n-type electrically-conductive layer 12. As for a thickness, for example, the n-type electrically-conductive layer 12 is formed at a thickness of 1 μm, for example, from the interface of the back surface S2 of the semiconductor substrate 10, for example, in a case where the pitch of the unit pixel P is 10 μm or more and 100 μm or less, depending on the configuration of the unit pixel P.

It is to be noted that a method of applying a power supply voltage to the n-type electrically-conductive layer 12 is not limited to those described above. For example, as in a light-receiving device 2 according to a second embodiment described later, a transparent electrode (unillustrated) may be formed on the n-type electrically-conductive layer 12 to apply a power supply voltage from the side of the back surface S2 of the semiconductor substrate 10.

The n-type electrically-conductive region 14B is provided near the interface of the front surface S1 of the semiconductor substrate 10 between the anode 13A and the drain 13B. The n-type electrically-conductive region 14B includes n-type impurities at a concentration of $1e^{16}$ cm$^{-3}$ to $1e^{19}$ cm$^{-3}$, for example. As for a thickness, for example, the n-type electrically-conductive region 14B is formed at a thickness of 0.1 μm to 3 μm, for example, from the interface of the front surface S1 of the semiconductor substrate 10, for example, in a case where the pitch of the unit pixel P is 10 μm or more and 100 μm or less, depending on the configuration of the unit pixel P.

The n-type electrically-conductive region 14C is provided at the interface of the front surface S1 of the semiconductor substrate 10 between the drain 13B and the guard ring 13C1 and between the guard rings 13C1, 13C2, and 13C3 adjacent to each other. The n-type electrically-conductive region 14C includes n-type impurities at a concentration of $1e^{16}$ cm$^{-3}$ to $1e^{19}$ cm$^{-3}$, for example. As for a thickness, for example, the n-type electrically-conductive region 14C is formed at a thickness of 0.1 μm to 3 μm, for example, from the interface of the front surface S1 of the semiconductor substrate 10, for example, in a case where the pitch of the unit pixel P is 10 μm or more and 100 μm or less, depending on the configuration of the unit pixel P.

The LDD 13G1 and the LDD 13G2 are provided at the interface of the front surface S1 of the semiconductor substrate 11, respectively, between the anode 13A and the n-type electrically-conductive region 14B and between the n-type electrically-conductive region 14B and the drain 13B. The LDD 13G1 and the LDD 13G2 each have an impurity concentration that is lower than the impurity concentration of the p-type electrically-conductive region 13 constituting the anode 13A, the drain 13B, and the guard ring 13C. The impurity concentration of the LDD 13G1 and the LDD 13G2 is, for example, such a concentration that allows for depletion by a fixed electric charge (holes) generated at the interface of the insulating layer 21 with respect to the front surface S1 of the semiconductor substrate 11 due to X-ray radiation. Specifically, the impurity concentration of the LDD 13G1 and the LDD 13G2 is a low concentration, in which the peak concentration is $1e^{19}$ cm-3 or less, depending on an amount of X-ray irradiation, for example. As for a thickness, for example, the LDD 13G1 and the LDD 13G2 are each formed at a thickness of 0.1 μm to 3 μm, for example, from the interface of the front surface S1 of the semiconductor substrate 11, for example, in a case where the pitch of the unit pixel P is 10 μm or more and 100 μm or less, depending on the configuration of the unit pixel P.

The embedded layer 17 is provided to prevent holes (signal charge), among carriers generated in the semiconductor substrate 10 by photoelectric conversion, from being transferred to the drain 13B or the guard ring 13C. The embedded layer 17 is configured by an n-type impurity diffusion layer including n-type impurities, which have a higher concentration than that of the n-type semiconductor substrate 10, at a concentration of $1e^{14}$ cm$^{-3}$ to $1e^{17}$ cm$^{-3}$, for example, inside the semiconductor substrate 10, specifically, near the p-type electrically-conductive region 13. More particularly, the embedded layer 17 is provided in a region corresponding to the drain 13B and the guard ring 13C, and has an opening in a region facing the anode 13A. This allows signal charge generated in the semiconductor substrate 11 to be efficiently read from the anode 13A. It is to be noted that the embedded layer 17 is formed not to be in direct contact with the drain 13B and the guard ring 13C. The embedded layer 17 is disposed at a position which is distant, by 1 μm or more and 10 μm or less, from the front surface S1 of the semiconductor substrate 11, for example.

A barrier layer 18 is provided to prevent signal charge from being lost from the guard ring 13C to the drain 13B. The barrier layer 18 is formed inside the semiconductor substrate 11 at a position facing the embedded layer 17 on a side closer to the back surface S2 than the embedded layer 17. The barrier layer 18 is formed to extend across the plurality of unit pixels P, for example, and is in contact with the anode 13A at the center of the unit pixel P, for example. The barrier layer 18 is configured by a p-type impurity diffusion layer including p-type impurities at a concentration of $1e^{14}$ cm$^{-3}$ to $1e^{17}$ cm$^{-3}$, for example. The p-type impurities have an impurity concentration equivalent to or less than an impurity concentration of the n-type electrically-conductive region that constitutes the embedded layer 17. The barrier layer 18 is formed at a position deeper than the embedded layer 17, and is disposed, for example, at a position which is distant, by 1.1 μm or more and 11 μm or less, from the front surface S1 of the semiconductor substrate 11.

The insulating layer 21 is formed using an inorganic insulating material. Examples of the inorganic insulating material include silicon oxide ($SiO_2$), silicon nitride (SiN), aluminum oxide ($Al_2O_3$), and hafnium oxide ($HfO_2$). The insulating layer 21 is formed to include at least one of these materials. In the insulating layer 21, for example, there are formed one or a plurality of wiring lines formed using a metal material, polysilicon (poly-Si), or the like.

The gate electrode 22 is provided in the insulating layer 21 between the anode 13A and the drain 13B, for example. The gate electrode 22 is provided to apply an electric field to the interface of the front surface S1 of the semiconductor substrate 10 between the anode 13A and the drain 13B. Specifically, the gate electrode 22 applies an electric field in a direction to distance holes, generated near the interface of the front surface S1 of the semiconductor substrate 10, away from the interface of the semiconductor substrate 10. More specifically, a minus (−) voltage with respect to a potential of the semiconductor substrate 10 is applied to the gate electrode 22, thereby applying an electric field of, for example, 0.5 MV/cm or more to the interface of the front surface S1 of the semiconductor substrate 10. In addition, the gate electrode 22 is provided to reduce the volume of the insulating layer 21 provided on the semiconductor substrate 10 between the anode 13A and the drain 13B, for example. This reduces an increase in positive fixed electric charge generated in the insulating layer 21 near the interface of the insulating layer 21 with respect to the front surface S1 of the semiconductor substrate 10 due to X-ray irradiation as well as an increase in an interface state of the front surface S1 of the semiconductor substrate 10. For example, the gate electrode 22 is provided between the anode 13A and the drain 13B to surround the anode 13A in a plan view. The gate electrode 22 can be formed using, for example, polysilicon (poly-Si). The polysilicon constituting the gate electrode 22 may be an intrinsic semiconductor including no impurities or an impurity semiconductor including n-type or p-type impurities.

The light-receiving element can be manufactured, for example, as follows. First, the n-type electrically-conductive layer 12 is formed on the back surface S2 of the semiconductor substrate 10 using an ion implantation technique. Subsequently, a mask is formed on a predetermined region of the front surface S1 of the semiconductor substrate 10, and then p-type impurities (e.g., boron (B)) are doped using an ion implantation technique to form the p-type impurity diffusion layer (barrier layer 18). Next, n-type impurities (e.g., phosphorus (P)) are doped to form the n-type impurity diffusion layer (embedded layer 17). Subsequently, a mask is formed on a predetermined region of the front surface S1 of the semiconductor substrate 10, and then p-type impurities (e.g., boron (B)) are doped using an ion implantation technique to form the anode 13A, the drain 13B, and the guard ring 13C. Subsequently, in the same manner, a mask is formed on a predetermined region of the front surface S1 of the semiconductor substrate 10, and then n-type impurities (e.g., phosphorus (P)) or p-type impurities (e.g., boron (B) are doped using an ion implantation technique to sequentially form the n-type electrically-conductive regions 14B and 14C, and the LDD 13G1 and the LDD 13G2. Next, an insulating film (gate insulating film) is formed as the insulating layer 21 on the front surface S1 of the semiconductor substrate 10 using a CVD (Chemical Vapor Deposition) method, for example. Next, a polysilicon film is formed on the gate insulating film using a CVD method, for example, and then the polysilicon film is patterned using a photolithography method, for example, to form the gate electrode 22 between the anode 13A and the drain 13B. Thereafter, the insulating layer 21 and one or a plurality of wiring lines are sequentially formed. This completes the light-receiving element illustrated in FIG. 1.

As illustrated in FIG. 3, the peripheral region 110B is provided with the high-voltage guard ring 13D in a ring shape around the light-receiving region 110A. Outside the high-voltage guard ring 13D, the cathode 14A is provided in a ring shape around the light-receiving region 110A, in the same manner as the high-voltage guard ring 13D. Inside the high-voltage guard ring 13D, the CCR 13E is provided in a ring shape around the light-receiving region 110A, in the same manner as the high-voltage guard ring 13D. Further, inside the high-voltage guard ring 13D, specifically, between the light-receiving region 110A and the CCR 13E, the pixel edge guard ring 13F is provided in a ring shape around the light-receiving region 110A, in the same manner as the high-voltage guard ring 13D.

The high-voltage guard ring 13D is a p-type impurity region including p-type impurities at a concentration of $1e^{18}$ $cm^{-3}$ to $1e^{21}$ $cm^{-3}$, for example, and is provided to relax a high electric field formed at the front surface S1 of the semiconductor substrate 10 between the unit pixel P and the cathode 14A. The high-voltage guard ring 13D is in an electrically floating state, and a plurality of high-voltage guard rings 13D is formed along an outer shape of the light-receiving region 110A, for example, around the light-receiving region 110A. The high-voltage guard ring 13D is formed at a thickness of 0.1 μm to 3 μm, for example, from the interface of the front surface S1 of the semiconductor substrate 10.

The CCR 13E is a p-type impurity region including p-type impurities at a concentration of $1e^{18}$ $cm^{-3}$ to $1e^{21}$ $cm^{-3}$, for example. The CCR 13E is provided to prevent a dark current, which has been generated in a region from the high-voltage guard ring 13D to the cathode 14A, for example, between the front surface S1 and a back surface 11S2 of the semiconductor substrate 11, from flowing into the light-receiving region 110A. The CCR 13E is coupled to a GND 33, for example, and a fixed potential (0 V) is applied thereto. A linewidth of a ring constituting the CCR 13E is 3 μm or more, for example; as for a thickness, the CCR 13E is formed at 0.1 μm to 3 μm, for example, from the interface of the front surface S1 of the semiconductor substrate 11, for example.

The pixel edge guard ring 13F is a p-type impurity region including p-type impurities at a concentration of $1e^{18}$ $cm^{-3}$ to $1e^{21}$ $cm^{-3}$, for example. The pixel edge guard ring 13F is provided to form a potential between the light-receiving region 110A and the CCR 13E to be a mirror image of a potential between a boundary of the unit pixel P and the anode 13A. In the same manner as the high-voltage guard ring 13D, the pixel edge guard ring 13F is in an electrically floating state, and a plurality of pixel edge guard rings 13F is formed along the outer shape of the light-receiving region 110A, for example, around the light-receiving region 110A. A linewidth of a ring constituting the pixel edge guard ring 13F is 0.2 μm to 10 μm, for example; as for a thickness, the pixel edge guard ring 13F is formed at 0.1 μm to 3 μm, for example, from the interface of the front surface S1 of the semiconductor substrate 10, for example.

The cathode 14A is an n-type impurity region including n-type impurities at a concentration of $1e^{18}$ $cm^{-3}$ to $1e^{21}$ $cm^{-3}$, for example, and is provided on the outermost periphery of the peripheral region 110B, for example, to surround the periphery of the light-receiving region 110A. The cathode 14A is coupled to a VDD 34 to apply, to the n-type electrically-conductive layer 12, a voltage for discharging electrons (e−), for example, among carriers generated by photoelectric conversion. A linewidth of a ring constituting the cathode 14A is 10 μm or more, for example; as for a thickness, the cathode 14A is formed at 0.1 μm to 3 μm, for example, from the interface of the front surface S1 of the semiconductor substrate 11, for example.

Further, a p-type electrically-conductive region 15 having a lower impurity concentration, for example, may be provided around the p-type electrically-conductive region 13 constituting the high-voltage guard ring 13D and the CCR 13E. As for the impurity concentration, the p-type electrically-conductive region 15 is formed at a low concentration of $1e^{15}$ $cm^{-3}$ to $1e^{18}$ $cm^{-3}$, for example. Furthermore, although not illustrated, an n-type electrically-conductive region including n-type impurities at a concentration of $1e^{16}$ $cm^{-3}$ to $1e^{19}$ $cm^{-3}$, for example, may be formed near the interface of the front surface S1 of the semiconductor substrate 11 between the high-voltage guard rings 13D, for example.

The light-receiving device 1 basically has a mirror symmetry near a boundary between the light-receiving region 110A and the peripheral region 110B. Specifically, the layout of the n-type and p-type impurity regions formed at the interface of the front surface S1 of the semiconductor substrate 10 on a side of the peripheral region 110B from the anode 13A of the unit pixel P arranged on the outermost periphery of the light-receiving region 110A, and the layout of the n-type and p-type impurity regions formed at the interface of the front surface S1 of the semiconductor substrate 10 inside the CCR 13E (on a side of the light-receiving region 110A), etc., have a mirror symmetry.

For example, an n-type electrically-conductive region 16 is provided in a ring shape to surround the light-receiving region 110A at the interface of the front surface S1 of the semiconductor substrate 10 at the boundary between the light-receiving region 110A and the peripheral region 110B. With the n-type electrically-conductive region 16 as a symmetrical axis, pixel edge guard rings 13F1, 13F2, and 13F3 are provided in the peripheral region 110B, in the same manner as the guard rings 13C1, 13C2, and 13C3 provided in the light-receiving region 110A. Further, the n-type electrically-conductive region 14C provided between the drain 13B and the guard ring 13C1 in the light-receiving region 110A and between the pixel edge guard rings 13F1, 13F2, and 13F3 adjacent to each other is also provided between the pixel edge guard rings 13F1, 13F2, and 13F3 adjacent to each other and between the pixel edge guard ring 13F and the CCR 13E in the peripheral region 110B. Further, in a cross-sectional view, the embedded layer 17 provided in the unit pixel P on the outermost periphery in the light-receiving region 110A extends to below the pixel edge guard ring 13F. This allows potentials of the guard rings 13C1, 13C2, and 13C3 of the unit pixel P arranged on the outermost periphery of the light-receiving region 110 to be equal to potentials of the guard rings 13C1, 13C2, and 13C3 of the unit pixel P arranged inside the light-receiving region 110.

It is to be noted that, unlike the embedded layer 17, the barrier layer 18 is preferably formed up to the edge of the light-receiving region 110A, instead of being formed below the pixel edge guard ring 13F. In a case where the barrier layer 18 is extended to below the pixel edge guard ring 13F, a potential of the semiconductor substrate 10 in the peripheral region 110B does not increase until the barrier layer 18 is depleted, thus leading to a possibility that a characteristic difference may occur in the chip. In contrast, as in the present embodiment, providing a region where the barrier layer 18 is not formed below the embedded layer 17 in the peripheral region 110B allows the embedded layer 17 to undergo potential propagation by following a potential of the semiconductor substrate 11. This makes it possible to continuously increase a potential of the front surface S1 of the semiconductor substrate 11 without causing breakdown of a p-n junction between the embedded layer 17 and the barrier layer 18.

[Configuring of Logic Substrate]

The logic substrate 200 includes the semiconductor substrate 30 having a pair of the front surface S3 and a back surface S4 opposed to each other, and the wiring layer 40 provided on the side of the front surface S3 of the semiconductor substrate 30. The logic substrate 200 includes, for example, a readout circuit provided for each unit pixel P in the light-receiving region 110A and a logic circuit provided in the peripheral region 110B. The readout circuit outputs a light-receiving signal based on electric charge outputted from the anode 13A of the unit pixel P, and includes, for example, a reset transistor, a selection transistor, an amplification transistor, and the like. The logic circuit controls the unit pixel P and the readout circuit, and processes a light-receiving signal outputted from the readout circuit. The logic circuit includes, for example, a row scanning section 121, an A/D conversion section 122, a column scanning section 123, and a system control section 124 (see FIG. 38).

The semiconductor substrate 30 is configured by, for example, an n-type, p-type, or i-type (intrinsic semiconductor) semiconductor. The semiconductor substrate 30 has a thickness of 0.3 μm or more and 200 μm or less, for example. A plurality of transistors Tr constituting the readout circuit and the logic circuit is provided on the front surface S3 of the semiconductor substrate 30. A plurality of extraction electrodes 31, 32, and 33 penetrating from the front surface S3 to the back surface S4 of the semiconductor substrate 30 is further provided in the peripheral region 110B of the semiconductor substrate 30. The plurality of extraction electrodes 31, 32, and 33 applies a predetermined potential to each of the sensor substrate 100 and the logic substrate 200. For example, the extraction electrode 31 is electrically coupled to the cathode 14A, for example, to apply a voltage of 100 V to 1000 V, for example, to the cathode 14A. The extraction electrode 32 is electrically coupled to the anode 13A or the CCR 13E, for example, to apply a voltage of 0 V, for example, to the anode 13A or the CCR 13E. The extraction electrode 33 applies a voltage of 1 V to 5 V to the logic circuit, or the like. In the same manner as the insulating layer 21, for example, a protective layer 34 including an inorganic insulating material such as silicon oxide ($SiO_2$) is provided on the back surface S4 of the semiconductor substrate 30 and between the semiconductor substrate 30 and the above-described extraction electrodes 31, 32, and 33.

As illustrated in FIGS. 1 and 3, the semiconductor substrate 30 has the side surface S5 inside (on the side of the light-receiving region 110A) respective side surfaces of the semiconductor substrate 10 and the wiring layer 20 constituting the sensor substrate 100 and the wiring layer 40 constituting the logic substrate 200. In other words, the side surface S5 of the semiconductor substrate 30 is recessed more inward than the semiconductor substrate 10 and the wiring layers 20 and 40; the light-receiving device 1 has a terrace structure in which the wiring layer 40 is exposed to a peripheral edge part.

As illustrated in FIG. 2, for example, it is preferable that the semiconductor substrate 30 have a substantially rectangular shape and that corners thereof be worked into a curved shape. This alleviates the concentration of the electric field on the corner. In addition, the side surface S5 of the semiconductor substrate 30 is coated with the protective film 35. The protective film 35 is formed using an inorganic insulating material, for example. Examples of the inorganic insulating material include silicon oxide ($SiO_2$), silicon nitride (SiN), and aluminum oxide ($Al_2O_3$).

The wiring layer 40 includes, for example, an insulating layer 41 and a plurality of wiring lines 42, 43, 44, and 45 in the insulating layer 41. The wiring layer 40 further includes a plurality of pad electrodes 47. Each of the pad electrodes 47 is embedded and formed in the insulating layer 41, and a surface thereof is exposed to a surface of the insulating layer 41 facing the sensor substrate 100. Each of the pad electrodes 47 is used to electrically couple the sensor substrate 100 and the logic substrate 200 to each other and to attach the sensor substrate 100 and the logic substrate 200 to each other. That is, the sensor substrate 100 and the logic substrate 200 are electrically coupled to each other by a junction between the pad electrodes 23 and 47.

FIGS. 5A, 5B, 50, 5D, and 5E schematically illustrate dicing steps in the process of manufacturing the light-receiving device 1.

The sensor substrate 100 and the logic substrate 200 are each produced through a substrate step and a wiring step. Subsequently, as illustrated in FIG. 5A, for example, the front surface S1 of the semiconductor substrate 10 of the sensor substrate 100 and the front surface S3 of the semiconductor substrate 30 of the logic substrate 200 are disposed to be opposed to each other, and the pad electrodes 23 and 47 exposed to the surfaces of the respective wiring layers 20 and 40 are bonded together to attach the sensor substrate 100 and the logic substrate 200 to each other.

Next, the logic substrate 200 is worked using a lithographic technique. Specifically, as illustrated in FIG. 5B, a resist 51 is patterned on the logic substrate 200. Subsequently, as illustrated in FIG. 5C, an opening H is formed in the semiconductor substrate 30 by etching, and then the resist 51 is removed. Next, as illustrated in FIG. 5D, the protective film 35 is formed on a side surface and a bottom surface of the opening H, and then the protective film 35 formed on the bottom surface of the opening H is removed. Thereafter, as illustrated in FIG. 5E, dicing is performed for fragmentation. This completes the light-receiving device 1 illustrated in FIG. 1.

[Workings and Effects]

In the light-receiving device 1 of the present embodiment, among the semiconductor substrate 10 and the semiconductor substrate 30, which receive applications of largely different potentials, with the wiring layers 20 and 40 interposed therebetween, the side surface S5 of the semiconductor substrate 30 including a logic circuit is recessed more inward than the side surfaces of the semiconductor substrate 10 and the wiring layers 20 and 40, and the side surface S5 is coated with the protective film 35. This ensures a creeping distance, thus reducing generation of creeping discharge. In addition, this reduces probability of electron release from the end of the semiconductor substrate 30 on the side of the front surface S3. This is described below.

A device in which, for example, a pair of substrates are stacked with an insulating film interposed therebetween has a possibility in which components of the device may suffer damage, when applying a high voltage of several hundred V to one of the substrates, due to a phenomenon (creeping discharge) where discharge occurs along a surface of the insulating film. As for the creeping discharge, withstand voltage is limited depending on the creeping distance and potential differences between a high voltage substrate and a low voltage substrate and on the ease in electron release from the low voltage substrate to the surface of the insulating film, in particular, depending on electric field intensity near the low voltage substrate, or the like.

In contrast, in the present embodiment, the side surface S5 of the semiconductor substrate 30 constituting the logic substrate 200 is recessed more inward than the side surfaces of the semiconductor substrate 10 and the wiring layer 20 constituting the sensor substrate 100 and the wiring layer 40 constituting the logic substrate 200, and the side surface S5 is coated with the protective film 35. This allows the creeping distance to be longer than an interlayer film thickness of the wiring layer, thus reducing the probability of electron release from the end of the semiconductor substrate 30 on the side of the front surface S3.

As described above, the generation of creeping discharge is reduced in the light-receiving device 1 of the present embodiment, thus making it possible to improve discharge withstand voltage.

In addition, in a case where fragmentation of the sensor substrate 100 and the logic substrate 200 is performed using blade dicing, laser, and plasma dicing, for example, when the wiring layers 20 and 40 are diced, a wiring material (e.g., metal, Si waste, moisture, etc.) adheres to side surfaces thereof, thus leading to a possibility that a short circuit may occur between the semiconductor substrate 10 of the sensor substrate 100 and the semiconductor substrate 30 of the logic substrate 200.

In contrast, in the present embodiment, as described above, the side surface S5 of the semiconductor substrate 30 is coated with the protective film 35, thus reducing occurrence of a short circuit with respect to the semiconductor substrate 30 of the logic substrate 200. It is therefore possible to improve withstand voltages of the semiconductor substrates 10 and 30 constituting the sensor substrate 100 and the logic substrate 200, respectively.

Next, descriptions are given of second to ninth embodiments, Modification Examples 1 to 14, another modification example, and an application example of the present disclosure. Hereinafter, components similar to those of the foregoing first embodiment are denoted by the same reference numerals, and descriptions thereof are omitted as appropriate.

2. Modification Example 1

FIG. 6 schematically illustrates an example of a cross-sectional configuration of a light-receiving device (a light-receiving device 1A) according to Modification Example 1 of the present disclosure. In the same manner as the foregoing first embodiment, the light-receiving device 1A includes, for example, a PIN type photodiode that applies a reverse bias between the front surface and the back surface of the semiconductor substrate 10. The light-receiving device 1A constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 1A of the present modification example differs from the foregoing first embodiment in that the side surface S5 of the semiconductor substrate 30 on a side of the back surface S4 is inclined outward to have a so-called reverse-tapered shape.

The reverse-tapered side surface S5 as illustrated in FIG. 6 can be formed by using reactive ion etching (RIE) called deep etching, for example.

Thus, in the present modification example, the side surface S5 of the semiconductor substrate 30 recessed more inward than the side surfaces of the semiconductor substrate 10 and the wiring layers 20 and 40 has a reverse-tapered shape, thus allowing the creeping distance to be further ensured. It is therefore possible to further improve discharge withstand voltage.

Further, at the end of the side surface S5 of the semiconductor substrate 30 on the side of the front surface S3, there may be formed a notch section 30X that further recesses the semiconductor substrate 30 inward, as in a light-receiving device 1B illustrated in FIG. 7, for example. This further ensures the creeping distance while ensuring an area of the semiconductor substrate 30 on the side of the back surface S4, thus making it possible to further improve discharge withstand voltage.

3. Second Embodiment

FIG. 8 schematically illustrates an example of a cross-sectional configuration of a light-receiving device (a light-receiving device 2) according to a second embodiment of the present disclosure. In the same manner as the foregoing first embodiment, the light-receiving device 2 includes, for example, a PIN type photodiode that applies a reverse bias between the front surface and the back surface of the semiconductor substrate 10. The light-receiving device 2 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). In the light-receiving device 2 of the present embodiment, the cathode 14A is not formed, which is provided on the front surface S1 of the semiconductor substrate 10 constituting the sensor substrate 100 in the foregoing first embodiment, but a p-type electrically-conductive region 13H is formed on the outermost periphery and is extended on the side surface of the semiconductor substrate 10. In addition, the light-receiving device 2 of the present embodiment is provided with a plurality of guard rings 13I including a p-type electrically-conductive region at the outermost periphery of the back surface S2 of the semiconductor substrate 10, i.e., around the n-type electrically-conductive layer 12. The present embodiment differs from the foregoing first embodiment in these points.

The p-type electrically-conductive region 13H is a p-type impurity region including p-type impurities at a concentration of $1e^{18}$ cm$^{-3}$ to $1e^{21}$ cm$^{-3}$, for example, and corresponds to a specific example of a "fourth first electrically-conductive region" of the present disclosure. The p-type electrically-conductive region 13H reduces a potential of an outer peripheral part of the semiconductor substrate 10. As described above, the p-type electrically-conductive region 13H is formed around the pixel edge guard ring 13F, for example, at the interface of the front surface S1 of the semiconductor substrate 10, and further extends across the entire side surface of the semiconductor substrate 10 to cover the side surface thereof. As for a thickness, for example, the p-type electrically-conductive region 13H is formed at 0.3 μm to 10 μm, for example, from the interface of the front surface S1 of the semiconductor substrate 10, for example.

The guard ring 13I is a p-type impurity region including p-type impurities at a concentration of $1e^{18}$ cm$^{-3}$ to $1e^{21}$ cm$^{-3}$, for example, and corresponds to a specific example of a "fifth first electrically-conductive region" of the present disclosure. The guard ring 13I is provided to relax the electric field intensity between the n-type electrically-conductive layer 12 that receives application of a voltage of 100 V to 1000 V and the p-type electrically-conductive region 13H formed on the side surface of the semiconductor substrate 10. Similarly to the high-voltage guard ring 13D or the like, the guard ring 13I is in an electrically floating state; the plurality of guard rings 13I is formed around the n-type electrically-conductive layer 12, e.g., along the outer shape of the n-type electrically-conductive layer 12. A linewidth of a ring constituting the guard ring 13I is, for example, 0.2 μm to 10 μm. As for a thickness, for example, the guard ring 13I is formed at 0.3 μm to 10 μm, for example, from the interface of the back surface S2 of the semiconductor substrate 10.

Thus, in the present embodiment, the p-type electrically-conductive region 13H is formed at the outermost periphery of the interface of the front surface S1 of the semiconductor substrate 10, and the p-type electrically-conductive region 13H is extended across the entire side surface of the semiconductor substrate 10. In addition, in the present embodiment, the plurality of guard rings 13I including the p-type electrically-conductive region is provided around the n-type electrically-conductive layer 12 on the back surface S2 of the semiconductor substrate 10. This reduces a potential of the side surface of the semiconductor substrate 10, which is a starting point of creeping discharge, thus reducing the generation of the creeping discharge. It is therefore possible to improve discharge withstand voltage.

4. Modification Example 2

FIG. 9 schematically illustrates an example of a cross-sectional configuration of a light-receiving device (a light-receiving device 2A) according to Modification Example 2 of the present disclosure. In the same manner as the foregoing first embodiment, the light-receiving device 2A includes, for example, a PIN type photodiode that applies a reverse bias between the front surface and the back surface of the semiconductor substrate 10. The light-receiving device 2A constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 2A of the present modification example differs from the foregoing second embodiment in that the cathode 14A is left, and a plurality of guard rings 13J including a p-type electrically-conductive region is provided outside the cathode 14A, i.e., on the outermost periphery of the peripheral region 110B to surround the periphery of the cathode 14A.

The guard ring 13J is a p-type impurity region including p-type impurities at a concentration of $1e^{18}$ cm$^{-3}$ to $1e^{21}$ cm$^{-3}$, for example, and corresponds to a specific example of the "fourth first electrically-conductive region" of the present disclosure. The guard ring 13J forms a step potential between the front surface S1 and the back surface S2 of the semiconductor substrate 10 near the side surface of the semiconductor substrate 10, together with the guard ring 13I provided on the side of the back surface S2 of the semiconductor substrate 10. As described above, the guard ring 13J is formed, at the interface of the front surface S1 of the semiconductor substrate 10, around the cathode 14A to the end of the semiconductor substrate 10. As for a thickness, in the same manner as the high-voltage guard ring 13D, for example, the guard ring 13J is formed at 0.3 μm to 10 μm, for example, from the interface of the front surface S1 of the semiconductor substrate 10.

Thus, in the present modification example, in addition to the configuration of the light-receiving device 2 of the foregoing second embodiment, the cathode 14A including the n-type electrically-conductive region is formed at the interface of the front surface S1 of the semiconductor substrate 10, and the plurality of guard rings 13J including the p-type electrically-conductive region is provided to surround the periphery of the cathode 14A. This allows for formation of a step potential between the front surface S1 and the back surface S2 of the semiconductor substrate 10 near the side surface of the semiconductor substrate 10, thus reducing discharge of electric charge generated on an outer peripheral side of the light-receiving region 110A, for example, as compared with the light-receiving device 2 of the foregoing second embodiment. It is therefore possible to improve sensitivity of the unit pixel P provided on the outer peripheral side of the light-receiving region 110A, in addition to the effects of the foregoing second embodiment.

5. Third Embodiment

FIG. 10 schematically illustrates an example of a cross-sectional configuration of a light-receiving device (a light-receiving device 3) according to a third embodiment of the present disclosure. In the same manner as the foregoing first embodiment, the light-receiving device 3 includes, for example, a PIN type photodiode that applies a reverse bias between the front surface and the back surface of the semiconductor substrate 10. The light-receiving device 3 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 3 of the present embodiment differs from the foregoing first embodiment in that the wiring layers 40 and 20 and a portion of the semiconductor substrate 10 that are continuous to the side surface S5 are continuously recessed together with the side surface S5 of the semiconductor substrate 30, and the protective film 35 is extended to a recessed side surface S6 of the semiconductor substrate 10.

Thus, in the present embodiment, in the same manner as the side surface S5 of the semiconductor substrate 30, the wiring layers 40 and 20 and a portion of the semiconductor substrate 10 are recessed inward, and an area from the side surface S5 of the semiconductor substrate 30 to a portion of the recessed side surface S6 of the semiconductor substrate 10 is coated with the protective film 35. This ensures a creeping distance between the semiconductor substrate 10 that receives application of a high voltage of 100 V to 1000 V, for example, and the semiconductor substrate 30 that receives application of a low voltage of 1 V to 5 V, for example. In addition, it is possible to prevent the creeping distance from being substantially shortened due to a crack occurring in the semiconductor substrate 10 during dicing. It is therefore possible to improve discharge withstand voltage in the same manner as the foregoing first embodiment.

6. Modification Example 3

FIG. 11A schematically illustrates an example of a cross-sectional configuration of a light-receiving device (a light-receiving device 3A) according to Modification Example 3 of the present disclosure. The foregoing third embodiment exemplifies the case where the wiring layers 40 and 20 and a portion of the semiconductor substrate 10 are recessed inward together with the side surface S5 of the semiconductor substrate 30, and an area from the side surface S5 of the semiconductor substrate 30 to a portion of the recessed side surface S6 of the semiconductor substrate 10 is coated with the protective film 35. However, the protective film 35 may be extended to an exposed surface S1' of the semiconductor substrate 10, as illustrated in FIG. 11A. This makes it possible to relax the electric field in the semiconductor substrate 10 and to further ensure the creeping distance.

In addition, the protective film 35 may further coat a side surface S6' of the semiconductor substrate 10 which is not recessed, for example, as illustrated in FIG. 11B.

7. Modification Example 4

FIG. 12 schematically illustrates an example of a cross-sectional configuration of a light-receiving device (a light-receiving device 3B) according to Modification Example 4 of the present disclosure. The foregoing third embodiment exemplifies the wiring layers 40 and 20 and a portion of the semiconductor substrate 10 being recessed inward together with the side surface S5 of the semiconductor substrate 30. However, as illustrated in FIG. 12, for example, a portion of the recessed side surface S6 of the semiconductor substrate 10 may be further recessed by isotropic etching, for example, to form a notch section 10X recessed further inward than the side surface S5 of the semiconductor substrate 30. This alleviates the concentration of the electric field at the end of the semiconductor substrate 30 constituting the logic substrate 200, thus lowering the probability of electron release. This reduces the generation of creeping discharge, thus making it possible to improve discharge withstand voltage, in the same manner as the foregoing first embodiment.

In addition, as illustrated in FIG. 13, for example, the entire side surface of the semiconductor substrate 10 may be recessed more inward than the side surface S5 of the semiconductor substrate 30 and the side surfaces of the wiring layers 40 and 20 continuous to the side surface S5. The recess of the entire side surface of the semiconductor substrate 10 can be formed by using isotropic etching after fragmentation.

8. Fourth Embodiment

FIG. 14 schematically illustrates an example of a cross-sectional configuration of a light-receiving device (a light-receiving device 4) according to a fourth embodiment of the present disclosure. In the same manner as the foregoing first embodiment, the light-receiving device 4 includes, for example, a PIN type photodiode that applies a reverse bias between the front surface and the back surface of the semiconductor substrate 10. The light-receiving device 4 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 4 of the present embodiment differs from the foregoing first embodiment in that the side surface S5 of the semiconductor substrate 30 recessed more inward than the side surfaces of the semiconductor substrate 10 and the wiring layers 20 and 40 is coated with an organic film 36.

The organic film 36 is formed, for example, from the back surface S4 to the side surface S5 of the semiconductor substrate 30. It is preferable to use, as the organic film 36, an organic material which is materially stable and applicable. Examples of such an organic material include an epoxy resin, a silicon resin, a polyurethane resin, and a fluorine resin.

Thus, in the present embodiment, the side surface S5 of the semiconductor substrate 30 is coated with the organic film 36. This makes it possible to coat the side surface S5 with a thick film more easily, as compared with the case where the side surface S5 of the semiconductor substrate 30 is coated with the protective film 35 including an inorganic insulating material as in the foregoing first embodiment. This further reduces the probability of electron release from the end of the front surface S3 of the semiconductor substrate 30, thus making it possible to further improve discharge withstand voltage.

9. Modification Example 5

FIG. 15 schematically illustrates an example of a cross-sectional configuration of a light-receiving device (a light-receiving device 4A) according to Modification Example 5 of the present disclosure. The foregoing fourth embodiment exemplifies the recessed side surface S5 of the semiconductor substrate 30 being coated with the organic film 36. However, as illustrated in FIG. 15, a portion of the side surfaces of the wiring layers 40 and 20 and the semiconductor substrate 10 may be coated with the organic film 36 together with the side surface S5. At that time, the entire surface of the side surface S5 of the semiconductor substrate 30 may not be coated with the organic film 36. The organic film 36 can be formed by application using a dispenser, or the like, for example. This reduces the probability of electron release from the end of the front surface S3 of the semiconductor substrate 30, thus making it possible to improve discharge withstand voltage, in the same manner as the foregoing fourth embodiment.

10. Modification Example 6

FIG. 16 schematically illustrates an example of a cross-sectional configuration of a light-receiving device (a light-receiving device 4B) according to Modification Example 6 of the present disclosure. The light-receiving device 4B of the present modification example is a combination of the third embodiment and Modification Example 5, for example; the wiring layers 40 and 20 and a portion of the semiconductor substrate 10 continuous to the side surface S5 are continuously recessed together with the side surface S5 of the semiconductor substrate 30, and the organic film 36 is formed on an area from the side surface S5 of the semiconductor substrate 30 to the continuous side surface S6 of the semiconductor substrate 10. In this manner, the organic film 36 can be formed in the same manner as the protective film 35, thus enabling similar effects to be obtained.

It is to be noted that, in a case where the organic film 36 is formed continuously to the side surface of the light-receiving device 4A or 4B as in the foregoing Modification Example 5 or 6, the semiconductor substrate 30 need not necessarily be recessed more than another surface; it is possible to obtain effects similar to those of Modification Examples 5 and 6.

11. Fifth Embodiment

FIG. 17 schematically illustrates an example of a cross-sectional configuration of a light-receiving device (a light-receiving device 5) according to a fifth embodiment of the present disclosure. In the same manner as the foregoing first embodiment, the light-receiving device 5 includes, for example, a PIN type photodiode that applies a reverse bias between the front surface and the back surface of the semiconductor substrate 10. The light-receiving device 5 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 5 of the present embodiment is provided with a groove 30H penetrating the semiconductor substrate 30 and being continuous to the vicinity of the side surface S5, with an insulating film 37 being embedded in the groove 30H.

The insulating film 37 can be formed using an inorganic insulating material or an organic material, for example. Examples of the inorganic insulating material include silicon oxide ($SiO_2$), silicon nitride (SiN), and aluminum oxide ($Al_2O_3$). It is preferable for the organic material to be materially stable; examples thereof include an epoxy resin, a silicon resin, a polyurethane resin, and a fluorine resin. In addition, the insulating film 37 may be a stacked film of a film including an inorganic insulating material (inorganic insulating film) and a film including an organic material (organic film). Specifically, an inorganic insulating film may be formed on a side surface and a bottom surface of the groove 30H, and an organic film may be embedded inside the inorganic insulating film.

Thus, in the present embodiment, the groove 30H penetrating the semiconductor substrate 30 and being continuous to the vicinity of the side surface S5 is provided, and the insulating film 37 is embedded in the groove 30H. This makes it possible to prevent a short circuit from occurring between the semiconductor substrate 10 and the semiconductor substrate 30 even in a case where, for example, creeping discharge occurs. It is therefore possible to improve discharge withstand voltage.

12. Modification Example 7

FIG. 18 schematically illustrates an example of a cross-sectional configuration of a light-receiving device (a light-receiving device 5A) according to Modification Example 7 of the present disclosure. The foregoing fifth embodiment exemplifies the groove 30H being provided which penetrates the side surface S5 of the semiconductor substrate 30 and is continuous to the vicinity of the side surface S5, with the insulating film 37 being embedded therein. However, the groove 30H may further penetrate the wiring layers 20 and 40. Alternatively, as in a light-receiving device 5B illustrated in FIG. 19, the groove 30H may further penetrate up to the semiconductor substrate 10. As in the foregoing fifth embodiment, this prevents a short circuit from occurring between the semiconductor substrate 10 and the semiconductor substrate 30, thus making it possible to improve discharge withstand voltage.

13. Sixth Embodiment

FIG. 20 schematically illustrates an example of a cross-sectional configuration of a light-receiving device (a light-receiving device 6) according to a sixth embodiment of the present disclosure. In the same manner as the foregoing first embodiment, the light-receiving device 6 includes, for example, a PIN type photodiode that applies a reverse bias between the front surface and the back surface of the semiconductor substrate 10. The light-receiving device 6 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 6 of the present embodiment is provided with the groove 30H penetrating the semiconductor substrate 30 and being continuous to the vicinity of the side surface S5.

Thus, in the present embodiment, the groove 30H penetrating the semiconductor substrate 30 and being continuous to the vicinity of the side surface S5 is provided to divide the semiconductor substrate 30 at a peripheral edge part. Thus, the semiconductor substrate 30 on the outer peripheral side divided by the groove 30H is electrically floated, but has an intermediate potential with respect to each of the semiconductor substrates 10 and 30 due to capacitive coupling. This reduces a potential difference with the semiconductor substrate 10, thus making it possible reduce the generation of creeping discharge. In addition, even in a case where creeping discharge occurs locally, the semiconductor substrate 30 on the outer peripheral side divided by the groove 30H has a large capacity, thus allowing the fluctuation in the potential of the semiconductor substrate 30 on the outer peripheral side to be small. Thus, it is possible to prevent an instantaneous excess current from flowing to the semiconductor substrate 30 on an inner peripheral side provided with a logic circuit, or the like. It is therefore possible to prevent an imaging element from being broken down due to discharge.

14. Modification Example 8

FIG. 21 schematically illustrates an example of a cross-sectional configuration of a light-receiving device (a light-receiving device 6A) according to Modification Example 8 of the present disclosure. The foregoing sixth embodiment exemplifies the case where the groove 30H penetrating the side surface S5 of the semiconductor substrate 30 and being continuous to the vicinity of the side surface S5 is provided to divide the semiconductor substrate 30 into the inner peripheral side and the outer peripheral side. However, the side surface of the groove 30H may be further coated with the protective layer 34, as illustrated in FIG. 21.

In addition, as in a light-receiving device 6B illustrated in FIG. 22, for example, a plurality of grooves may be provided at the peripheral edge part of the semiconductor substrate 30, and the semiconductor substrates 30 divided doubly or triply or more may be arranged around the semiconductor substrate 30 provided with a logic circuit, or the like. Further, a fixed potential may be applied to the divided semiconductor substrates 30. For example, as illustrated in FIG. 22, in a case where two semiconductor substrates 30 are provided, divided by two grooves 30H1 and 30H2, around the semiconductor substrate 30 including a logic circuit, or the like, a predetermined fixed potential may be applied to each of them. At that time, as illustrated in FIG. 22, it is preferable that the potential be gradually increased, as in 100 V, 200 V, from the inner side of the semiconductor substrate 30. This makes it possible to further reduce the generation of creeping discharge.

It is to be noted that, as described above, also as for the plurality of semiconductor substrates 30 divided by the plurality of grooves 30H1 and 30H2 and having received the respective predetermined potentials, respective side surfaces of the grooves 30H1 and 30H2 may be coated with a protective layer 34H, as in the light-receiving device 6A. In addition, as in the light-receiving device 5 of the foregoing fifth embodiment, the grooves 30H1 and 30H2 may be filled with the insulating film 37. In that case as well, it is possible to obtain similar effects.

15. Seventh Embodiment

FIG. 23 schematically illustrates an example of a cross-sectional configuration of a light-receiving device (a light-receiving device 7) according to a seventh embodiment of the present disclosure. In the same manner as the foregoing first embodiment, the light-receiving device 7 includes, for example, a PIN type photodiode that applies a reverse bias between the front surface and the back surface of the semiconductor substrate 10. The light-receiving device 7 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). In the light-receiving device 7 of the present embodiment, an SOI substrate including a support substrate 60A, an oxide film 60B, and an element substrate 60C is used as the semiconductor substrate constituting the logic substrate 200, and an insulating film 38 is embedded around the element substrate 60C.

As described above, a semiconductor substrate 60 is the SOI substrate in which the support substrate 60A, the oxide film 60B, and the element substrate 60C are stacked in this order in the stacking direction (Y-axis direction). The semiconductor substrate 60 is disposed to allow the element substrate 60C to be opposed to the semiconductor substrate 10, with the front surface S3 being on a side of the element substrate 60C and the back surface S4 being on a side of the support substrate 60A. The element substrate 60C has a thickness of 2 μm to 3 μm, for example, and is provided with a readout circuit, a logic circuit, and the like. A side surface of the element substrate 60C is recessed more inward than side surfaces of the support substrate 60A and the oxide film 60B by several μm or more, for example. The insulating film 38 is embedded therearound to form a side surface common to the side surfaces of the support substrate 60A and the oxide film 60B.

In the same manner as the foregoing first embodiment, the element substrate 60C receives application of a low voltage of 1 V to 5 V, for example. The support substrate 60A receives application of an intermediate potential (e.g., 200 V) between respective potentials of the semiconductor substrate 10 and the element substrate 60C.

Thus, in the present embodiment, the SOI substrate is used as the semiconductor substrate 60 constituting the logic substrate 200; the side surface of the element substrate 60C is recessed inward, with the insulating film 38 being embedded therearound, and a support substrate 50A receives application of an intermediate potential between respective potentials of the semiconductor substrate 10 and the element substrate 60C. This reduces a potential differential between the sensor substrate 100 and the logic substrate 200, thus reducing the generation of creeping discharge. It is therefore possible to improve discharge withstand voltage, in the same manner as the foregoing first embodiment.

16. Modification Example 9

FIG. 24A schematically illustrates an example of a cross-sectional configuration of a light-receiving device (a light-receiving device 7A) according to Modification Example 9 of the present disclosure. The foregoing seventh embodiment exemplifies the case where the SOI substrate is used as the semiconductor substrate 60 constituting the logic substrate 200, and the side surface of the element substrate 60C is recessed inward, with the insulating film 38 being embedded therearound. However, the element substrate 60C may also have the following configuration. For example, as in the foregoing fifth embodiment and Modification Example 8, a plurality of grooves 60H, penetrating the element substrate 60C to divide the element substrate 60C into a plurality of element substrates 60C, may be provided near the side surface of the element substrate 60C to fill each of the grooves 60H with the insulating film 37. Also in such a configuration, it is possible to obtain effects similar to those of the foregoing seventh embodiment.

FIG. 24B schematically illustrates another example of a cross-sectional configuration of a light-receiving device (a light-receiving device 7B) according to Modification Example 9 of the present modification example. The foregoing seventh embodiment exemplifies the case where the SOI substrate is used as the semiconductor substrate 60 constituting the logic substrate 200, the side surface of the element substrate 60C is recessed inward, with the insulating film 38 being embedded therearound, and the support substrate 50A receives application of an intermediate potential between respective potentials of the semiconductor substrate 10 and the element substrate 60C. However, as illustrated in FIGS. 25A and 25B, for example, the support substrate 60A may be recessed further inward than the side surface of the oxide film 60B or the element substrate 60C. Furthermore, in a case where the support substrate 60A is recessed, the element substrate 60C functions as an electric field shield, and thus the support substrate 60A may receive application of a ground (GND) potential (0 V), for example, instead of the intermediate potential. In addition, the side surface of the recessed support substrate 60A may be coated with the protective film 35, in the same manner as the foregoing first embodiment. Also in such a configuration, it is possible to obtain effects similar to those of the foregoing seventh embodiment.

17. Modification Example 10

FIGS. 25A and 25B each schematically illustrate an example of a planar configuration of a main part of a light-receiving device (e.g., light-receiving device 1) according to Modification Example 10 of the present disclosure. For example, the foregoing first embodiment exemplifies the corner of the recessed semiconductor substrate 30 being worked into a curved shape; however, this is not limitative. For example, as illustrated in FIGS. 25A and 25B, also in a case where a corner 30A is worked into a polygonal shape having an obtuse angle of 90° or more, for example, it is possible to alleviate the concentration of the electric field.

In addition, as in the foregoing first embodiment, in a case where the side surface S5 of the semiconductor substrate 30 constituting the sensor substrate 100 is recessed more inward than the side surfaces of the semiconductor substrate 10 and the wiring layer 20 constituting the sensor substrate 100 and the wiring layer 40 constituting the logic substrate 200, an amount of protrusion of the semiconductor substrate 10 constituting the sensor substrate 100 is increased, which may adversely cause an increase in the electric field at the corner. Therefore, as illustrated in FIG. 26A, for example, a corner 10A of the semiconductor substrate 10 may also be worked into a curved shape, together with the semiconductor substrate 30. In addition, the shape of the corner 10A of the semiconductor substrate 10 is not limited to the curved shape, and may also be worked into a polygonal shape including an obtuse angle of 90° or more, for example, as illustrated in FIGS. 26B and 26C, for example. This suppresses the concentration of the electric field on the corner 30A, thus making it possible to further improve discharge withstand voltage, as compared with the foregoing first embodiment.

18. Eighth Embodiment

FIG. 27 schematically illustrates an example of a cross-sectional configuration of a light-receiving device (a light-receiving device 8) according to an eighth embodiment of the present disclosure. In the same manner as the foregoing first embodiment, the light-receiving device 8 includes, for example, a PIN type photodiode that applies a reverse bias between the front surface and the back surface of the semiconductor substrate 10. The light-receiving device 8 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., α-ray, β-ray, γ-ray, and X-ray, etc.). The light-receiving device 8 of the present embodiment differs from the foregoing first embodiment in that a shield electrode 48 is provided in the wiring layer 40, for example, between the semiconductor substrate 10 and the semiconductor substrate 30.

The shield electrode 48 shields a line of electric force from the sensor substrate 100 (specifically, the semiconductor substrate 10) to the logic substrate 200 (specifically, the semiconductor substrate 30). The shield electrode 48 is provided in the same layer as any of the plurality of wiring lines 42, 43, 44, and 45 provided in the wiring layer 40, for example, and extends to the outside of the side surface S5 of the semiconductor substrate 30. The shield electrode 48 is electrically coupled to the semiconductor substrate 30, for example. The shield electrode 48 is formed using a metal material such as Cu, AlCu, Al, AlSi, W, Ni, Co, NiSi, and CoSi$_2$, for example.

Thus, in the present embodiment, the shield electrode 48, extending to the outside of the side surface S5 of the semiconductor substrate 30, is provided in the wiring layer 40, for example, between the semiconductor substrate 10 and the semiconductor substrate 30. This allows the line of electric force from the sensor substrate 100 is terminated by the shield electrode 48, and therefore the electric field at the end of the semiconductor substrate 30 on the side of the front surface S3 nears zero, thus allowing electrons not to be released from the semiconductor substrate 30. This reduces the generation of creeping discharge, thus making it possible to further improve discharge withstand voltage.

19. Modification Example 11

FIG. 28 schematically illustrates an example of a cross-sectional configuration of a light-receiving device (a light-receiving device 8A) according to Modification Example 11 of the present disclosure. The foregoing eighth embodiment exemplifies the shield electrode 48 being electrically coupled to the semiconductor substrate 30. However, the shield electrode 48 may receive direct application of a voltage from an external power supply 70. Also in such a configuration, it is possible to obtain effects similar to those of the foregoing eighth embodiment.

In addition, the shield electrode 48 may be electrically coupled to each of the semiconductor substrate 10 and the semiconductor substrate 30. At that time, for example, a resistor of about $10^{12}$ Ohm is disposed between the semiconductor substrate 10 and the semiconductor substrate 30. This allows the shield electrode 48 to receive application of a divided potential, thus making it possible to reduce an electric field at the end of the semiconductor substrate 30 on the side of the front surface S3 by a certain amount. Examples of the resistor include a polysilicon resistor, a metal thin film resistor, and a Zener diode resistor.

20. Modification Example 12

FIG. 29 schematically illustrates an example of a cross-sectional configuration of a light-receiving device (a light-receiving device 8B) according to Modification Example 12 of the present disclosure. The foregoing eighth embodiment and the like exemplify the shield electrode 48, including one layer, being provided in the wiring layer 40, for example, between the semiconductor substrate 10 and the semiconductor substrate 30; however, a plurality of layers of shield electrodes may be provided. FIG. 29 illustrates an example in which two shield electrodes 48A and 48B electrically coupled to each other are provided in the wiring layer 40. In this manner, arranging the plurality of layers of shield electrodes between the semiconductor substrate 10 and the semiconductor substrate 30 allows an electric field from the sensor substrate 100 to be dispersed. It is therefore possible to further improve discharge withstand voltage.

In addition, as illustrated in FIG. 29, for example, a dummy wiring line in an electrically floating state may be provided between the shield electrode 48A and the shield electrode 48B, above the shield electrode 48A, and below the shield electrode 48B, or outside the shield electrodes 48A and 48B.

Further, in a case where the shield electrode 48 is configured by a plurality of layers (e.g., two layers) as in the present modification example, one shield electrode (e.g., the shield electrode 48A) may protrude more outward than the other shield electrode (e.g., the shield electrode 48B), as illustrated in FIGS. 30A and 30B, for example. In a structure where the shield electrode 48B of the lower layer protrudes, an electric field intensity at the front edge of the shield electrode 48B increases, whereas an electric field of the shield electrode 48A of the upper layer is reduced. In a structure where the shield electrode 48A of the upper layer protrudes, an electric field intensity at the front edge of the shield electrode 48A increases, whereas an electric field of the shield electrode 48B of the lower layer is reduced In addition, corners of the shield electrode 48 (48A and 48B) may be curved, for example, as illustrated in FIG. 30C.

Furthermore, the shield electrodes 48A and 48B including a plurality of layers (e.g., two layers) may be provided with a plurality of openings 48AH and 48BH, respectively, for example, as illustrated in FIG. 30D. At that time, it is preferable that the plurality of openings 48AH and 48BH be provided at positions not overlapping each other in a plan view.

In addition thereto, the shield electrode 48 need not necessarily be continuous to a peripheral edge part. For example, in the light-receiving device 8B in which the two shield electrodes 48A and 48B are provided in the wiring layer 40 as in the present modification example, a shield electrode of a third layer may be added partially only at the corner on which the electric field is likely to concentrate.

Thus, it is possible to further improve discharge withstand voltage.

21. Ninth Embodiment

FIG. 31 schematically illustrates an example of a cross-sectional configuration of a light-receiving device (a light-receiving device 9) according to a ninth embodiment of the present disclosure. In the same manner as the foregoing first embodiment, the light-receiving device 9 includes, for example, a PIN type photodiode that applies a reverse bias between the front surface and the back surface of the semiconductor substrate 10. The light-receiving device 9 constitutes one pixel (unit pixel P) in an electromagnetic wave detector or a radiation imaging element (e.g., X-ray imaging device 1000) to read information on a subject (to capture an image of a subject), for example, on the basis of a radioactive ray (e.g., $\alpha$-ray, $\beta$-ray, $\gamma$-ray, and X-ray, etc.). In the light-receiving device 9 of the present embodiment, a plurality of guard rings 132 including a p-type electrically-conductive region is provided on the front surface S3 near the side surface of the semiconductor substrate 30 constituting the logic substrate 200, and outer peripheries of the semiconductor substrate 10 and the semiconductor substrate 30 are electrically coupled to each other to allow both the semiconductor substrate 10 and the semiconductor substrate 30 to receive application of a high voltage of 100 V to 1000 V.

The guard ring 132 is a p-type impurity region including p-type impurities at a concentration of $1e^{18}$ cm$^{-3}$ to $1e^{21}$ cm$^{-3}$, for example, and corresponds to a specific example of a "sixth first electrically-conductive region" of the present disclosure. The guard ring 132 is provided to relax the electric field intensity near end of the semiconductor substrate 30 on a side of the front surface S4. In the same manner as the high-voltage guard ring 13D and the like described above, the guard ring 132 is in an electrically floating state, and the plurality of guard rings 132 is formed along an outer shape of the semiconductor substrate 30, for example. A linewidth of a ring constituting the guard ring 132 is 0.2 $\mu$m to 10 $\mu$m, for example. As for a thickness, for example, the guard ring 132 is formed at 0.3 $\mu$m to 10 $\mu$m, for example, from the interface of the front surface S3 of the semiconductor substrate 30.

In addition, in the present embodiment, a high-resistance (low-concentration) substrate is used, as the semiconductor substrate 30, for example, in order to improve withstand voltage. In that case, for example, as illustrated in FIGS. 30A, 30B, 30C, and 30D, a well 131 is formed near the front surface S3 of the semiconductor substrate 30, and a readout circuit and a logic circuit are formed in the well 131.

Thus, in the present embodiment, the plurality of guard rings 132 including the p-type electrically-conductive region is provided at the interface of the front surface S3 near the side surface of the semiconductor substrate 30, and the outer peripheries of the semiconductor substrate 10 and the semiconductor substrate 30 are electrically coupled to each other to allow for application of a high voltage of 100 V to 1000 V thereto together with the semiconductor substrate 10. This eliminates a potential difference between the semiconductor substrate 10 and the semiconductor substrate 30 as well as a resulting line of electric force at least near the side surface of each of the semiconductor substrates 10 and 30 and at side surfaces of the wiring layers 20 and 40, thus eliminating generation of creeping discharge. It is therefore possible to improve discharge withstand voltage.

22. Modification Example 13

FIG. 32 schematically illustrates an example of a cross-sectional configuration of a light-receiving device (a light-receiving device 9A) according to Modification Example 13 of the present disclosure. The foregoing ninth embodiment exemplifies the well 131 being provided near the front surface S3 of the semiconductor substrate 30. However, as illustrated in FIG. 32, for example, the well 131 may be formed across the entire area between the front surface S3 and the back surface S4 of the semiconductor substrate 30. Examples of a method of forming the well 131 across the entire area between the front surface S3 and the back surface S4 of the semiconductor substrate 30 may include thinning of the semiconductor substrate 30 from the side of the back surface S4 or deep formation of the well 131 in accordance with the thickness of the semiconductor substrate 30.

In addition, as in a light-receiving device 9B illustrated in FIG. 33, for example, a through-electrode 133 may be used for the electric coupling between the outer peripheries of the semiconductor substrate 10 and the semiconductor substrate 30. Further, upon the electric coupling between the semiconductor substrate 10 and the semiconductor substrate 30, a resistor may be provided therebetween. This reduces the generation of a noise.

Furthermore, as in a light-receiving device 9C illustrated in FIG. 34, for example, the outer periphery of the semiconductor substrate 30 that receives application of a high voltage, some or all of the guard rings 132 may be a Zener diode structure including a p-type electrically-conductive region 134 penetrating from a front surface S33 of the semiconductor substrate 30 to the back surface S4. This solidifies electric separation between the high-voltage part (outer periphery) and the low-voltage part (inner periphery) in the semiconductor substrate 30, thus reducing generation of a noise or an abnormal signal, from the high-voltage part, in the readout circuit or the logic circuit formed in the low-voltage part.

In addition, as in a light-receiving device 9D illustrated in FIG. 35, for example, an n-type electrically-conductive region 135 having the same polarity as that of the semiconductor substrate 30 may be formed between the plurality of p-type electrically-conductive regions 134 forming the Zener diode structure. This reduces the generation of a leak current between the plurality of p-type electrically-conductive regions 134.

This makes it possible to further improve discharge withstand voltage.

23. Another Modification Example

Although the description has been given of the present technology by referring to the first to ninth embodiments and Modification Examples 1 to 13, they can be combined together. For example, as in the light-receiving device 1C illustrated in FIG. 36, the side surface S5 of the semiconductor substrate 30 constituting the logic substrate 200 may be recessed as in the foregoing first embodiment, and the side surfaces of the wiring layers 20 and 40 and a portion of the semiconductor substrate 10 may be further recessed in the light-receiving device 1A coated with the protective film 35. In addition, for example, the foregoing fifth embodiment may be combined to provide the groove 30H continuous to the vicinity of the side surface S5 of the semiconductor substrate 30 and to fill the groove 30H with the insulating film 37. Further, for example, the eighth embodiment may be combined to provide the shield electrode 48 in the wiring layer 40, for example, between the semiconductor substrate 10 and the semiconductor substrate 30.

In this manner, appropriately combining the first to ninth embodiments and Modification Examples 1 to 13 together makes it possible to further improve discharge withstand voltage.

In addition, for example, the foregoing first embodiment exemplifies the case where the semiconductor substrate 30 constituting the logic substrate 200 is recessed. However, as in a light-receiving device 1D illustrated in FIG. 37, for example, the side surface S6 of the semiconductor substrate 10 constituting the sensor substrate 100 and the side surfaces of the wiring layers 20 and 40 are recessed to be coated with the protective film 35.

24. Application Example

FIG. 38 illustrates a functional configuration of the X-ray imaging device 1000 as an example of an electronic apparatus using the light-receiving device (e.g., light-receiving device 1) described in the foregoing first to ninth embodiments, Modification Examples 1 to 13, and another modification example thereof. The X-ray imaging device 1000 reads information on a subject (captures an image of a subject) on the basis of an incident radioactive ray Rrad (e.g., α-ray, β-ray, γ-ray, and X-ray, etc.), for example. The X-ray imaging device 1000 includes a pixel section (light-receiving region 110A), and includes, as a drive circuit (peripheral circuit section) of the light-receiving region 110A, a row scanning section 121, an A/D conversion section 122, a column scanning section 123, and a system control section 124.

(Light-Receiving Region 110A)

The light-receiving region 110A includes a plurality of unit pixels (imaging pixels) P that generates signal charge on the basis of a radioactive ray. The plurality of unit pixels P are arranged two-dimensionally in matrix (in a matrix shape). It is to be noted that, as illustrated in FIG. 1, a horizontal direction (row direction) in the light-receiving region 110A is defined as an "H" direction, and a vertical direction (column direction) is defined as a "V" direction.

(Row Scanning Section 121)

The row scanning section 121 includes a later-described shift register circuit, a predetermined logic circuit, and the like, and is a pixel drive section (row scanning circuit) that performs driving (line-sequential scanning), on a row-by-row basis (in unit of horizontal lines), on the plurality of unit pixels P in the light-receiving region 110A. Specifically, the row scanning section 121 performs an imaging operation such as a read operation or a reset operation on each of the unit pixels P by line-sequential scanning, for example. It is to be noted that the line-sequential scanning is performed by supplying each of the unit pixels P with a row scanning signal described above via a readout control line Lread.

(A/D Conversion Section 122)

The A/D conversion section 122 includes a plurality of column selection sections 125 each provided for every plurality of (four, in this example) signal lines Lsig, and performs A/D conversion (analog/digital conversion) on the basis of a signal voltage (voltage in response to signal charge) inputted via the signal line Lsig. This allows output data Dout (imaging signal) including a digital signal to be generated and outputted to the outside.

For example, as illustrated in FIG. 39, each of the column selection sections 125 includes a charge amplifier 172, a capacitor (condenser or feedback capacitor, etc.) C1, a switch SW1, a sample-and-hold (S/H) circuit 173, a multiplexer circuit (selection circuit) 174 including four switches SW2, and an A/D converter 175. Of these, the charge amplifier 172, the capacitor C1, the switch SW1, the S/H circuit 173, and the switch SW2 are provided for each of the signal lines Lsig. The multiplexer circuit 174 and the A/D converter 175 are provided for each of the column selection sections 125. It is to be noted that the charge amplifier 172, the capacitor C1, and the switch SW1 constitute a charge amplifier circuit.

The charge amplifier 172 is an amplifier (amplifier) to perform voltage conversion (Q-V conversion) of signal charge read from the signal line Lsig. In the charge amplifier 172, one end of the signal line Lsig is coupled to an input terminal on a negative side (– side), and a predetermined reset voltage Vrst is inputted to an input terminal on a positive side (+ side). An output terminal and the input terminal on the negative side of the charge amplifier 172 are feedback-coupled to each other (feedback coupling) via a parallel connection circuit of the capacitor C1 and the switch SW1. That is, one terminal of the capacitor C1 is coupled to the input terminal on the negative side of the charge amplifier 172, and another terminal thereof is coupled to the output terminal of the charge amplifier 172. Likewise, one terminal of the switch SW1 is coupled to the input terminal on the negative side of the charge amplifier 172, and another terminal thereof is coupled to the output terminal of the charge amplifier 172. It is to be noted that an ON/OFF state of the switch SW1 is controlled by a control signal (amplifier reset control signal) supplied from the system control section 124 via an amplifier reset control line Lcarst.

The S/H circuit 173 is disposed between the charge amplifier 172 and the multiplexer circuit 174 (switch SW2), and is a circuit to temporarily hold an output voltage Vca from the charge amplifier 172.

The multiplexer circuit 174 is a circuit that selectively couples or decouples each of the S/H circuits 173 and the A/D converter 175 to and from each other by sequentially bringing one of the four switches SW2 into an ON state in accordance with scan driving by the column scanning section 123.

The A/D converter 175 is a circuit that generates and outputs the above-described output data Dout by performing A/D conversion on an output voltage inputted via the switch SW2 from the S/H circuit 173.

(Column Scanning Section 123)

The column scanning section 123 includes, for example, an unillustrated shift register, address decoder, and the like, and drives the switches SW2 in sequence in the above-described column selection section 125 while scanning. Such selective scanning by the column scanning section 123 allows signals (output data Dout described above) of the respective unit pixels P read via the respective signal lines Lsig to be outputted in sequence to the outside.

(System Control Section 124)

The system control section 124 controls respective operations of the row scanning section 121, the A/D conversion section 122, and the column scanning section 123. Specifically, the system control section 124 includes a timing generator that generates various timing signals (control signals) described above, and performs drive control of the row scanning section 121, the A/D conversion section 122, and the column scanning section 123 on the basis of the various timing signals generated by the timing generator. On the basis of the control of the system control section 124, the row scanning section 121, the A/D conversion section 122, and the column scanning section 123 each perform imaging driving (line-sequential imaging driving) on the plurality of unit pixels P in the light-receiving region 110A, thereby allowing the output data Dout to be acquired from the light-receiving region 110A.

Although the description has been given above by referring to the first to ninth embodiments, Modification Examples 1 to 13, another modification example, and the application example, the contents of the present disclosure are not limited to the foregoing embodiments, and the like, and may be modified in a wide variety of ways. For example, the foregoing embodiments, and the like exemplify the use of holes as signal charge; however, electrons may be used as the signal charge. It is to be noted that, in that case, each member has an electrically-conductive type which is the opposite electrically-conductive type.

In addition, the configuration of the unit pixel P (light-receiving element) described in the foregoing embodiments, and the like is merely exemplary, and another impurity region may further be included. Further, the materials or the thicknesses of the respective layers are also exemplary, and are not limited to those described above. Furthermore, although the foregoing application example mentions the X-ray imaging device 1000, the light-receiving device 1 described in the foregoing embodiments, and the like is also applicable to a radiation imaging device or an electromagnetic wave detector of which application is not limited to an X-ray.

It is to be noted that the effects described herein are merely exemplary and non-limiting, and may have other effects.

It is to be noted that the present disclosure may also have the following configurations. According to the present technology of the following configurations, the generation of creeping discharge is reduced. In addition, the probability of electron release from the end of the second semiconductor substrate is reduced. It is therefore possible to improve discharge withstand voltage.

(1)

A light-receiving device including:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, and the side surface of the second semiconductor substrate is coated with a protective film.

(2)

The light-receiving device according to (1), in which the interlayer insulating layer includes a first insulating layer provided on the first surface of the first semiconductor substrate and a second insulating layer provided on the third surface of the second semiconductor substrate, the first insulating layer and the second insulating layer each include a pad electrode being embedded and formed in a bonded surface therebetween, and the first semiconductor substrate and the second semiconductor substrate are electrically coupled to each other via the pad electrode provided in each of the first insulating layer and the second insulating layer.

(3)

The light-receiving device according to (1) or (2), in which the light-receiving elements each include a first first electrically-conductive region provided at an interface of the first surface of the first semiconductor substrate and coupled to a first electrode, a second first electrically-conductive region each provided around the first first electrically-conductive region provided for each of the light-receiving elements and coupled to a second electrode, at the interface of the first surface, and a third first electrically-conductive region each provided around the second first electrically-conductive region provided for each of the light-receiving elements and being in an electrically floating state, at the interface of the first surface.

(4)

The light-receiving device according to any one of (1) to (3), in which the side surface of the second semiconductor substrate is inclined outward on a side of the fourth surface.

(5)

The light-receiving device according to any one of (1) to (4), in which a side surface of the interlayer insulating layer and a portion of the side surface of the first semiconductor substrate continuous to the side surface of the interlayer insulating layer are recessed inward and coated with the protective film together with the side surface of the second semiconductor substrate.

(6)

The light-receiving device according to (5), in which the protective film extends to a fifth surface of the first semiconductor substrate formed by the recess of the side surface of the portion of the first semiconductor substrate.

(7)

The light-receiving device according to any one of (1) to (6), in which the side surface of the interlayer insulating layer is recessed inward together with the side surface of the second semiconductor substrate, and the portion of the side surface of the first semiconductor substrate continuous to the side surface of the interlayer insulating layer is recessed further inward than the side surface of the second semiconductor substrate.

(8)

The light-receiving device according to any one of (1) to (7), in which the protective film includes an inorganic insulating film or an organic film.

(9)

The light-receiving device according to (8), in which the organic film extends to the fourth surface of the first semiconductor substrate.

(10)

The light-receiving device according to any one of (1) to (9), in which the second semiconductor substrate has a groove being continuous to a vicinity of the side surface and penetrating the second semiconductor substrate, and an inorganic insulating film is embedded in the groove.

(11)

The light-receiving device according to (10), in which an organic film is further embedded inside the inorganic insulating film in the groove.

(12)

The light-receiving device according to (10) or (11), in which the groove further penetrates the interlayer insulating layer or the interlayer insulating layer and the first semiconductor substrate.

(13)

The light-receiving device according to (10) or (11), in which a multiplicity of the grooves is provided near the side surface of the second semiconductor substrate.

(14)

The light-receiving device according to (13), in which the second semiconductor substrate divided by the groove receives application of each fixed potential.

(15)

The light-receiving device according to any one of (1) to (14), in which the second semiconductor substrate includes a support substrate disposed on the side of the fourth surface, a logic substrate disposed on a side of the third surface and including the logic circuit formed therein, and an insulating layer provided between the support substrate and the logic substrate, a side surface of the logic substrate is provided inside a side surface of the support substrate and is covered with an insulating film, and the support substrate receives application of a third potential that is higher than the second potential to be applied to the logic substrate and is lower than the first potential to be applied to the first semiconductor substrate.

(16)

The light-receiving device according to any one of (1) to (15), in which the first semiconductor substrate and the second semiconductor substrate each have a substantially rectangular shape in which a corner is worked into a curved shape.

(17)

The light-receiving device according to any one of (1) to (16), in which the interlayer insulating layer includes one or a plurality of metal films to which a predetermined potential is applied in the layer, the one or the plurality of metal films protruding more outward than the side surface of the second semiconductor substrate.

(18)

The light-receiving device according to (17), in which the one or the plurality of metal films is electrically coupled to the second semiconductor substrate.

(19)

The light-receiving device according to (17) or (18), in which the one or the plurality of metal films receives application of the third potential from an external power supply, the third potential being lower than the first potential and higher than the second potential.

(20)

The light-receiving device according to any one of (1) to (19), in which the first semiconductor substrate includes a first second electrically-conductive region having an electrically-conductive type different from the first electrically-conductive region, at an interface of the second surface.

(21)

The light-receiving device according to (20), in which the first semiconductor substrate includes a light-receiving region in which the plurality of light-receiving elements are arranged two-dimensionally in matrix, and a peripheral region provided around the light-receiving region, and the first semiconductor substrate further includes, in the peripheral region, a fourth first electrically-conductive region provided at the interface of the first surface, the fourth first electrically-conductive region extending to the side surface of the first semiconductor substrate and being in an electrically floating state, and a plurality of fifth first electrically-conductive regions provided in a ring shape outside the first second electrically-conductive region at the interface of the second surface, the fifth first electrically-conductive regions being in an electrically floating state.

(22)

The light-receiving device according to (21), in which the fourth first electrically-conductive region provided at the interface of the first surface is provided in a shape of a plurality of rings.

(23)

The light-receiving device according to any one of (1) to (22), in which the second semiconductor substrate further includes a plurality of sixth first electrically-conductive regions provided in a ring shape at an interface of the third surface near the side surface and being in an electrically floating state.

(24)

The light-receiving device according to (23), in which at least a portion of the plurality of sixth first electrically-conductive regions penetrates from the third surface to the fourth surface of the second semiconductor substrate.

(25)

The light-receiving device according to (24), in which the second semiconductor substrate further includes a second second electrically-conductive region between the plurality of sixth first electrically-conductive regions penetrating from the third surface to the fourth surface, the second second electrically-conductive region penetrating from the third surface to the fourth surface.

(26)

An X-ray imaging device including:

a first semiconductor substrate having a first surface and a second surface opposed to each other and receiving application of a first potential, the first semiconductor substrate including a plurality of light-receiving elements arranged two-dimensionally in matrix, the light-receiving elements generating signal charge based on an X-ray;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, and the side surface of the second semiconductor substrate is coated with a protective film.

(27)

An electronic apparatus including an X-ray imaging device, the X-ray imaging device including a first semiconductor substrate having a first surface and a second surface opposed to each other and receiving application of a first potential, the first semiconductor substrate including a plurality of light-receiving elements arranged two-dimensionally in matrix, the light-receiving elements generating signal charge based on an X-ray, a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements, and an interlayer insulating layer provided between the first semiconductor substrate and the second semiconductor substrate, in which the second semiconductor substrate has a side surface recessed more inward than a side surface of the first semiconductor substrate, and the side surface of the second semiconductor substrate is coated with a protective film.

(28)

A light-receiving device including:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, the side surface of the second semiconductor substrate is coated with a protective film, and the first semiconductor substrate and the second semiconductor substrate each have a substantially rectangular shape, and have a corner being worked into a curved shape.

(29)

A light-receiving device including:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, in which the second semiconductor substrate has a side surface recessed more inward than a side surface of the first semiconductor substrate, the side surface of the second semiconductor substrate is coated with a protective film, and the interlayer insulating layer includes a metal film to which a predetermined potential is applied in the layer, the metal film protruding more outward than the side surface of the second semiconductor substrate.

(30)

The light-receiving device according to (29), in which the metal film is electrically coupled to the second semiconductor substrate.

(31)

The light-receiving device according to (29) or (30), in which the metal film receives application of a third potential from an external power supply, the third potential being lower than the first potential and higher than the second potential.

(32)

A light-receiving device including:

a first semiconductor substrate having a first surface and a second surface opposed to each other and receiving application of a first potential, the first semiconductor substrate including a light-receiving region in which a plurality of light-receiving elements are arranged two-dimensionally in matrix and a peripheral region provided around the light-receiving region;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge output-ted from the plurality of light-receiving elements;

a first first electrically-conductive region provided at an interface of the first surface of the first semiconductor substrate for each of the light-receiving elements and coupled to a first electrode, in the light-receiving region;

a second first electrically-conductive region each pro-vided around the first first electrically-conductive region provided for each of the light-receiving elements and coupled to a second electrode, at the interface of the first surface;

a third first electrically-conductive region each provided around the second first electrically-conductive region provided for each of the light-receiving elements and being in an electrically floating state, at the interface of the first surface;

a fourth first electrically-conductive region provided at the interface of the first surface, the fourth first elec-trically-conductive region extending to a side surface of the first semiconductor substrate and being in an elec-trically floating state;

a first second electrically-conductive region provided at an interface of the second surface and having an electrically-conductive type different from the first electrically-conductive region; and a plurality of fifth first electrically-conductive regions provided in a ring shape outside the first second elec-trically-conductive region at the interface of the second surface, the fifth first electrically-conductive regions being in an electrically floating state.

(33)

The light-receiving device according to (32), in which the fourth first electrically-conductive region provided at the interface of the first surface is provided in a shape of a plurality of rings.

(34)

A light-receiving device including:

a first semiconductor substrate having a first surface and a second surface opposed to each other and receiving application of a first potential, the first semiconductor substrate including a plurality of light-receiving ele-ments arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, the second semiconductor substrate including a logic circuit that processes a light-receiving signal based on electric charge outputted from the plurality of light-receiving elements, and a plurality of sixth first electrically-conductive regions provided in a ring shape at an interface of the third surface near a peripheral edge part and being in an electrically floating state; and an interlayer insulating layer provided between the first semiconductor substrate and the second semiconductor substrate.

(35)

The light-receiving device according to (34), in which at least a portion of the plurality of sixth first electrically-conductive regions penetrates from the third surface to the fourth surface of the second semiconductor substrate.

(36)

The light-receiving device according to (35), in which the second semiconductor substrate further includes a second electrically-conductive region between the plurality of sixth first electrically-conductive regions penetrating from the third surface to the fourth surface, the second second electrically-conductive region penetrating from the third surface to the fourth surface.

This application claims the benefit of Japanese Priority Patent Application JP2021-112166 filed with the Japan Patent Office on Jul. 6, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving device, comprising:

a first semiconductor substrate having a first surface and a second surface opposed to each other and receiving application of a first potential, the first semiconductor substrate including a plurality of light-receiving ele-ments arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge output-ted from the plurality of light-receiving elements; and an interlayer insulating layer provided between the first semiconductor substrate and the second semiconductor substrate, wherein the second semiconductor substrate has a side surface recessed more inward than a side surface of the first semiconductor substrate, and the side surface of the second semiconductor substrate is coated with a protective film.

2. The light-receiving device according to claim 1, wherein the interlayer insulating layer includes a first insulating layer provided on the first surface of the first semicon-ductor substrate and a second insulating layer provided on the third surface of the second semiconductor sub-strate, the first insulating layer and the second insulating layer each include a pad electrode being embedded and formed in a bonded surface therebetween, and the first semiconductor substrate and the second semicon-ductor substrate are electrically coupled to each other via the pad electrode provided in each of the first insulating layer and the second insulating layer.

3. The light-receiving device according to claim 1, wherein each of the plurality of light-receiving elements includes a first first electrically-conductive region provided at an interface of the first surface of the first semiconductor substrate and coupled to a first electrode, a second first electrically-conductive region each pro-vided around the first first electrically-conductive region provided for each of the plurality of light-receiving elements and coupled to a second electrode, at the interface of the first surface, and a third first electrically-conductive region each provided around the second first electrically-conductive region provided for each of the plurality of light-receiving elements and being in an electrically floating state, at the interface of the first surface.

4. The light-receiving device according to claim 1, wherein the side surface of the second semiconductor substrate is inclined outward on a side of the fourth surface.

5. The light-receiving device according to claim 1, wherein a side surface of the interlayer insulating layer and a portion of the side surface of the first semiconductor substrate continuous to the side surface of the interlayer insulating layer are recessed inward and coated with the protective film together with the side surface of the second semiconductor substrate.

6. The light-receiving device according to claim 5, wherein the protective film extends to a fifth surface of the first semiconductor substrate formed by the recess of the side surface of the portion of the first semiconductor substrate.

7. The light-receiving device according to claim 1, wherein
   a side surface of the interlayer insulating layer is recessed inward together with the side surface of the second semiconductor substrate, and
   a portion of the side surface of the first semiconductor substrate continuous to the side surface of the interlayer insulating layer is recessed further inward than the side surface of the second semiconductor substrate.

8. The light-receiving device according to claim 1, wherein the protective film comprises an inorganic insulating film or an organic film.

9. The light-receiving device according to claim 8, wherein the organic film extends to the fourth surface of the second semiconductor substrate.

10. The light-receiving device according to claim 1, wherein
   the second semiconductor substrate has a groove being continuous to a vicinity of the side surface and penetrating the second semiconductor substrate, and
   an inorganic insulating film is embedded in the groove.

11. The light-receiving device according to claim 10, wherein an organic film is further embedded inside the inorganic insulating film in the groove.

12. The light-receiving device according to claim 10, wherein the groove further penetrates the interlayer insulating layer or the interlayer insulating layer and the first semiconductor substrate.

13. The light-receiving device according to claim 10, wherein a multiplicity of grooves including the groove is provided near the side surface of the second semiconductor substrate.

14. The light-receiving device according to claim 13, wherein the second semiconductor substrate divided by the groove receives application of each fixed potential.

15. The light-receiving device according to claim 1, wherein
   the second semiconductor substrate includes
      a support substrate disposed on a side of the fourth surface,
      a logic substrate disposed on a side of the third surface and including the logic circuit formed therein, and
      an insulating layer provided between the support substrate and the logic substrate,
   a side surface of the logic substrate is provided inside a side surface of the support substrate and is covered with an insulating film, and
   the support substrate receives application of a third potential that is higher than the second potential to be applied to the logic substrate and is lower than the first potential to be applied to the first semiconductor substrate.

16. The light-receiving device according to claim 1, wherein the first semiconductor substrate and the second semiconductor substrate each have a substantially rectangular shape in which a corner is worked into a curved shape.

17. The light-receiving device according to claim 1, wherein the interlayer insulating layer includes one or a plurality of metal films to which a predetermined potential is applied in the interlayer insulating layer, the one or the plurality of metal films protruding more outward than the side surface of the second semiconductor substrate.

18. The light-receiving device according to claim 17, wherein the one or the plurality of metal films is electrically coupled to the second semiconductor substrate.

19. The light-receiving device according to claim 17, wherein the one or the plurality of metal films receives application of a third potential from an external power supply, the third potential being lower than the first potential and higher than the second potential.

20. The light-receiving device according to claim 1, wherein the first semiconductor substrate includes a first second electrically-conductive region having an electrically-conductive type different from a first electrically-conductive region, at an interface of the second surface.

21. The light-receiving device according to claim 20, wherein
   the first semiconductor substrate includes a light-receiving region in which the plurality of light-receiving elements are arranged two-dimensionally in matrix, and a peripheral region provided around the light-receiving region, and
   the first semiconductor substrate further includes, in the peripheral region,
      a fourth first electrically-conductive region provided at an interface of the first surface, the fourth first electrically-conductive region extending to the side surface of the first semiconductor substrate and being in an electrically floating state, and
      a plurality of fifth first electrically-conductive regions provided in a ring shape outside the first second electrically-conductive region at the interface of the second surface, the plurality of fifth first electrically-conductive regions being in an electrically floating state.

22. The light-receiving device according to claim 21, wherein the fourth first electrically-conductive region provided at the interface of the first surface is provided in a shape of a plurality of rings.

23. The light-receiving device according to claim 1, wherein the second semiconductor substrate further includes a plurality of sixth first electrically-conductive regions provided in a ring shape at an interface of the third surface near the side surface and being in an electrically floating state.

24. The light-receiving device according to claim 23, wherein at least a portion of the plurality of sixth first electrically-conductive regions penetrates from the third surface to the fourth surface of the second semiconductor substrate.

25. The light-receiving device according to claim 24, wherein the second semiconductor substrate further includes a second second electrically-conductive region between the plurality of sixth first electrically-conductive regions penetrating from the third surface to the fourth surface, the second second electrically-conductive region penetrating from the third surface to the fourth surface.

26. An X-ray imaging device, comprising:

a first semiconductor substrate having a first surface and a second surface opposed to each other and receiving application of a first potential, the first semiconductor substrate including a plurality of light-receiving elements arranged two-dimensionally in matrix, the plurality of light-receiving elements generating signal charge based on an X-ray;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, wherein the second semiconductor substrate has a side surface recessed more inward than a side surface of the first semiconductor substrate, and the side surface of the second semiconductor substrate is coated with a protective film.

27. An electronic apparatus, comprising:

an X-ray imaging device including a first semiconductor substrate having a first surface and a second surface opposed to each other and receiving application of a first potential, the first semiconductor substrate including a plurality of light-receiving elements arranged two-dimensionally in matrix, the plurality of light-receiving elements generating signal charge based on an X-ray, a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements, and an interlayer insulating layer provided between the first semiconductor substrate and the second semiconductor substrate, wherein the second semiconductor substrate has a side surface recessed more inward than a side surface of the first semiconductor substrate, and the side surface of the second semiconductor substrate is coated with a protective film.

28. A light-receiving device, comprising:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, wherein the second semiconductor substrate has a side surface recessed more inward than a side surface of the first semiconductor substrate, the side surface of the second semiconductor substrate is coated with a protective film, and the first semiconductor substrate and the second semiconductor substrate each have a substantially rectangular shape, and have a corner being worked into a curved shape.

29. A light-receiving device, comprising:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements; and an interlayer insulating layer provided between the first semiconductor substrate and the second semiconductor substrate, wherein the second semiconductor substrate has a side surface recessed more inward than a side surface of the first semiconductor substrate, the side surface of the second semiconductor substrate is coated with a protective film, and the interlayer insulating layer includes a metal film to which a predetermined potential is applied in the layer, the metal film protruding more outward than the side surface of the second semiconductor substrate.

30. The light-receiving device according to claim 29, wherein the metal film is electrically coupled to the second semiconductor substrate.

31. The light-receiving device according to claim 29, wherein the metal film receives application of a third potential from an external power supply, the third potential being lower than the first potential and higher than the second potential.

32. A light-receiving device, comprising:

a first semiconductor substrate having a first surface and a second surface opposed to each other and receiving application of a first potential, the first semiconductor substrate including a light-receiving region in which a plurality of light-receiving elements are arranged two-dimensionally in matrix and a peripheral region provided around the light-receiving region;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, and including a logic circuit that processes a light-receiving signal based on electric charge outputted from the plurality of light-receiving elements;

a first first electrically-conductive region provided at an interface of the first surface of the first semiconductor substrate for each of the plurality of light-receiving elements and coupled to a first electrode, in the light-receiving region;

a second first electrically-conductive region each provided around the first first electrically-conductive region provided for each of the plurality of light-receiving elements and coupled to a second electrode, at the interface of the first surface;

a third first electrically-conductive region each provided around the second first electrically-conductive region provided for each of the plurality of light-receiving elements and being in an electrically floating state, at the interface of the first surface;

a fourth first electrically-conductive region provided at the interface of the first surface, the fourth first electrically-conductive region extending to a side surface of the first semiconductor substrate and being in an electrically floating state;

a first second electrically-conductive region provided at an interface of the second surface and having an electrically-conductive type different from the first first electrically-conductive region; and a plurality of fifth first electrically-conductive regions provided in a ring shape outside the first second electrically-conductive region at the interface of the second surface, the plurality of fifth first electrically-conductive regions being in an electrically floating state.

33. The light-receiving device according to claim 32, wherein the fourth first electrically-conductive region provided at the interface of the first surface is provided in a shape of a plurality of rings.

34. A light-receiving device, comprising:

a first semiconductor substrate having a first surface and a second surface opposed to each other and receiving application of a first potential, the first semiconductor substrate including a plurality of light-receiving elements arranged two-dimensionally in matrix;

a second semiconductor substrate having a third surface and a fourth surface opposed to each other, with the first surface of the first semiconductor substrate and the third surface being disposed to be opposed to each other, the second semiconductor substrate receiving application of a second potential lower than the first potential, the second semiconductor substrate including a logic circuit that processes a light-receiving signal based on electric charge outputted from the plurality of light-receiving elements, and a plurality of sixth first electrically-conductive regions provided in a ring shape at an interface of the third surface near a peripheral edge part and being in an electrically floating state; and an interlayer insulating layer provided between the first semiconductor substrate and the second semiconductor substrate.

35. The light-receiving device according to claim 34, wherein at least a portion of the plurality of sixth first electrically-conductive regions penetrates from the third surface to the fourth surface of the second semiconductor substrate.

36. The light-receiving device according to claim 35, wherein the second semiconductor substrate further includes a second second electrically-conductive region between the plurality of sixth first electrically-conductive regions penetrating from the third surface to the fourth surface, the second second electrically-conductive region penetrating from the third surface to the fourth surface.

* * * * *